US010937964B2

(12) United States Patent
Hanna et al.

(10) Patent No.: US 10,937,964 B2
(45) Date of Patent: Mar. 2, 2021

(54) ORGANIC SEMICONDUCTOR MATERIAL

(71) Applicants: Tokyo Institute of Technology, Tokyo (JP); DIC Corporation, Tokyo (JP)

(72) Inventors: Junichi Hanna, Tokyo (JP); Takeo Kobori, Tokyo (JP); Takayuki Usui, Tokyo (JP); Yukiko Takayashiki, Tokyo (JP); Hiroaki Iino, Tokyo (JP); Akira Oono, Tokyo (JP)

(73) Assignees: Tokyo Institute of Technology, Tokyo (JP); DIC Corporation, Tokyo (JP)

( * ) Notice: Subject to any disclaimer, the term of this patent is extended or adjusted under 35 U.S.C. 154(b) by 0 days.

(21) Appl. No.: 16/028,596

(22) Filed: Jul. 6, 2018

(65) Prior Publication Data
US 2018/0351106 A1 Dec. 6, 2018

Related U.S. Application Data

(62) Division of application No. 14/003,933, filed as application No. PCT/JP2012/056184 on Mar. 9, 2012, now Pat. No. 10,056,557.

(30) Foreign Application Priority Data

Mar. 10, 2011 (JP) ................ 2011-053642

(51) Int. Cl.
*H01L 51/00* (2006.01)
*H01L 51/05* (2006.01)

(52) U.S. Cl.
CPC ...... *H01L 51/0052* (2013.01); *H01L 51/0067* (2013.01); *H01L 51/0071* (2013.01); *H01L 51/0072* (2013.01); *H01L 51/0073* (2013.01); *H01L 51/0074* (2013.01); *H01L 51/0076* (2013.01); *H01L 51/0003* (2013.01); *H01L 51/0061* (2013.01); *H01L 51/0068* (2013.01); *H01L 51/0558* (2013.01)

(58) Field of Classification Search
CPC .................................................. H01L 51/00
See application file for complete search history.

(56) References Cited

U.S. PATENT DOCUMENTS

| 10,056,557 B2 * | 8/2018 | Hanna ................ H01L 51/0072 |
| 2005/0258398 A1 | 11/2005 | Kobayashi et al. |
| 2006/0231832 A1 | 10/2006 | Tokunaga et al. |
| 2007/0128764 A1 | 6/2007 | Tomino et al. |
| 2010/0032655 A1 | 2/2010 | Takimiya et al. |
| 2012/0007062 A1 | 1/2012 | Sasada et al. |

FOREIGN PATENT DOCUMENTS

| EP | 2207218 A1 | 7/2010 | |
| JP | 2005-330185 A | 12/2005 | |
| JP | 2006-339474 A | 12/2006 | |
| JP | 2009-057360 A | 3/2009 | |
| JP | 2010-087405 A | 4/2010 | |
| JP | 2010-177641 A | 8/2010 | |
| JP | 2012-031159 A | 2/2012 | |
| WO | WO-0214425 A1 * | 2/2002 | ............. C08L 51/04 |
| WO | WO 2007/125671 A1 | 11/2007 | |
| WO | WO 2009/038120 A1 | 3/2009 | |

OTHER PUBLICATIONS

Yamazaki, I., et al. "Observation of Quantum Coherence for Recurrence Motion of Exciton in Anthracene Dimers in Solution." J. Am. Chem. Soc. (2003), vol. 125, pp. 7192-7193. (Year: 2003).*
Ahn et al., "Impurity effects on charge carrier transport in various mesophases of smectic liquid crystals," Journal of Applied Physics, 2007, 102:093718, 1-6.
Lin et al., "The Chemistry of Acenes and Helicenes: What Can Aromaticity Teach Us?" Nov. 2008, available from: http://www.chemistry.illinois.edu/research/organic/seminar_extracts/2008_2009/EnChi_Lin_Chem535_FA08_Abstract.pdf.

* cited by examiner

*Primary Examiner* — John S Kenyon
(74) *Attorney, Agent, or Firm* — Foley & Lardner LLP

(57) ABSTRACT

The purpose of the present invention is to provide an organic semiconductor material having liquid crystallinity and high electron mobility. The present invention is an organic semiconductor material having at least a charge-transporting molecular unit (A) having a structure of an aromatic fused ring system and a cyclic structural unit (B) bonded to the aforementioned unit via a single bond, wherein the unit (A) and/or the unit (B) has a side chain composed of a unit (C), and wherein the organic semiconductor material exhibits a liquid crystal phase that is different from an N-phase, an SmA-phase or an SmC-phase.

9 Claims, 46 Drawing Sheets

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(a)

(b)

(b)

(a)

(b)

(a)

(b)

(a)

(b)

(a)

(b)

(a)

ORGANIC SEMICONDUCTOR MATERIAL

CROSS-REFERENCE TO RELATED APPLICATIONS

This application is a Divisional of U.S. application Ser. No. 14/003,933, which is the U.S. National Stage application of PCT/JP2012/056184, filed Mar. 9, 2012, which claims priority from Japanese application JP 2011-053642, filed Mar. 10, 2011.

TECHNICAL FIELD

The present invention relates to an organic semiconductor material, which is suitably usable for various devices, such as organic electronic device. More specifically, the present invention relates to an organic semiconductor material having a liquid crystallinity.

BACKGROUND ART

An organic substance capable of transporting electronic charges by positive hole or electron can be used as an organic semiconductor, and can be used as a material for organic electronic devices, such as photoreceptors for copying machines, photosensors, organic EL (electroluminescence) devices, organic transistors, organic solar cells and organic memory devices.

Such a material may generally be used in the form of an amorphous thin film or a polycrystalline thin film. On the other hand, in recent years, there has been found an electronic conduction exhibiting a much higher mobility than that of an amorphous organic semiconductor occurring in a liquid crystal phase of a liquid crystal substance, which has heretofore been considered as an ion conductive substance, and further it has been recognized that the liquid crystal phase is usable as an organic semiconductor.

Such a liquid crystal substance may be positioned as a new type of organic semiconductor, which is capable of forming a molecular condensed phase (i.e., liquid crystal phase), which is oriented in a self-organizing manner and exhibits a high mobility ($10^{-4}$ cm$^2$/Vs to 1 cm$^2$/Vs). In addition, such a liquid crystal substance has been found to have an excellent property, which conventional amorphous organic semiconductor materials or crystalline organic semiconductor materials cannot exhibit. More specifically, the liquid crystal substance is characterized in that an orientation defect specific to a liquid crystal, such as domain interface or disclination, scarcely allows for the formation of an electrically active level. In practice, an electronic device such as photosensor, electrophotographic photoreceptor, organic EL device, organic transistor and organic solar cell is being produced on trial by using a liquid crystal phase as an organic semiconductor.

The liquid crystal substance has a prominent characteristic such that in general, molecular orientation, which is hard to be controlled in a non-liquid crystal substance, can easily be controlled in a liquid crystal phase. For example, a rod-like liquid crystal substance generally has a tendency that, when the liquid crystal substance is injected between two substrates as in the case of a liquid crystal cell, the liquid crystal molecules are liable to be oriented in a state wherein the molecular major axis thereof lies almost parallel to the substrate surface at a liquid crystal phase temperature, and when the liquid crystal substance is applied onto a substrate, the molecules are liable to be oriented in a state wherein the molecular long axis thereof rises almost perpendicular to the substrate surface. The utilization of this property makes it easy to produce a thin film (crystalline thin film) having a controlled molecular orientation not only in a liquid crystal phase but also in a crystal phase by lowering the temperature of the thin film liquid crystal which has been oriented at a liquid crystal phase temperature, to thereby cause a phase transition to a crystal phase. This is difficult to be realized in the case of an ordinary non-liquid crystalline organic material.

It has been reported that a crystal thin film excellent in the crystallinity or flatness can be produced, when a liquid crystal thin film (i.e., a thin film in the state of a liquid crystal phase) of a liquid crystal substance is utilized as a precursor at the formation of a crystal thin film by using the above-described characteristics.

According to this technique, a uniform film excellent in the surface flatness may be obtained by forming a liquid crystal film at a liquid crystal phase temperature, and then cooling the resulting liquid crystal film to a crystallization temperature. In view of such an applicability of the liquid crystal substance to an electronic device as an organic semiconductor material, not only in the form of a liquid crystal thin film but also in the form of a crystalline thin film, the liquid crystal substance may be a material having a high degree of freedom as an organic semiconductor (see, for example, Non-Patent Document 1: *Advanced Materials*, electronic edition, 25 Feb. 2011, DOI: 10.1002/adma. 201004474).

However, when a liquid crystal substance is intended to be used as an organic semiconductor, it is necessary to obtain a liquid crystal substance exhibiting a high electron mobility. In this connection, in an attempt to obtain a substance exhibiting a high electron mobility, there is posed a problem such that what kind of a substance should be synthesized.

Heretofore, various materials have been synthesized as a liquid crystal substance, but the target thereof has been substantially limited to a nematic liquid crystal to be used as a display material for a display device utilizing optical anisotropy. Accordingly, a guideline for molecular design of a liquid crystal substance, which is suitable for the liquid crystal substance as an organic semiconductor, that is, a way of thinking in which the liquid crystal substance may be synthesized, has never been clarified.

Accordingly, in the prior art, in an attempt to synthesize a novel liquid crystal substance exhibiting a high electron mobility, there has been no method except for a trial-and-error method wherein, basically, an aromatic ring-containing core structure and a hydrocarbon chain is combined so as to select a desired chemical structure, and after the actual synthesis of the substance, the liquid crystal phase exhibited by the substance is examined. In addition, a useful guideline has not been provided for designing a structure suitable for an organic semiconductor exhibiting a high mobility, and the synthesis has encountered great difficulty in developing such a material.

PRIOR ART DOCUMENTS

[Non-Patent Document 1] *Advanced Materials*, electronic edition, 25 Feb. 2011, DOI: 10.1002/adma. 201004474

SUMMARY OF THE INVENTION

An object of the present invention is to solve the above-described problem encountered in the prior art and to provide an organic semiconductor material not only liquid crystallinity but also exhibiting a high electron mobility.

As a result of earnest study, the present inventors have found that a material having at least a specific charge transporting molecular unit A and a cyclic structure unit B linked to the unit A by a single bond is very suitable as the above-described organic semiconductor material.

The organic semiconductor material according to the present invention is based on such a discovery. More specifically, the organic semiconductor material according to the present invention comprises, at least: a charge transporting molecular unit A having an aromatic fused ring-type structure; and a cyclic structural unit B linked to the unit A by a single bond, the organic semiconductor material having a unit C as a side chain in at least either one of the unit A and the unit B, the material exhibiting a phase other than N phase, SmA phase and SmC phase.

According to the knowledge of the present inventors, the reason why the organic semiconductor material according to the present invention exhibits a preferred characteristic may be presumed as follows.

In general, the liquid crystal substance may include a high-molecular weight liquid crystal and a low-molecular weight liquid crystal. In the case of the high-molecular weight liquid crystal, the liquid crystal phase may generally has a high viscosity and therefore, is less liable to cause ionic conduction. On the other hand, in the case of the low-molecular weight liquid crystal, when an ionized impurity is present, ionic conduction may tend to be induced in a low-order liquid crystal phase having a strong liquid property, such as nematic phase (N phase), smectic A phase (SmA phase; hereinafter, abbreviated in the same manner) and SmC phase. The "ionized impurity" as used herein refers to an ionization product wherein ions are produced by the dissociation of an ionic impurity; or an ionization product which is produced by the photoionization or charge trapping of an electrically active impurity capable of becoming a charge trap (that is, an impurity in which the HOMO level, the LUMO level or both of these levels have a level between the HOMO and LUMO levels of the liquid crystal substance) (see, for example, M. Funahashi and J. Hanna, Impurity effect on charge carrier transport in smectic liquid crystals, Chem. Phys. Lett., 397, 319-323 (2004); H. Ahn, A. Ohno, and J. Hanna, Detection of Trace Amount of Impurity in Smectic Liquid Crystals, Jpn. J. Appl. Phys., Vol. 44, No. 6A, 2005, pp. 3764-37687).

When a liquid crystal thin film of a low-molecular weight liquid crystal substance is utilized as an organic semiconductor, in the case of above-described nematic phase having no ordered molecular orientation (or ordered alignment) of molecules, or in a smectic liquid crystal substance forming a molecularly-ordered condensed layer, because of the high flowability in the SmA phase or SmC phase having no positional orientation of molecules in the molecular layer, the ionic conduction may readily be induced in such a phase. Accordingly, there is causes a serious problem when these substances are used as an organic semiconductor. On the other hand, in the case of the "other than N phase, SmA phase and SmC phase" having a molecular orientation of molecules in the molecular layer, that is, a highly-ordered smectic phase (e.g., SmB, $SmB_{cryst}$, SmI, SmF, SmE, SmJ, SmG, SmK, SmH, etc.), may have a property of hardly inducing ionic conduction (i.e., a property advantageous to the use thereof as an organic semiconductor). Further, these phases may generally be high in the molecular orientation order and therefore, may exhibit a high mobility, as compared with that of a low-order liquid crystal phase (see, H. Ahn, A. Ohno, and J. Hanna, "Impurity effects on charge carrier transport in various mesophases of smectic liquid crystal", J. Appl. Phys., 102, 093718 (2007)).

In addition, past studies on the charge transport characteristics in a liquid crystal phase of various liquid crystal substances have reported that, in a liquid crystal substance having the same core structure, a higher-order liquid crystal phase having a highly ordered molecular alignment in the smectic phase may exhibit a higher mobility. From the point of view of not only suppressing ionic conduction but also realizing a high mobility, a liquid crystal substance exhibiting a highly-ordered smectic phase may be useful as an organic semiconductor.

On the other hand, in the case of using a liquid crystal substance as an organic semiconductor in the form of a crystal thin film, a liquid crystal substance allowing a low-order liquid crystal (N phase, SmA phase or SmC phase) with a strong liquid property which appears in a temperature region immediately above a crystal phase, may pose a serious problem such that, when a device is heated to a temperature higher than the temperature at which the above-described liquid crystal phase appears, the device is damaged by the heat. On the contrary, in the case of a liquid crystal substance capable of developing a higher-order smectic phase having a highly-ordered molecular alignment in the molecular layer, even when a device is heated to a liquid crystal temperature, due to low flowability, the device is less liable to be damaged. Therefore, even when a crystal thin film of a liquid crystal substance is applied to an electronic device as an organic semiconductor, a liquid crystal substance exhibiting a high-order liquid crystal phase may be required (however, just for this case, a substance exhibiting a metastable crystal phase but not a liquid crystal phase may also be used). In other words, a liquid crystal material can suitably be used in the present invention, as long as the liquid crystal substance is a substance exhibiting a metastable phase, or a liquid crystal substance exhibiting a crystal phase except for a low-order liquid crystal phase (N phase, SmA phase or SmC phase) with a strong liquid property.

In general, in the case of a substance exhibiting a plurality of liquid crystal phases or mesophases, it is well known that the molecular alignment of a liquid crystal phase is ordered along with a drop in the temperature, and while the liquid crystal substance develops a low-order liquid crystal phase (N phase, SmA phase or SmC phase) with a strong liquid property in a high temperature region, a high order liquid crystal phase or a metastable crystal phase each having a highest orientation order is developed in a temperature region adjacent to a crystal phase temperature. In the case of using a liquid crystal phase thin film as an organic semiconductor material, a phase except for the above-described low-order liquid crystal phase having a strong liquid property can be used in principle as an organic semiconductor. Accordingly, the condensed phase appearing in a temperature region adjacent to a crystal phase may be sufficient, if it is not a low-order liquid crystal phase having a strong liquid property (N phase, SmA phase or SmC phase). In the case of a liquid crystal substance allowing for the appearance of, in addition to a low-order liquid crystal phase (N phase, SmA phase or SmC phase) having a strong liquid property, other high-order liquid crystal phases, the low-order liquid crystal phase has a strong liquid property and accordingly, the molecular alignment control is facilitated therein, as compared with that in the case of the high-order liquid crystal phase, molecules may be oriented in the low-order liquid crystal phase and then transferred to the high-order liquid crystal phase, to thereby obtain a liquid crystal thin film which has been reduced in the fluctuation of molecular alignment as well as in the orientational defect can be obtained. Therefore, in such a case, an improvement in the quality of a liquid crystal thin film or a crystal thin film can be promised.

According to the present invention, an organic semiconductor material exhibiting not only a liquid crystallinity but also a high electron mobility can be provided.

MODES FOR CARRYING OUT THE INVENTION

Figure 1A:
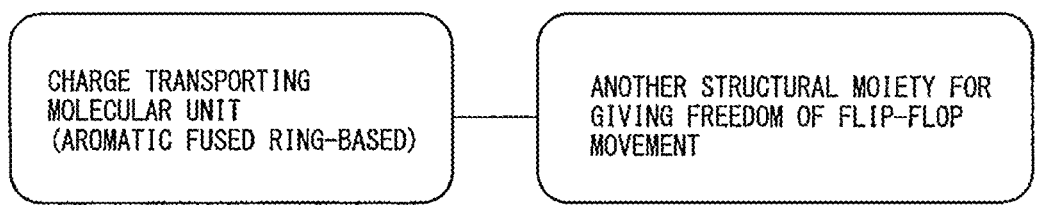
FIG. 1A is a block diagram showing one example of the basic concept according to the present invention.

Hereinbelow, the present invention will be described in more detail by referring to the accompanying drawings, as desired. In the following description, the "parts" and "%" denoting quantitative ratios or proportions are based on mass, unless otherwise noted specifically.

(Organic Semiconductor Material)

The organic semiconductor material according to the present invention is an organic semiconductor material comprising at least a charge transporting molecular unit A having an aromatic fused ring structure; and a cyclic structural unit B which is linked to the above unit A by a single bond, and having an aliphatic side chain in at least one of the units A and B. The organic semiconductor material according to the present invention is characterized in that it exhibits a liquid crystal phase other than N phase, SmA phase, and SmC phase.

(Predetermined Liquid Crystal Phase)

In the present invention, the "liquid crystal phase other than N phase, SmA phase, and SmC phase" stated above may preferably be a liquid crystal phase selected from the group consisting of: SmB, $SmB_{cryst}$, SmI, SmF, SmE, SmJ, SmG, SmK and SmH. The reason therefor may be because when a liquid crystal phase of the liquid crystal substance according to the present invention is used as an organic semiconductor, as described hereinabove, this liquid crystal phase has low flowability (or fluidity) and therefore, is less liable to induce ionic conduction and further, due to the highly molecular alignment therein, a high mobility can be promised in the liquid crystal phase. In addition, the reason may be because when a liquid crystal phase of the liquid crystal substance according to the present invention is used as an organic semiconductor, this liquid crystal phase is low in the flowability as compared with that of N phase, SmA phase, and SmC phase, and accordingly such a devise is less liable to be damaged, even when a transition to a liquid crystal phase occurs due to a rise in the temperature. In a case where the development of a liquid crystal phase is seen only in a temperature decreasing process, when once crystallized, the crystal temperature region (or range) is broadened, and this is advantageous to the application thereof in the form of a crystal phase. The present invention is characterized in that in the temperature decreasing (or cooling) process, the "phase except for N phase, SmA phase, and SmC phase" is $SmB_{cryst}$, SmE, SmF, SmI, SmJ, SmG, SmK or SmH.

Further, among the "liquid crystal phases except for SmA phase, and SmC phase", SmE and SmG which are a higher-order Sm phase may be preferred as a liquid crystal phase appearing in a temperature region adjacent to the crystal phase, when the temperature of the organic semiconductor material is raised from the crystal phase. Furthermore, in the case of a liquid crystal substance allowing for the appearance of other highly ordered liquid crystal phases, in addition to a low-order liquid crystal phase (N phase, SmA phase or SmC phase) having a strong liquid property, the low-order liquid crystal phase has a strong liquid property and accordingly, the molecular alignment control is facilitated therein as compared with that in the case of the highly ordered liquid crystal phase. Therefore, when molecules are oriented in advance in the low-order liquid crystal phase and then are transferred to the highly ordered liquid crystal phase, a liquid crystal thin film which has been reduced in the fluctuation of molecular alignment as well as in the orientational defect can be obtained and accordingly, an improvement in the quality of a liquid crystal thin film or a crystal thin film can be realized.

In the case of using a liquid crystal substance as an organic semiconductor, the operating temperature which is required for a device using such a substance may usually be from −20° C. to 80° C. and therefore, in the present invention, the temperature region in which the "phase except for N phase, SmA phase, and SmC phase" appears should be −20° C. or higher. Further, in a case where a crystal phase of the liquid crystal substance according to the present invention is used as an organic semiconductor, it may be effective for the quality improvement to utilize a thin film in the liquid crystal state (i.e., a liquid crystalline thin film) as a precursor at the production of a crystalline thin film. For this reason, in consideration of the simplicity of the process and easiness in the selection of the substrate, the temperature at which a liquid crystal phase of the liquid crystal substance appears may preferably be 200° C. or less.

(Preferred Charge Transporting Molecular Unit A)

In an organic semiconductor, the molecular moiety thereof participating in the charge transport may be a conjugated π-electron system comprising an aromatic ring or the like, and a larger size of the conjugated π-electron system may generally be advantageous to the charge transport. However, if the size of the π-electron system becomes large, the solubility thereof in an organic solvent may be reduced and further, result in a high melting point, and there may be posed a problem such that the process at the time of the synthesis thereof or the use thereof as an organic semiconductor may tend to be difficult. Therefore, the number of rings constituting a fused ring of the charge transporting molecular unit may preferably be from 3 to 5. The charge transporting molecular unit A may contain a heterocyclic ring. Each of the rings constituting the fused ring may preferably have a carbon number of 5 or 6 (that is, a 5- or 6-membered ring) in view of the convenience of synthesis thereof.

The heterocyclic ring constituting the charge transporting molecular unit A may also preferably be a 5- or 6-membered ring. The number of heterocyclic rings may not be particularly limited, but may preferably be the following number.

| <Number of Rings of Unit A> | <Number of Heterocyclic Rings> |
|---|---|
| 3 | 1 |
| 4 | 1 to 2 |
| 5 | 1 to 3 (particularly 1 to 2) |

In order to develop a highly ordered liquid crystal phase, a compound constituting the unit A may selected in consideration of its melting point as a measure, because the melting point may be indicative of the cohesive energy of the compound. A compound having a high melting point may be a compound exerting a strong interaction between molecules thereof at the time of the aggregation (or condensation) thereof, and is liable to undergo crystallization, whereby it is convenient to induce the development of a highly ordered liquid crystal phase. Accordingly, the melting point of the compound constituting the unit A (i.e., the compound constituting the unit A, in a case where the unit B and the unit C are not linked to the unit A) may preferably be 120° C. or more, more preferably 150° C. or more, still more preferably 180° C. or more, yet still more preferably 200° C. or more. If the melting point is 120° C. or less, a low-order liquid crystal phase is liable to be developed and this may not be preferred.

Hereinbelow, the compound constituting the unit A will be described in more detail by referring to examples.

In a case where the target compound is Comp. No. 22, the pertinent compound constituting the unit A may be the following compound, where the single bond linking to the unit B is eliminated, and a hydrogen atom is substituted therefor on the position of the following unit A, in which the single bond has been linked.

(Comp. No. 22)

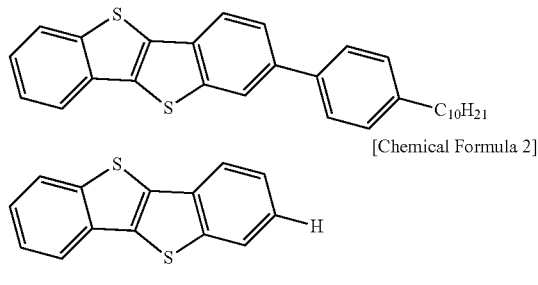

[Chemical Formula 1]

[Chemical Formula 2]

That is, in this example, the compound constituting the unit A is benzothieno[3,2-b][1]benzothiophene, and the melting point of the benzothieno[3,2-b][1]benzothiophene may be the melting point of the compound constituting the unit A.

In this example, a single bond has been present between the unit A and the unit B. However, even when a single bond is formed with the unit C, the melting point of the compound constituting the unit A may be specified in the same manner.

The number of repetitions of the unit A may be 1 or may also be 2.

(Preferred Cyclic Structural Unit B)

In the present invention, the unit B may be "another structure" part for allowing freedom of the flip-flop movement. The unit B may preferably be an aromatic fused ring or an alicyclic molecular structure, which is linked to the charge transporting unit A by a single bond. The number of rings constituting the unit B may preferably be from 1 to 5 (more preferably, 3 or less, particularly preferably from 1 to 2).

The number of rings constituting the unit B may not be particularly limited, but assuming that the number of the rings constituting the unit B is represented by "NA" and the number of the rings constituting the unit B is "NB", NA≥NB may be preferred. More specifically, the number of rings constituting the unit B may preferably be the following number.

| <Number of Rings of Unit A> | <Number of Rings of Unit B> |
|---|---|
| 3 | 1 to 3, further 1 to 2 (particularly 1) |
| 4 | 1 to 4, further 1 to 3 (particularly 1 to 2) |
| 5 | 1 to 5, further 1 to 4 (particularly 1 to 3) |

The unit B may also contain a heterocyclic ring. The heterocyclic ring may preferably be a 5- or 6-membered ring.

Further, the unit B may preferably be, for example, an aromatic compound, an aromatic fused-ring compound, of which specific examples may be recited below, a cycloalkane, a cycloalkene, or an alicyclic saturated compound. In the case of the cycloalkene, cyclopentene which may have higher planarity may be more preferred as compared with cyclohexene.

(Single Bond)

In the present invention, the unit A and the unit B should be directly linked by a single bond.

(Unit C)

The unit C may be linked, for example, to the unit A and/or the unit B. From the view of broadening the crystal temperature region to be used as a crystalline thin film, this unit may preferably be linked to "either one" of the unit A and the unit B. The unit C may preferably be a compound having a linear structure, such as a hydrocarbon or heteroatom-containing saturated compound, more preferably a hydrocarbon having a carbon number of 2 to 20 or a group represented by formula (1):

[Chemical Formula 3]

$$(CH_2)_n-X-(CH_2)_mCH_3 \quad (1)$$

(wherein X represents S, O or NH, m is an integer of 0 to 17, and n is an integer of 2 or more).

With respect to the unit C, which is present on at least one of the unit A and unit B, as a side chain, in the cyclic structure (that is, A or B) to which the unit C is bonded, it is preferred that the position of the unit C is one capable of providing an organic semiconductor material having a rod-like molecular shape, at which the cyclic structure is linked or condensed to the other cyclic structure (that is, B or A). Specific examples of the linking position may be those as shown in the structures exemplified in Tables 1 to 8, and 15 appearing hereinafter.

In the description of the linking position of the unit C by referring to specific compounds to be used for the organic semiconductor material according to the present invention, for example, in the case of the following structural formula, the unit A is benzothieno[3,2-b][1]benzothiophene, the unit B is a phenyl group, the unit C is $C_{10}H_{21}$, the cyclic compound D to which the unit C is bonded is benzene, and the unit A: benzothieno[3,2-b][1]benzothiophene and the unit C: $C_{10}H_{21}$ is linked on the para-position of the benzene.

[Chemical Formula 4]

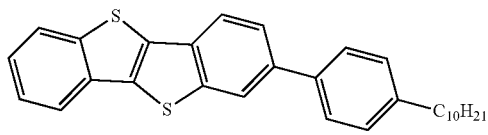

With respect to another compound according to the present invention having another unit, the linking position can be shown in the same manner.

In the case of linking two cyclic compounds by a single bond, when a substituent or a sterically large structure is present in the vicinity of the linking position, the rotary motion about an axis of two compounds may be inhibited or limited due to the interaction of the substituent or structure, and as a result, a fluctuation may be generated in the conformation at the aggregation of molecules or the reorganization energy affecting the charge transfer rate between molecules may be increased. Therefore, even when a liquid crystal substance having such a molecular structure may develop a highly ordered liquid crystal phase, it is possible that the charge transport properties may be degraded in many cases.

As described above, the number of repetitions of the unit A may be 1 or may be 2, but as in Comp. No. 58, the entire structure of the compound may be repeated and in this case, the number of repetitions may be 1 or may also be 2.

(Point of Molecular Design)

In the present invention, the molecular design may preferably be performed by taking into account the following points so as to realize a liquid crystal substance having high mobility.

(1) In the present invention, it may be important that in a molecularly ordered liquid crystal phase or crystal phase, as the factor governing the charge transfer rate, the Transfer integral value of the π-electron system molecular unit called a core part participating in the charge transport is large. In order to actually calculate this value by a quantum-chemical method, the calculation need to be performed by determining the specific molecular configuration between adjacent molecules in the target molecular condensed state, but comparatively speaking, a molecular structure having a redundantly extended π-electron system may be advantageous against a fluctuation in the mutually relative molecular positions.

That is, in the case of a smectic liquid crystal substance, a rod-like π-electron conjugated system having a somewhat large size may be selected for the charge transporting molecular unit comprising a π-electron conjugated system for providing a charge transport site. In this case, without using a molecular unit where a plurality of small aromatic rings such as benzene or thiophene are linked by a single bond to form a large π-electron conjugated system, which may be often employed as a liquid crystal molecular structure, a molecular unit having a large π-electron conjugated system formed by a fused ring structure may be used. The number of rings in the fused ring may preferably be 3 or more and may be realistically 5 or less, because if the number of rings is too large, the solubility for a solvent may be reduced.

That is, in the present invention, the aromatic π-electron conjugated system fused ring structure may preferably be a structure where benzene, pyridine, pyrimidine, thiophene, thiazole, imidazole or furan is employed as an aromatic ring structure and these rings are fused to provide for a rod-like three-ring, four-ring or five-ring structure.

(2) In the present invention, a highly ordered liquid crystal phase should be developed so as to realize high mobility. It may generally be considered that in the smectic liquid crystal phase, as transfers to a highly ordered liquid crystal phase from SmA phase or SmC phase having no positional order in the molecular layer, the molecular motion of a liquid crystal molecule is sequentially frozen and in the most highly ordered SmE phase or SmG phase, a flip-flop movement (sometimes referred to as flapping motion) of a molecule finally remains.

In consideration of this point, a structure where the above-described aromatic π-electron conjugated system fused ring structure is linked by at least another rigid structure unit through a single bond may preferably be used for a main core structure constituting a liquid crystal molecule. In this case, as the another rigid structure unit linked, a structure having a number of rings equal to or smaller than the number of rings in the above-described aromatic π-electron conjugated system fused ring structure may be selected, and the number of rings may be 1 or 2. Further, this structure may not necessarily be a structure comprising only an aromatic ring in a broad sense encompassing a heterocyclic ring but may be an alicyclic ring structure such as cyclohexane, cyclopentane or double bond-containing cyclohexene or cyclopentene.

(3) In the present invention, in order to develop smectic liquid crystallinity, the basic design of a rod-like liquid crystal substance may be to provide the substance with a structure where a flexible hydrocarbon unit for imparting rod-like molecular shape anisotropy and liquid property is linked to the above-described rigid molecular unit called a core part and these units are basically arranged in a linear configuration.

In the present invention, a structure where at least another rigid structure is linked to the above-described aromatic π-electron conjugated system fused ring structure through a single bond may come under the core part. It may be important for the linkage position of the unit C in the core part to give rod-like anisotropy as the whole molecule. In this case, with respect to the position of the unit C linked to the core part, the unit may be linked to either the unit A or the unit B or to both thereof as long as the position in each unit is located farther from the single bond linking the unit A and the unit B. As for the molecular shape after linking the unit C, it should be kept in mind that when the structure of the whole molecule has large bending, smectic phase may generally be less liable to be induced.

In this molecular design, a measure therefor may be given by the fluctuation range when rotating a molecule in the core part by using, as the axis, a single bond between the unit C and the core part. More specifically, describing the fluctuation range by letting the angle formed between a straight line linking a carbon atom bonded by the unit C to a carbon or hetero atom located on the outermost side of the core part of the unit A or unit B and kept from directly bonding to the unit C on rotating the molecule and the axis be θ, a structure where the fluctuation range θ is 90° or less, preferably 60° or less, more preferably 30° or less, may be preferred, because development of a liquid crystal phase and elevation of the mobility can be achieved.

As another measure, a single bond between the unit A and the unit B and a single bond between the unit C and unit A or between the unit C and the unit B may preferably be in alignment with or in parallel to each other or the angle formed by those two single bonds may preferably be 90° or more, more preferably 120° or more.

An example where θ is 30° or less and two single bonds are in alignment may be illustrated in (scheme 1) "a"; an example where θ is 30° or less and two single bonds are in parallel may be illustrated in (scheme 1) "b"; an example where θ is from 30° to 60° and the angle formed by two single bonds is 120° may be illustrated in (scheme 2) "a"; an example where θ is from 30° to 60° and the angle formed by two single bonds is 120° or more may be illustrated in (scheme 2) "b"; an example where θ is 30° or less and two single bonds are in parallel may be illustrated in (scheme 3) "a"; and an example where θ is 30° or less and two single bonds are in alignment may be illustrated in (scheme 3) "b".

(Scheme 1)

[Chemical Formula 5]

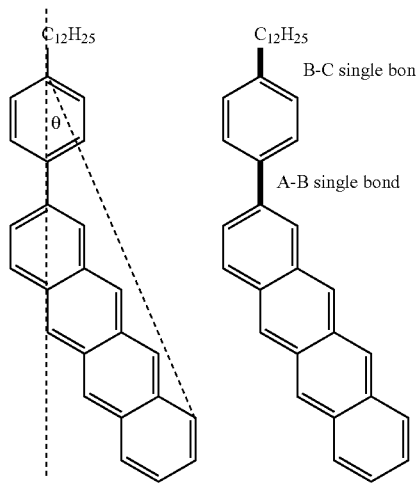

(a)

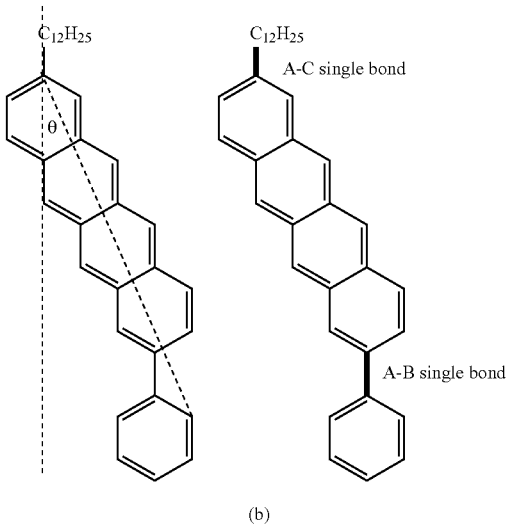

(b)

(Scheme 2)

[Chemical Formula 6]

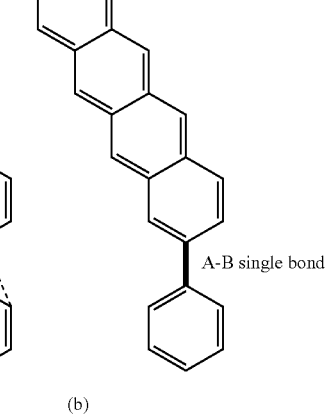

(a)

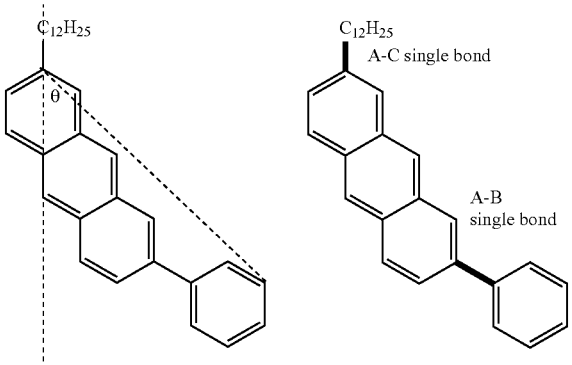

(b)

(Scheme 3)

[Chemical Formula 7]

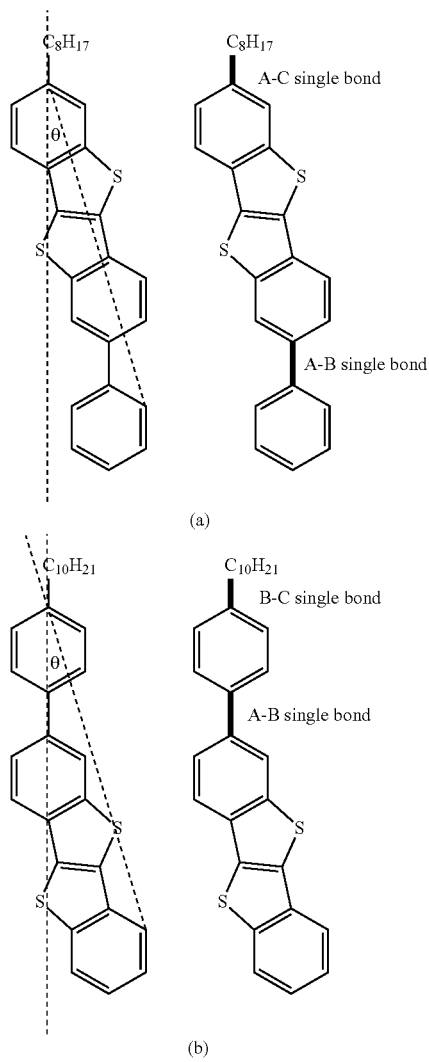

(a)

(b)

In the case of developing a liquid crystal phase, a unit C having a structure containing a double bond or a triple bond or containing a hetero atom such as oxygen, sulfur and nitrogen may be further used. However, in view of mobility, the unit C may preferably be bonded directly to the core part without intervention of oxygen, sulfur, nitrogen or the like.
(Screening Method)

In the present invention, the compounds satisfying the above-described molecular design may be screened, if desired, for a substance capable of developing a highly-ordered smectic liquid crystal phase and useful as an organic semiconductor. In this screening, it may be preferred to select, fundamentally, a compound capable of developing a highly-ordered smectic phase when using a liquid crystal phase as an organic semiconductor, and a compound incapable of developing a low-order liquid crystal phase adjacent to the crystal phase upon cooling from a temperature higher than the crystal phase temperature when using a crystal phase as an organic semiconductor. In this selection method, a substance useful as an organic semiconductor material can be selected by making a judgment according to the later-described "Screening Method".

Figure 1B:
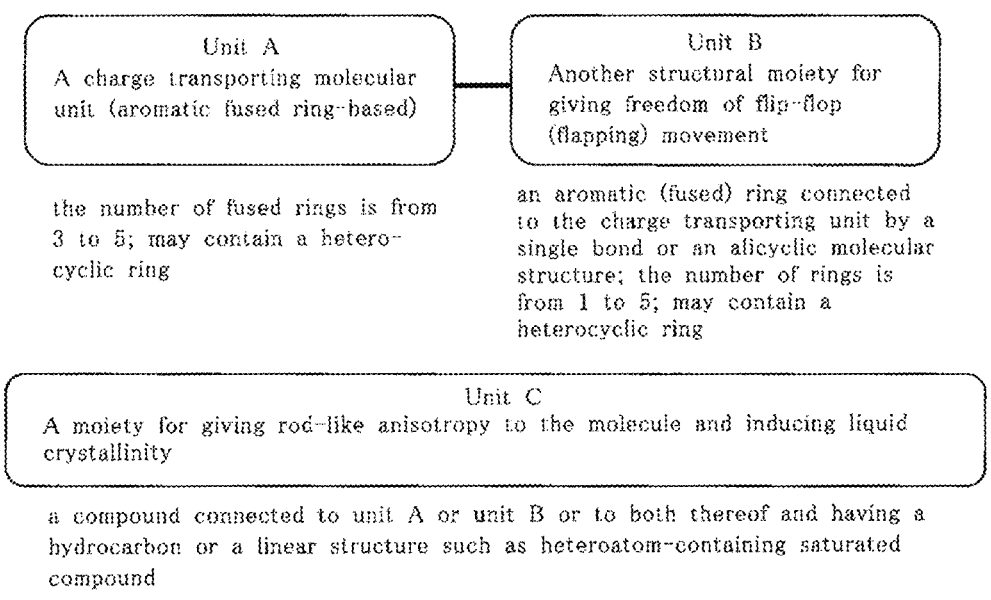
FIG. 1B is a more detailed concept of the concept of FIG. 1A.

FIGS. 1A-1B show the basic concept according to the present invention. The structure shown in FIG. 1A may be called a core part in a liquid crystal molecule, and a structure where a unit C (preferably a unit having a carbon number of 3 or more) is linked to one side or both sides of the core part to run in the molecular long axis direction of the core part may be a basic design of the molecule in the present invention. A more detailed concept of the concept of FIG. 1A may be shown in FIG. 1B.
(Charge Transporting Molecular Unit)

By using a molecular unit comprising an aromatic π-electron fused ring having a number of rings of 3 or more as the charge transporting molecular unit corresponding to the core part in a liquid crystal molecule, redundancy of the transfer integral for fluctuation of the molecular position can be ensured and similarly, by employing not a molecular unit of a π-electron conjugated system formed by linking a plurality of benzenes, thiophenes or the like by a single bond but a molecular unit having a fused ring structure, the molecular conformation may be fixed, offering promise of increase in the transfer integral, and this may be useful for enhancing the mobility.

On the other hand, even when a charge transporting molecular unit having a large fused ring structure is employed as the core part, a substance where a hydrocarbon chain is directly linked to the core part as in, for example, dialkylpentacene or dialkylbenzothienobenzothiophene cannot bring about stabilization of a liquid crystal phase and in general, may not develop a liquid crystal phase or even if a liquid crystal phase is developed, may develop only a low-order liquid crystal phase such as SmA phase (literatures: Liquid Crystal, Vol. 34, No. 9 (2007), 1001-1007; Liquid Crystal, Vol. 30. No. 5 (2003), 603-610). Therefore, high mobility in a liquid phase cannot be realized merely by using a large fused ring structure for the charge transporting molecular unit. Only when a molecular structure in which another structural unit for allowing freedom of the flip-flop movement (or motion) of a molecular is, as shown in the figure, linked to the charge transporting molecular unit is employed for the core part, development of a highly ordered liquid crystal phase and realization of high mobility in a liquid crystal phase may be promised.

A hydrocarbon chain may be linked to such a structure (core part) in which another rigid structural unit is linked to the charge transporting molecular unit, so as to impart rod-like anisotropy in molecular shape and liquid property to a molecule, whereby development of a liquid crystal phase can be induced with high probability. In the case of linking a hydrocarbon chain, two hydrocarbon chains may generally be linked, but even when one hydrocarbon chain is linked, a liquid crystal phase may be often developed. In this case, the temperature region in which a liquid crystal phase appears may generally be different in the temperature decreasing (or cooling) process and the temperature rising (or heating) process. This may be useful in allowing the temperature region of a liquid crystal phase to generally extend to a low temperature in the temperature decreasing process and conversely, allowing a crystal phase to extend to a high temperature region in the temperature rising process. This property may imply that in the case of utilizing a polycrystalline thin film of a liquid crystal substance as an organic semiconductor, a liquid crystalline thin film can be produced at a lower temperature when producing the polycrystalline thin film by using a liquid crystalline thin film (thin film in a liquid crystal phase state) as a precursor, and may be advantageous in that the process is more facilitated. Further, extending a liquid crystal phase temperature to a high temperature region in the temperature rising process may imply that the thermal stability of the produced polycrystalline film is enhanced, and this may be convenient as a material. On the other hand, when two hydrocarbon chains are attached, the developed liquid crystal phase may be stabilized, and this may be convenient for application to a device or the like using a liquid crystal phase.

In a case where a substance is synthesized based on the above-described basic molecular design, the utility according to the present invention of the substance may be taken advantage of by selecting, fundamentally, a substance capable of developing a highly-ordered smectic phase when using a liquid crystal phase as an organic semiconductor, and a substance insusceptible to formation of a crack or a void in the crystalline thin film and incapable of developing a low-order liquid crystal phase adjacent to the crystal phase upon cooling from a temperature higher than the crystal phase temperature when using a crystal phase as an organic semiconductor. In other words, the judgment may be made based on whether a liquid crystal phase except for a nematic phase, SmA phase, and SmC phase is developed in a temperature region adjacent to a crystal phase when using a liquid crystal phase as an organic semiconductor and whether a crack or a void is hardly formed upon cooling from a temperature higher than the crystal phase temperature and resulting occurrence of transition to a crystal phase when using a crystal phase as an organic semiconductor.

(Screening Method)

The judgment above can easily be made by the screening method (judging method). For details of respective measurement methods used in this screening method, the following literatures may be referred to, if desired.

Literature A: "Henko Kenbikyo no Tsukaikata (How to Use Polarizing Microscope)", Jikken Kagaku-Kou (Experimental Chemistry Course), 4th ed., Vol. 1, Maruzene, pp. 429-435

Literature B: "Ekisho Zairyo no Hyoka (Evaluation of Liquid Crystal Materials)", Jikken Kagaku Kouza (Experimental Chemistry Course), 5th ed., Vol. 27, pp. 295-300, Maruzene : Ekisho Kagaku Jikken Nyumon (Manual of Liquid Crystal Science Experiments), compiled by The Japanese Liquid Crystal Society, published by Sigma Shuppan (S1) The isolated test substance may be purified by column chromatography and recrystallization and thereafter, it may be confirmed by silica gel thin-layer chromatography that the test substance exhibits a single spot (that is, not a mixture).

(S2) A sample heated into an isotropic phase may be injected, by utilizing a capillary phenomenon, in a 15 μm-thick cell formed by laminating slide glasses through a spacer. The cell may be once heated to an isotropic phase temperature, and the texture may be observed by a polarizing microscope to confirm that a dark field of view is not provided in a temperature region lower than an isotropic phase. This refers to that the molecular long axis is horizontally oriented with respect to the substrate, and may become a requirement necessary for the subsequent texture observations.

(S3) While cooling the cell at an appropriate temperature drop rate, for example, at a rate of about 5° C./rain, the texture may be observed by the microscope. At this time, if the cooling rate is too fast, the structure formed may become small to make a detailed observation difficult, and therefore, the conditions for obtaining a structure size of 50 μm or more in which the structure is easily observed, may be set by again raising the temperature to an isotropic phase.

Figure 2:
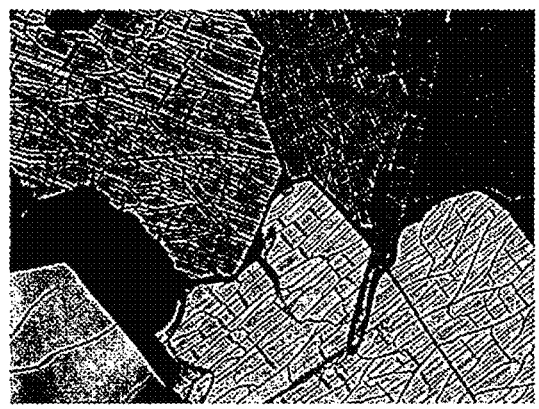
FIG. 2 is an example of the polarizing micrograph (scale: the horizontal side is about 1 mm) showing a black linear structure or a texture (that is, a crack or a void generated in the crystal), which may appear in association with crystallization.
Figure 3:
FIG. 3 is an example of the polarizing micrograph showing a typical Schlieren texture in a nematic phase.
Figure 4:
FIG. 4 is an example of the polarizing micrograph (scale: the horizontal side is about 250 μm) showing a typical Fan-like texture seen in the SmA or SmC phase.

(S4) While cooling from an isotropic phase to room temperature (20° C.) under the conditions set in the item (S3) above, the texture may be observed. When the sample is crystallized in the cell during this process, a crack or a void may be generated in association with contraction of the lattice, and a black line or a region having a certain size may appear in the observed texture. When an air is entrained at the time of injecting the sample, the same black region (generally, round) may be locally produced, but a black line or region produced by crystallization may distributedly appear in the structure or boundary and therefore, can easily be distinguished. Such a black line or region can easily be discriminated from other structures seen in the texture, because even when a polarizer and an analyzer are rotated, disappearance or change in color may not be observed (see, FIG. 2). The temperature at which this texture appears may be taken as a crystallization temperature, and it may be confirmed that the texture appearing in a temperature region higher than the temperature above is not a nematic phase, SmA phase or SmC phase. In a case where the sample exhibits a nematic phase, a characteristic Schlieren texture expressed as a bobbin-like texture (see, FIG. 3; a typical Schlieren texture) may be observed, and In a case where the sample exhibits SmA phase or SmC phase, a characteristic texture called a fan-like texture, having a fan shape and having a uniform structure in the region (see, FIG. 4; a typical Fan-like texture) may be observed. Therefore, the texture can easily be judged from its characteristic texture.

As a special case, in a substance undergoing transition from SmA phase to SmB phase or from SmC phase to SmF or SmI phase, a change in the field of view may be momentarily observed at a phase transition temperature, but almost no change may be sometimes observed in the texture after phase transition and careful observation may be required, because the formed SmB phase, SmF phase or SmI phase texture may be misidentified as SmA phase or SmC phase in some cases. In this case, it may be important to pay attention to a momentary change in the field of view, which may be observed at a phase transition temperature. In the case of requiring this confirmation, when after confirming the number of intermediate phases confirmed by DSC, X-ray diffraction is measured at respective temperature regions and the presence or absence of a peak in a high-angle region (from 15 to 30° in the judgment of 0-20) characteristic of each phase is confirmed, the SmA phase, and SmC phase (both have no peak) can easily be discriminated from the SmB phase, SmF phase and SmI phase (all have a peak).

(S5) A substance in which a black structure is not seen by the texture observation under a polarizing microscope at room temperature (20° C.) may be usable as an organic semiconductor material, and irrespective of a highly ordered liquid crystal phase or a crystal phase (including a metastable crystal phase), this substance may be dealt with as a substance in the scope of the present invention.

From the point of view of applying the organic semiconductor material according to the present invention to a device, the HOMO and LUMO energy levels of the core part may be further important. In general, as for the HOMO level of an organic semiconductor, a test substance may be dissolved in an organic solvent such as dehydrated dichloromethane to have a concentration of 1 to 10 mmol/L, about 0.2 mol/L of a supporting electrolyte such as tetrabutylammonium salt may be added, a working electrode such as Pt, an opposite electrode such as Pt and a reference electrode such as Ag/AgCl may be inserted into the solution above, a CV curve may be drawn by performing sweeping at a rate of about 50 mV/sec by means of a potentiostat, and from the difference between the peak potential and a potential of a known substance such as ferrocene, which may serve as the benchmark, the HOMO level and LUMO level may be estimated. In a case where the HOMO level or LUMO level deviates from the potential window of the organic solvent, the HOMO level or LUMO level can be estimated by calculating the HOMO-LUMO level from the absorption edge of an ultraviolet-visible absorption spectrum and subtracting it from the level that could be measured. For this method, J. Pommerehne, H. Vestweber, W. Guss, R. F. Mahrt, H. Bassler, M. Porsch, and J. Daub, Adv. Mater., 7, 551 (1995) may be referred to.

In general, the HOMO and LUMO levels of an organic semiconductor material may be indicative of electrical contact with an anode and a cathode, respectively, and should be taken care of, because the charge injection may be limited by the size of energy barrier dependent on the difference from the work function of an electrode material. As for the work function of a metal, for example, those of substances which are often used as an electrode may be silver (Ag): 4.0 eV, aluminum (Al): 4.28 eV, gold (Au): 5.1 eV, calcium (Ca): 2.87 eV, chromium (Cr): 4.5 eV, copper (Cu): 4.65 eV, magnesium (Mg): 3.66 eV, molybdenum (Mo): 4.6 eV, platinum (Pt): 5.65 eV, indium tin oxide (ITO): 4.35 to 4.75 eV, and zinc oxide (ZnO): 4.68 eV. From the above-described view, the difference in the work function between the organic semiconductor material and the electrode substance may preferably be 1 eV or less, more preferably 0.8 eV or less, still more preferably 0.6 eV or less. For the work function of a metal, the following literature may be referred to, if desired.

Literature D: Kagaku Binran (Handbook of Chemistry), Basic Edition, revised 5th ed., II-608-610, 14.1 b Work Function (Maruzen) (2004)

The size of the conjugated π-electron system of the core part may affect the HOMO and LUMO energy levels, and therefore, the size of the conjugated system may be used as a reference when selecting the material. Further, introduction of a hetero atom into the core part may be effective as a method for changing the HOMO or LUMO energy level.

(Examples of Preferred Charge Transporting Molecular Unit A)

Examples of the "charge transporting molecular unit A" suitably usable in the present invention are illustrated below. X represents S, O or NH.

[Chemical Formula 9]

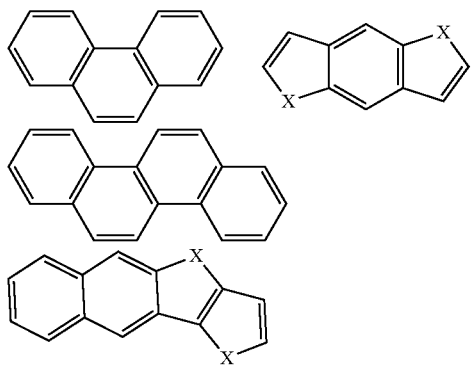

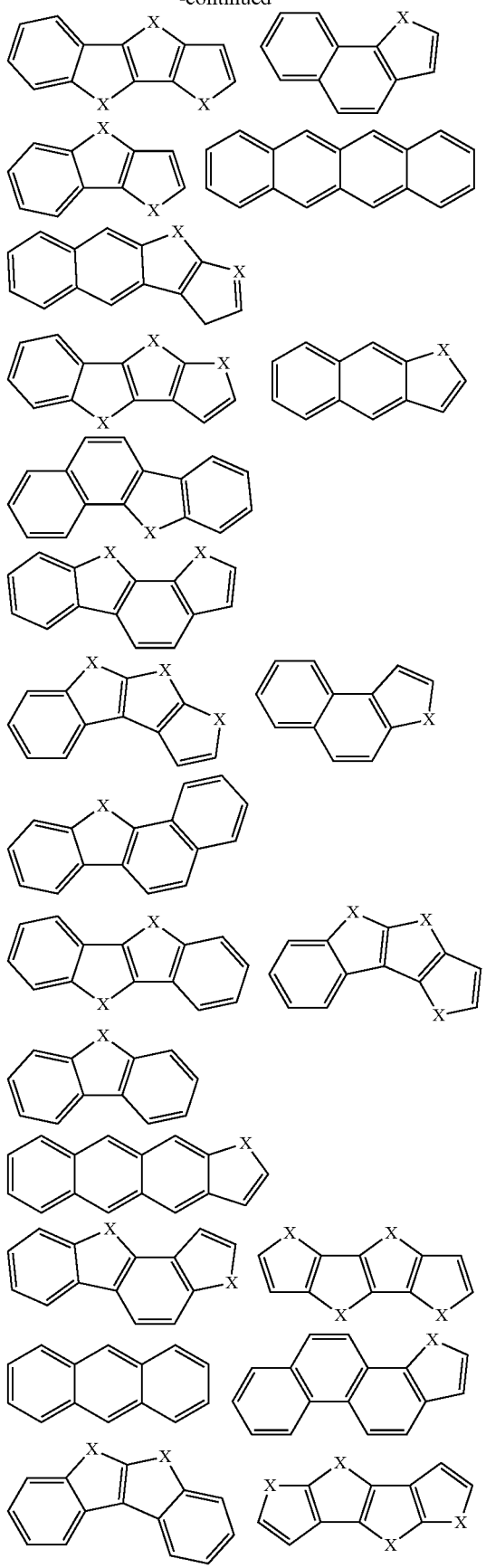

-continued
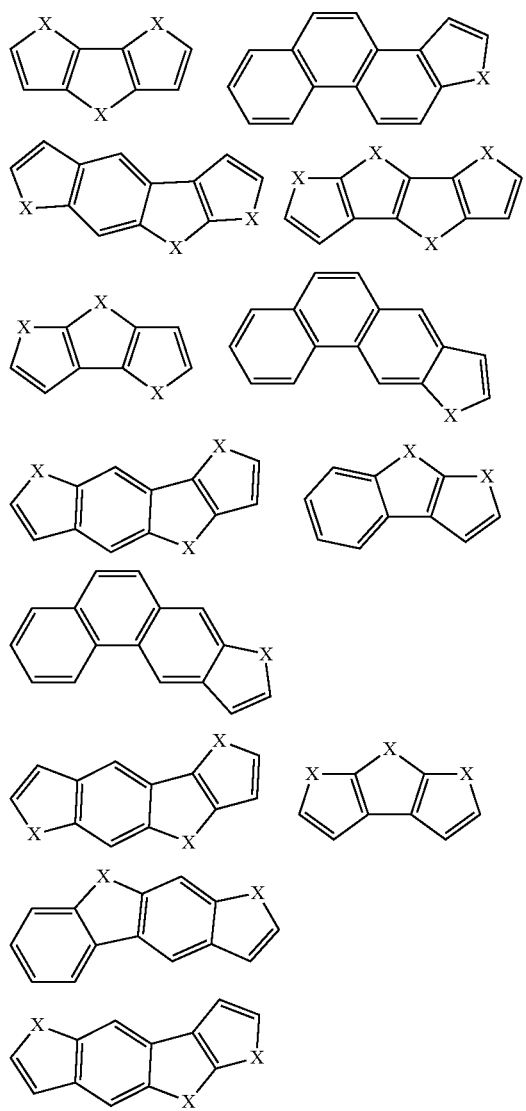
[Chemical Formula 10]
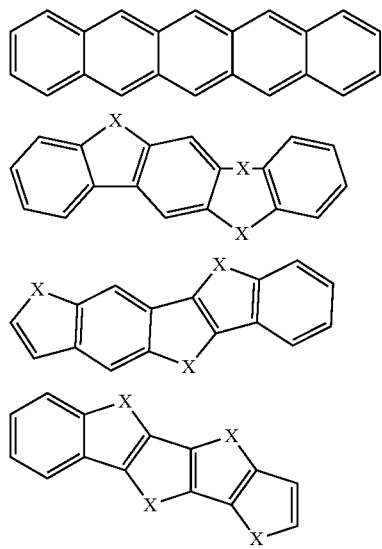
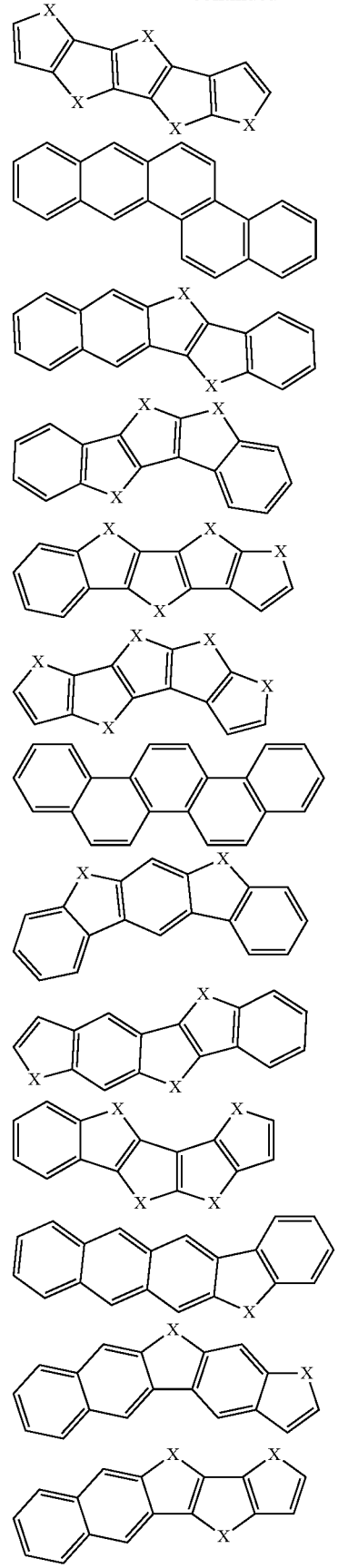

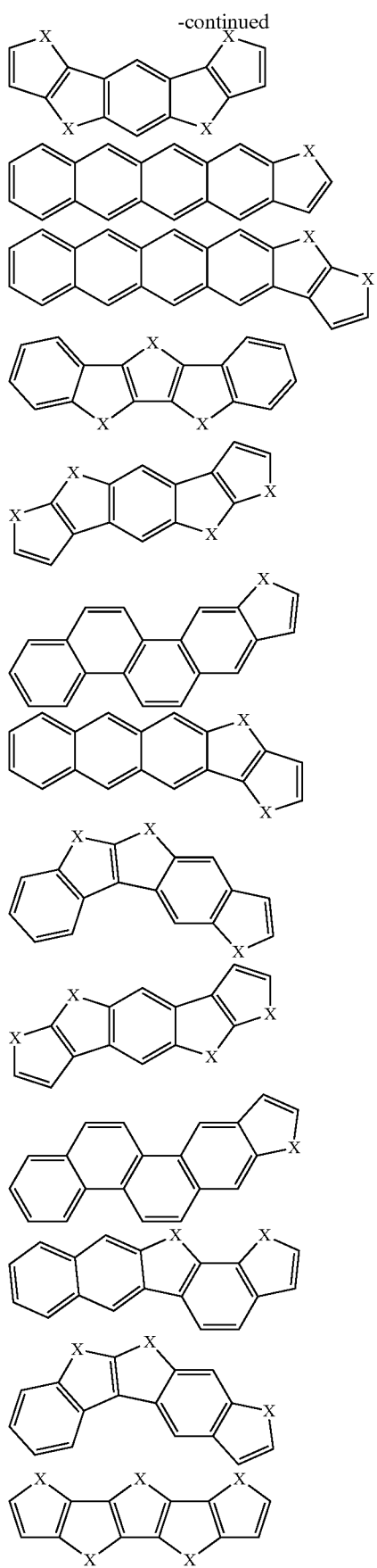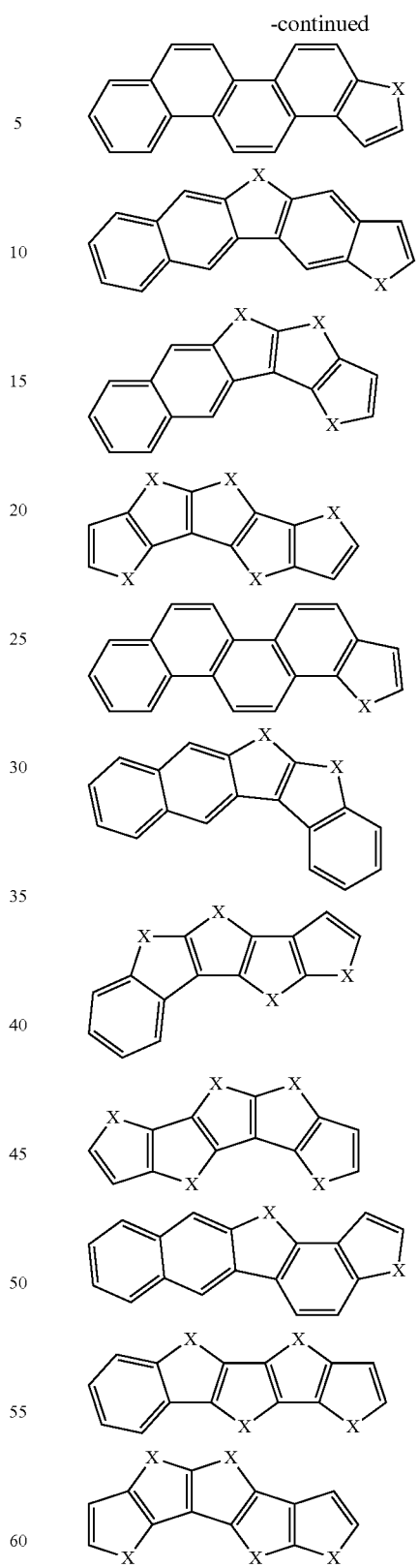
(Examples of Preferred Cyclic Structural Unit B)
Examples of the "cyclic structural unit B" suitably usable in the present invention are illustrated below. The unit B may be the same as the unit A.

[Chemical Formula 11]

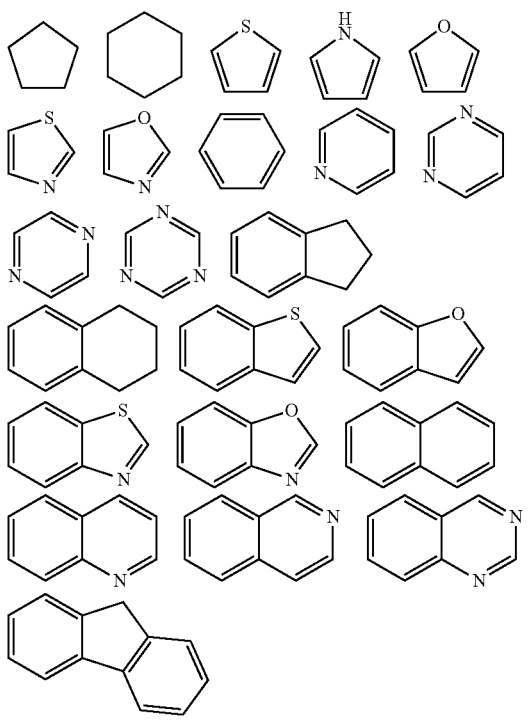

(Examples of Preferred Single Bond)

The "single bond" for linking the units A and B, which is suitably usable in the present invention, may be selected such that out of carbons constituting the cyclic structures of the unit A and the unit B, carbons in the molecular long axis direction are linked to take a rod-like shape by the whole molecule. That is, in the present invention, a carbon constituting the unit A and a carbon constituting the unit B are linked directly by a "single bond".

(Examples of Preferred Combination of Unit A and Unit B)

Examples of the "combination of unit A and unit B" (linked according to those described above) suitably usable in the present invention are illustrated below.

[Chemical Formula 12]

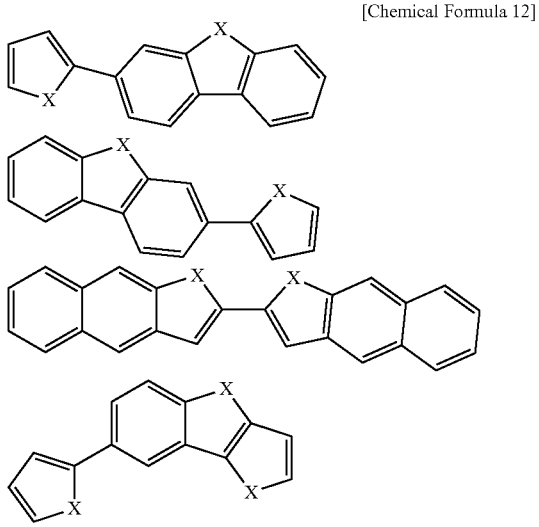

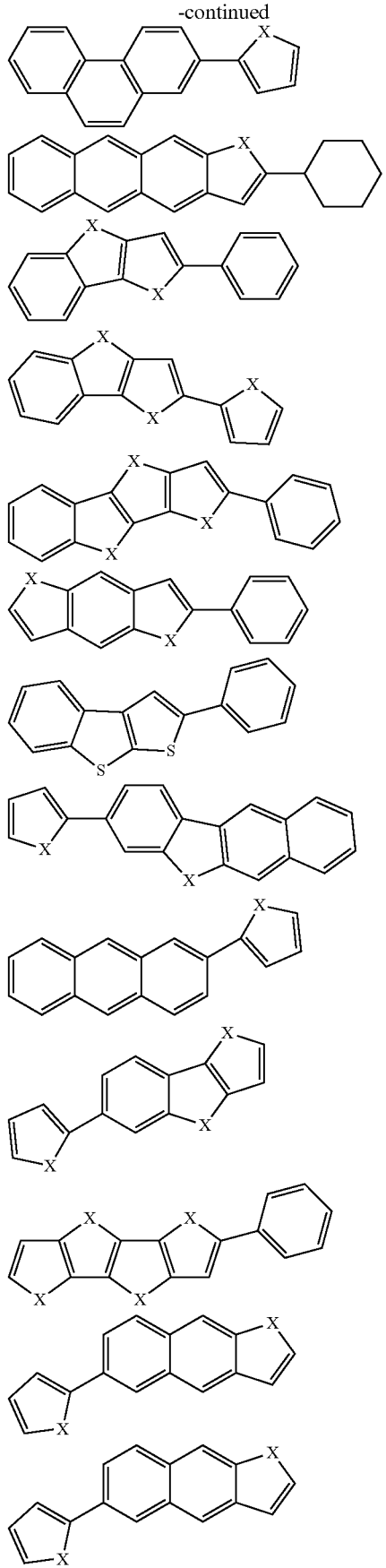

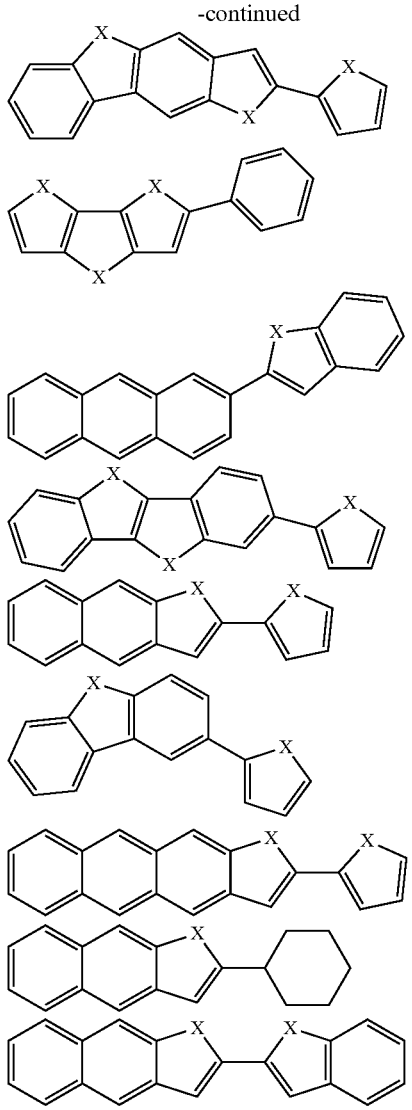

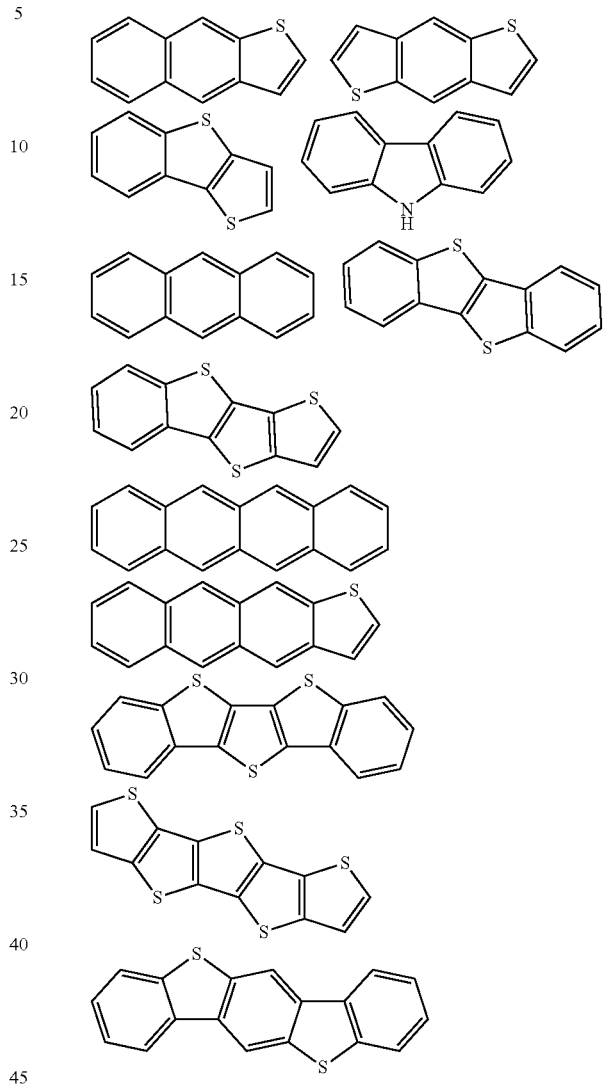

<Unit A>

[Chemical Formula 13]

(Preferred Unit C)

As the unit C, either a linear unit or a branched unit may be usable, but a linear unit may be more preferred. The carbon number of the unit C may preferably be 2 or more. This carbon number may be more preferably from 3 to 20. Increase in the carbon number may generally lead to reduction in the liquid crystal phase temperature and may be convenient particularly when using a liquid crystal phase as an organic semiconductor. However, on the other hand, if the carbon number is too long, the solubility for an organic solvent may be reduced and accordingly, the process suitability may be sometimes impaired. In the case of using a carbon number, when a structure containing oxygen, sulfur or nitrogen in the unit C is used, this may be effective in improving the solubility. At this time, a structure where the oxygen, sulfur or nitrogen atom is not directly linked o the unit A or unit B may be preferred in view of mobility, and a structure where linkage to the unit A or unit B is mediated by two or more carbons and then, oxygen, sulfur or nitrogen is linked may be preferred in view of chemical stability. Among examples above, specific examples of the unit A, unit B and unit C which are particularly suitable for attaining the object of the present invention may be illustrated below.

The compound of the unit A recited above may have a commonly known and used substituent that is substitutable on the unit A. Such a substituent may not be limited as long as it does not interfere with attaining the object of the present invention, but preferred substituents include the followings:

an alkyl group, a halogen atom, an aliphatic compound having a heteroatom such as oxygen atom, nitrogen atom and sulfur atom, an alkenyl group, an alkynyl group, and an aromatic compound as a substituent, such as thiophene, thienothiophene, benzothiophene, benzene, naphthalene, biphenyl fluorene, pyridine, imidazole, benzothiazole and furan.

<Unit B>

Thiophene, thienothiophene, benzothiophene, benzene, naphthalene, biphenyl, fluorene, pyridine, imidazole, benzothiazole, furan, cyclopentene, cyclohexene, tetrahydrofuran, tetrahydropyrane, tetrahydrothiophene, pyrrolidine, and piperidine.

The compound of the unit B recited above may have a commonly known and used substituent. Such a substituent may not be limited as long as it does not interfere with attaining the object of the present invention, but preferred substituents include the followings:

an alkyl group, a halogen atom, an aliphatic compound having a heteroatom such as oxygen atom, nitrogen atom and sulfur atom, an alkenyl group, an alkynyl group, and an aromatic compound as a substituent, such as thiophene, thienothiophene, benzothiophene, benzene, naphthalene, biphenyl fluorene, pyridine, imidazole, benzothiazole and furan.

Among others, cyclopentene, cyclohexene, tetrahydrofuran, tetrahydropyran, tetrahydrothiophene, pyrrolidine, piperidine and the like may be preferred, because the mobility may be enhanced due to providing planarity to the crystal structure of the compound.

<Unit C>

A linear alkyl group having a carbon number of 2 to 20,

[Chemical Formula 14]

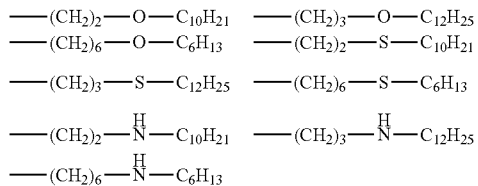

(Confirmation of Mobility as Semiconductor)

By the experiment (Measurement of Transient Photocurrent by Time-of-flight method) in Example 41 described later, it can be confirmed that the organic semiconductor material according to the present invention has mobility suitable for the action as a semiconductor. For details on the confirmation of mobility by this method, for example, the literature: Appl. Phys. Lett., 71, No. 5, 602-604 (1997) may be referred to.

One of measures for usefulness when applying an organic semiconductor to a device may be mobility of the substance, because the properties of the device are limited by the mobility. Heretofore, in the case of an amorphous organic semiconductor, the mobility may be about $10^{-2}$ cm$^2$/Vs at highest and may generally be from $10^{-5}$ to $10^{-3}$ cm$^2$/Vs. Accordingly, a high mobility exceeding $10^{-2}$ cm$^2$/Vs of a liquid crystal phase, particularly, a mobility exceeding 0.1 cm$^2$/Vs of a highly-ordered smectic phase, can be hardly realized by an amorphous organic semiconductor material, clearly revealing superiority of the liquid crystal material.

A liquid crystalline substance may exhibit a crystal phase, similarly to a non-liquid crystal substance, and therefore, in using it as an organic semiconductor, the liquid crystal substance can be of course used as an organic semiconductor not only in a liquid crystal phase but also in a crystal phase. In general, the mobility in a liquid crystal phase may be often higher by approximately from about half a digit (or an order) to one digit (or one order) than the mobility in a liquid crystal phase, and among other, in application to a transistor requiring high mobility or application to a solar cell or the like requiring a large diffusion length of a charge or an exciton, utilization of a crystal phase may be effective.

(Confirmation of Semiconductor Device Operation)

The experiment (Measurement of Transient Photocurrent by Time-of-flight method) in Example 41 described later may involve observing the generation of a photocharge by light irradiation and the charge transport, and this measurement system may correspond to realization of a photosensor using an organic semiconductor material. Accordingly, it can be confirmed by this measurement that the organic semiconductor material according to the present invention is usable for a semiconductor device operation. For details on confirmation of the semiconductor device operation by this method, for example, the literature: Appl. Phys. Lett., 74, No. 18, 2584-2586 (1999) may be referred to.

Further, as demonstrated in Example 45, by manufacturing FET and evaluating the properties thereof, it can be confirmed that the organic semiconductor material according to the present invention is usable as an organic transistor. For details on confirmation of the semiconductor device operation by this method, for example, the literature: S. F. Nelsona, Y.-Y. Lin, D. J. Gundlach, and T. N. Jackson, Temperature-independent transport in high-mobility pentacene transistors, Appl. Phys. Lett., 72, No. 15, 1854-1856 (1998) may be referred to.

(Preferred Structure)

According to the molecular design by the present invention, a structure formed by linking, in the molecular long axis direction, a hydrocarbon chain unit having a carbon number of 3 or more to either one structure in a structure where a fused ring system having linked therein from 3 to 5 aromatic rings in a rod-like manner (that is, substantially linearly) through a single bond is linked by at least another cyclic structure in the molecular long axis direction of the fused ring system, may be fundamentally preferred in the present invention.

As described above, the basis of the molecular design in the present invention may be a structure formed by linking, in the molecular long axis direction, a hydrocarbon chain unit having a carbon number of 3 or more to either one structure in a structure where a fused ring system having linked therein from 3 to 5 aromatic rings in a rod-like manner is linked by at least another cyclic structure through a single bond in the molecular long axis direction of the fused ring system. This may be exemplified in Examples using, for example, the following substances (see, the Figure).

TABLE 1

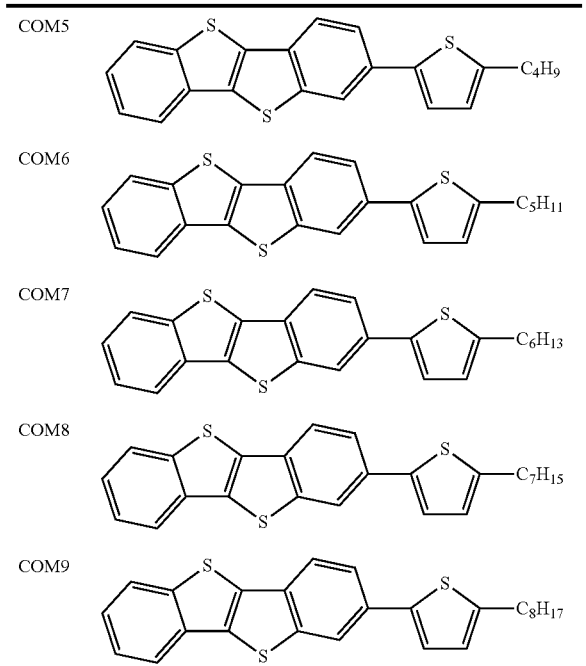

TABLE 2
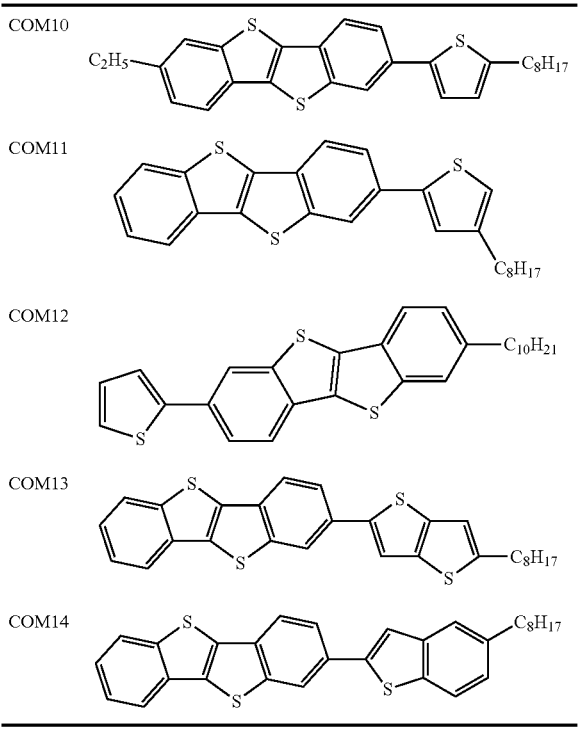
TABLE 3
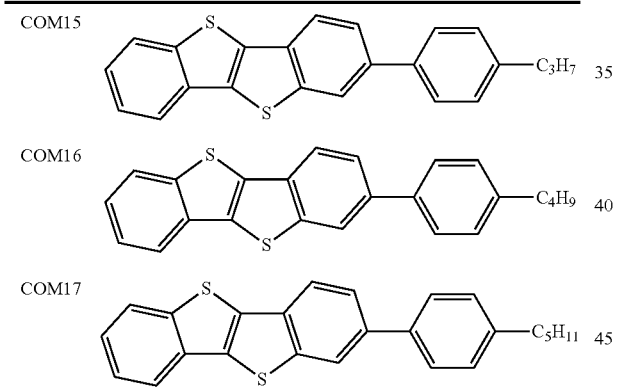
TABLE 3-continued
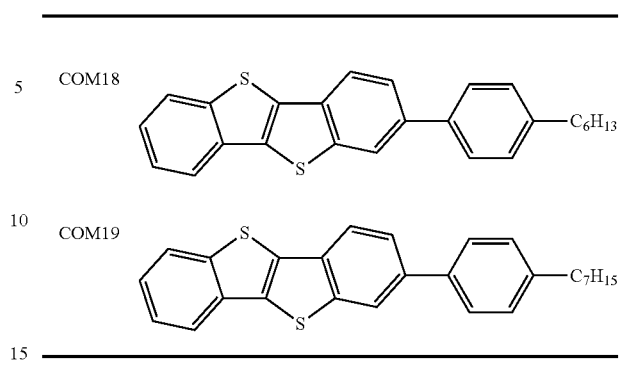
TABLE 4
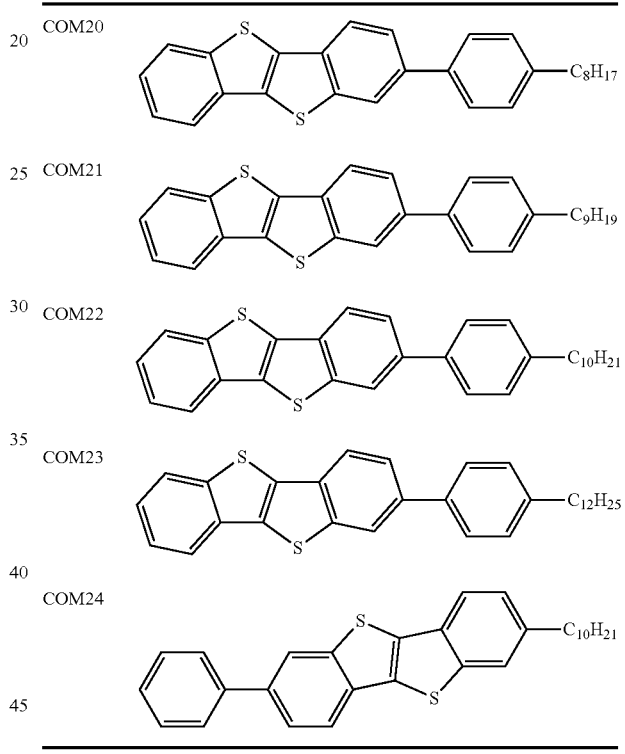
TABLE 5
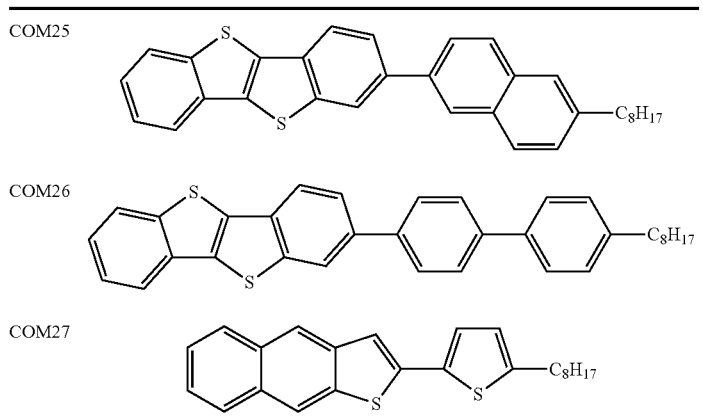

TABLE 5-continued

| COM28 | 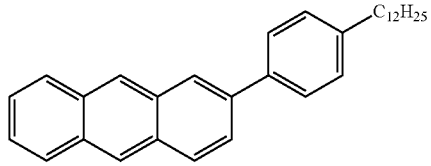 |

TABLE 6

| COM29 | 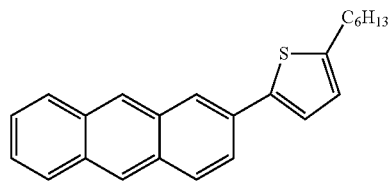 |
| COM30 | 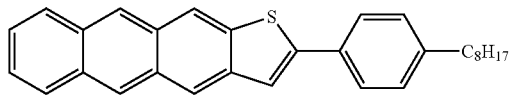 |
| COM31 | 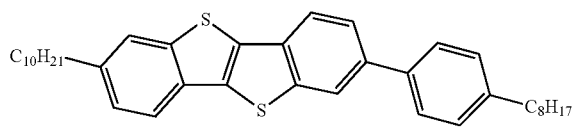 |

Further, in the group of compounds used in the present invention, the molecular design may be performed by appropriately combining the above-described units A to C, and specific compounds may include the followings, but the group of compounds applicable in the present invention may be of course not limited thereto.

TABLE 7

| 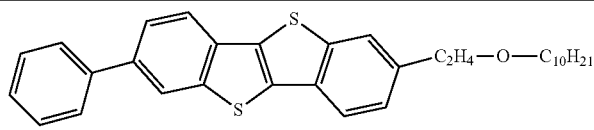 | COM32 |
| 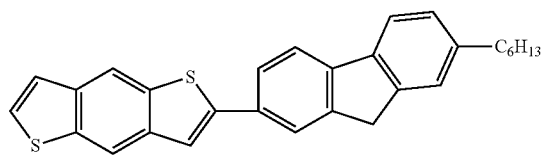 | COM33 |
| 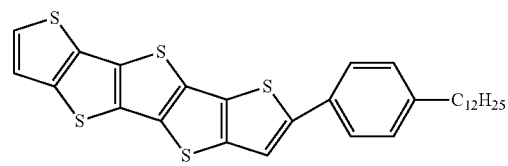 | COM34 |
| 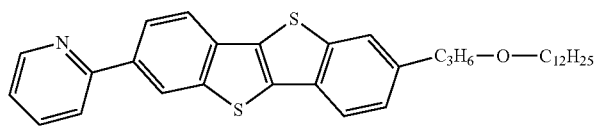 | COM35 |
| 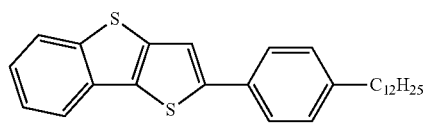 | COM36 |

TABLE 7-continued

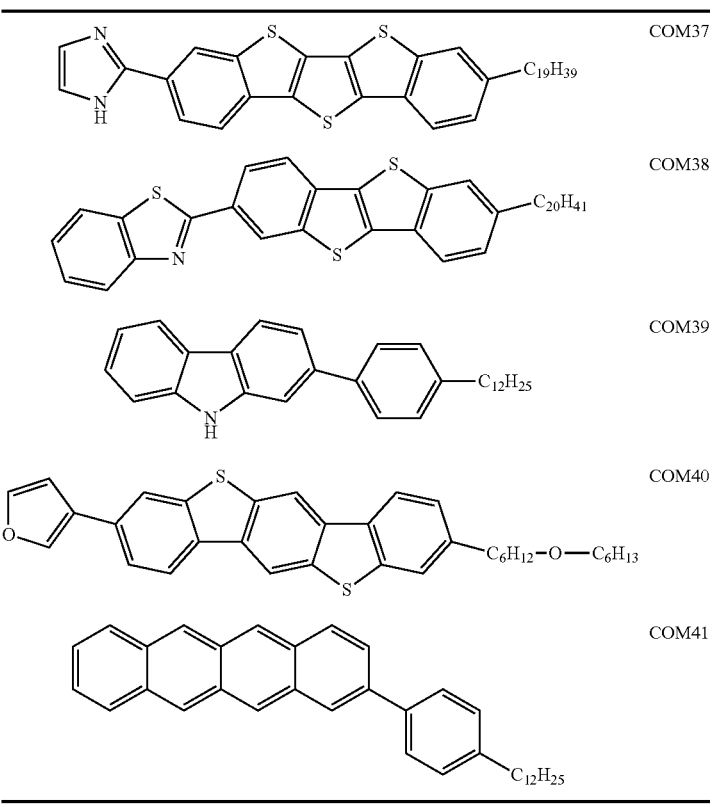

TABLE 8

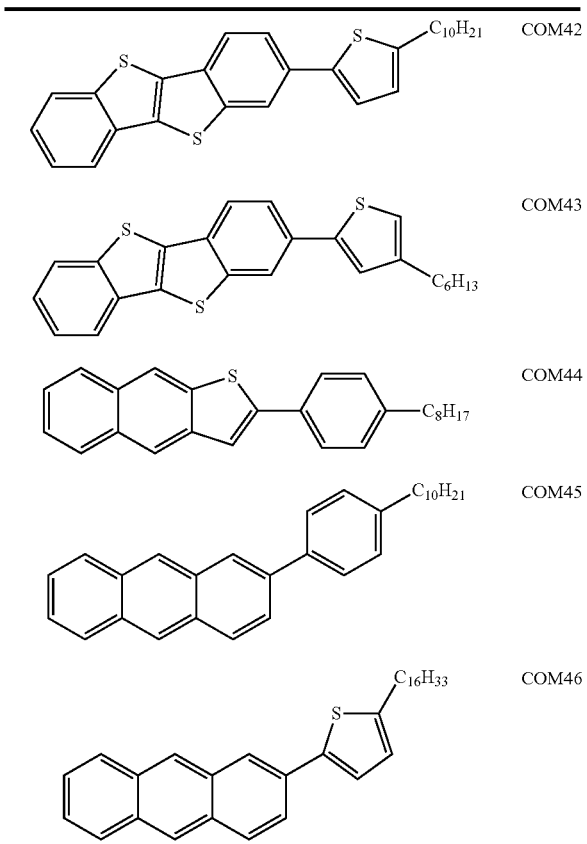

TABLE 8-continued

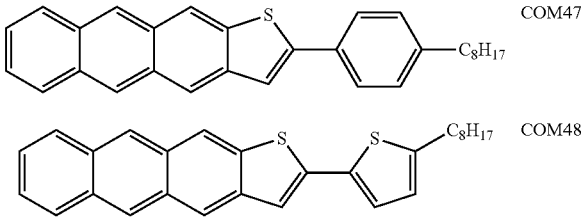

This group of compounds may be synthesized by referring to the following references and synthesis examples described in Examples later.

For example, in the synthesis of Comp. No. 32, the preparation thereof may be achieved in the same manner as in Example 20 by using, in place of dodecanoic acid chloride in Example 20, a compound obtained by treating a reaction product of 2-bromoacetic acid and decanol with thionyl chloride.

In the synthesis of Comp. No. 33, the preparation thereof may be achieved by introducing bromine into benzo[1,2-b:4,5-b']dithiophene, and subsequently reacting the resulting product with $B(OH)_2$ for providing the unit A, and then subjecting the resulting compound to a coupling reaction with 2-bromo-7-hexylfluorene.

In the synthesis of Comp. No. 34, the preparation thereof may be achieved by synthesizing pentathienoacene for providing the unit A according to the method described in Journal of American Chem. Soc., 127, 13281-13286, 2005, then monobrominating the unit A, and reacting the resulting compound with groups corresponding to the units B and C described in Example 24.

In the synthesis of Comp. No. 35, the preparation thereof may be achieved by performing a coupling reaction in the same manner as in Example 20 by using, in place of dodecanoic acid chloride in Example 20, a compound obtained by treating a reaction product of 3-bromopropionic acid and dodecanol with thionyl chloride and further using, in place of phenylboronic acid, a reaction product of bromopyridine and bispinacolate diborane.

In the synthesis of Comp. No. 36, the preparation thereof may be achieved by monobrominating benzo[b]thieno[2,3-d]thiophene for providing the unit A and then reacting the resulting compound with groups corresponding to the units B and C described in Example 24.

In the synthesis of Comp. No. 37, the preparation thereof may be achieved by synthesizing dibenzo[d,d']thieno[3,2-b:4,5-b]dithiophene for providing the unit A according to the method described in Advanced Mater., 19, 3008-3011, 2007, then brominating the unit A, and performing a coupling reaction in the same manner as in Example 20 by using, in place of dodecanoic acid chloride in Example 20, a compound obtained by treating nanodecanoic acid with thionyl chloride and further using, in place of phenylboronic acid, a reaction product of bromopyridine and bispinacolate diborane.

In the synthesis of Comp. No. 38, the preparation thereof may be achieved by performing a coupling reaction in the same manner as in Example 20 by using, in place of dodecanoic acid chloride in Example 20, a compound obtained by treating eicosanoic acid with thionyl chloride and further using, in place of phenylboronic acid, a reaction product of bromobenzothiazole and bispinacolate diborane.

In the synthesis of Comp. No. 39, the preparation thereof may be achieved by synthesizing carbazole for providing the unit A according to the method described in Tetrahedron, 67, 8248-8254, 2011, then monobrominating the unit A, and reacting the resulting compound with groups corresponding to the units B and C described in Example 24.

In the synthesis of Comp. No. 40, the preparation thereof may be achieved by synthesizing dibenzo[d,d']benzo[1,2-b:4,5-b]dithiophene for providing the unit A according to the method described in Org. Lett., 9, 4499-4502, 2007, then brominating the unit A, and performing a coupling reaction in the same manner as in Example 20 by using, in place of dodecanoic acid chloride in Example 20, a compound obtained by treating a reaction product of 6-bromohexanoic acid and hexanol with thionyl chloride and further using, in place of phenylboronic acid, a reaction product of 3-bromofuran and bispinacolate diborane.

In the synthesis of Comp. No. 41, the preparation thereof may be achieved by monobrominating tetracene for providing the unit A and then reacting the resulting compound with groups corresponding to the units B and C described in Example 24.

Comp. No. 42 to Comp. No. 48 may be further synthesized by the same method.

Further, the compounds of Comp. No. 32 to Comp. No. 48 may be confirmed to be in the group of compounds capable of solving the task of the present invention, by the method described in the literature recited in the paragraph of Screening Method.

The materials used in Examples may be shown together in the Tables below. In the Tables, respective signs have the following meanings.

(a) Chemical structural formula
(b) Phase transition behavior (cooling process)
*I: Isotropic phase
N: Nematic phase
SmA: Smectic A phase
SmC: Smectic C phase
SmE: Smectic E phase
SmG: Smectic G phase
SmX: Highly ordered smectic phase or metastable crystal
K: Crystal phase

TABLE 9

| Compound | (a) | (b) |
|---|---|---|
| COM5 | [structure with $C_4H_9$] | I-(201° C.)-SmA-(195° C.)-SmE |
| COM6 | [structure with $C_5H_{11}$] | I-(202° C.)-SmA-(188° C.)-SmE-(107° C.)-K |
| COM7 | [structure with $C_6H_{13}$] | I-(200° C.)-SmA-(185° C.)-SmE-(100° C.)-K |
| COM8 | [structure with $C_7H_{15}$] | I-(201° C.)-SmA-(183° C.)-SmE-(93° C.)-K |
| COM9 | [structure with $C_8H_{17}$] | I-(198° C.)-SmA-(180° C.)-SmE-(102° C.)-K |

TABLE 10

| Compound | (a) | (b) |
|---|---|---|
| COM10 | [structure] | I-(202° C.)-SmA-(188° C.)-SmE-(108° C.)-K |
| COM11 | [structure] | I-(169° C.)-SmX-(115° C.)-K |
| COM12 | [structure] | I-(235° C.)-SmA-(219° C.)-SmE-(71° C.)-K |
| COM13 | [structure] | I-(237° C.)-SmX-(184° C.)-K |
| COM14 | [structure] | I-(202° C.)-SmX-(191° C.)-K |

TABLE 11

| Compound | (a) | (b) |
|---|---|---|
| COM15 | [structure] | I-(243° C.)-N-(223° C.)-SmA-(207° C.)-SmX-(194° C.)-K |
| COM16 | [structure] | I-(231° C.)-N-(223° C.)-SmA-(200° C.)-SmE-(172° C.)-K |
| COM17 | [structure] | I-(238° C.)-N-(227° C.)-SmA-(191° C.)-SmE-(165° C.)-K |
| COM18 | [structure] | I-(224° C.)-SmA-(186° C.)-SmE-(166° C.)-K |

TABLE 12

| Compound | (a) | (b) |
|---|---|---|
| COM19 | [benzothieno-benzothiophene]–C6H4–C7H15 | I-(230° C.)-SmA-(188° C.)-SmE-(148° C.)-K |
| COM20 | [benzothieno-benzothiophene]–C6H4–C8H17 | I-(223° C.)-SmA-(182° C.)-SmE-(149° C.)-K |
| COM21 | [benzothieno-benzothiophene]–C6H4–C9H19 | I-(221° C.)-SmA-(179° C.)-SmE-(147° C.)-K |
| COM22 | [benzothieno-benzothiophene]–C6H4–C10H21 | I-(219° C.)-SmA-(178° C.)-SmE-(142° C.)-K |
| COM23 | [benzothieno-benzothiophene]–C6H4–C12H25 | I-(213° C.)-SmA-(174° C.)-SmE-(136° C.)-K |

TABLE 13

| Compound | (a) | (b) |
|---|---|---|
| COM24 | phenyl–[benzothieno-benzothiophene]–C10H21 | I-(223° C.)-SmA-(210° C.)-SmE-(90° C.)-K |
| COM25 | [benzothieno-benzothiophene]–naphthyl–C8H17 | I-(194° C.)-SmA-(162° C.)-SmE-(141° C.)-K (temperature rising process) |
| COM26 | [benzothieno-benzothiophene]–C6H4–C6H4–C8H17 | I-(260° C.)-SmX-(175° C.)-K |
| COM27 | [naphthothiophene]–[thiophene]–C8H17 | I-(147° C.)-SmX-(134° C.)-K |

TABLE 14

| Compound | (a) | (b) |
|---|---|---|
| COM28 | [anthracene-phenyl-C₁₂H₂₅ structure] | I-(205° C.)-SmX-(58° C.)-K |
| COM29 | [anthracene-thiophene-C₆H₁₃ structure] | I-(155° C.)-SmX-(114° C.)-K |
| COM30 | [naphthothiophene-phenyl-C₁₂H₂₅ structure] | I-(305° C.)-SmX-(229° C.)-K |
| COM31 | [C₁₀H₂₁-BTBT-phenyl-C₈H₁₇ structure] | I-(249° C.)-SmC-(172° C.)-SmX-(100° C.)-K |

TABLE 15

| Compound | (a) | (b) |
|---|---|---|
| COM49 | [tolyl-BTBT-C₁₀H₂₁ structure] 1-P-BTBT-10 | I-(264° C.)-SmA-(210° C.)-SmE |
| COM50 | [3-tolyl-BTBT-C₁₀H₂₁ structure] 1-(3)P-BTBT-10 | I-(176° C.)-SmA-(152° C.)-SmE |
| COM51 | [2-tolyl-BTBT-C₁₀H₂₁ structure] 1-(2)P-BTBT-10 | I-(91° C.)-SmX |
| COM52 | [methylthiophene-BTBT-C₁₀H₂₁ structure] 1-TP-BTBT-10 | I-(254° C.)-SmA-(211° C.)-SmE-(81° C.)-K |

TABLE 15-continued
| Compound | (a) | (b) |
| --- | --- | --- |
| COM53 | 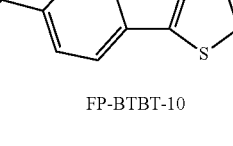 FP-BTBT-10 | I-(213° C.)-SmA-(173° C.)-SmE |
| COM54 | 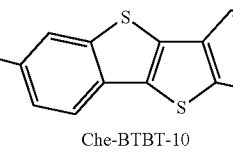 Che-BTBT-10 | I-(172° C.)-SmA-(163° C.)-SmE-(57° C.)-K |
| COM55 | 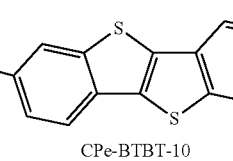 CPe-BTBT-10 | I-(211° C.)-SmA-(185° C.)-SmE-(120° C.)-K |
| COM56 | 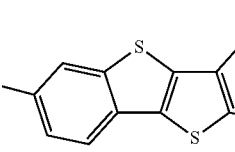 Pip-BTBT-10 | I-(126° C.)-SmX-(51° C.)-K |
| COM57 | 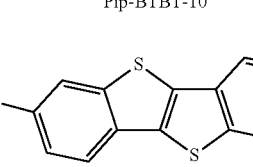 Pyr-BTBT-10 | I-(272° C.)-SmA-(243° C.)-SmE-(200° C.)-K |
| COM58 | 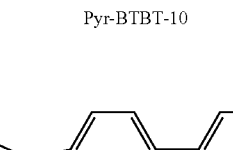 2PMes-(10-BTBT)2 | I-(311° C.)-N-(265° C.)-SmX-(214° C.)-K |
| COM59 | 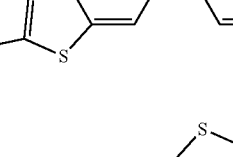 BTDT-TP-8 | I-(215° C.)-SmA-(158° C.)-SmE-(98° C.)-K |

TABLE 15-continued

| Compound | (a) | (b) |
|---|---|---|
| COM60 | 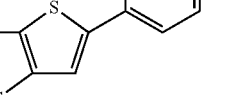<br>BTDT-P-8 | I-(272° C.)-SmA-(215° C.)-SmE |
| COM61 | 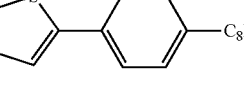<br>NPT-P-8 | I-(274° C.)-SmX |
| COM62 | 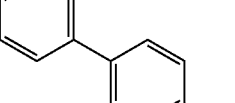<br>ANT-P-8 | I-(164° C.)-SmX-(128° C.)-K |
| COM63 | 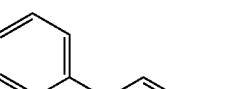<br>ANT-P-O12 | I-(174° C.)-SmX$_1$-(138° C.)-SmX$_2$-(112° C.)-K |

EXAMPLES

Example 1

The raw material [1][benzothieno[3,2-b][1]benzothiophene-2-amine was synthesized by the method described in B. Kosata, V. Kozmik and J. Svoboda, Collect. Czech. Chem. Commun., Vol. 67, 645 (2002).

[1][Benzothieno[3,2-b][1]benzothiophene-2-amine (3.76 g, 0.014 mol) was added to a solution of hydrochloric acid (110 ml) and water (220 ml). This solution was cooled to 5° C. and then added dropwise to a solution obtained by dissolving sodium nitrite (1.1 g, 0.016 mol) in water (66 ml). The resulting reaction solution was stirred at 5° C. for 3.5 hours, and a solution obtained by dissolving potassium iodide (2.65 g, 0.016 mol) in water (66 ml) was added dropwise thereto. The reaction temperature was returned to room temperature, and the reaction solution was stirred for 16 hours. The precipitate in the reaction solution was collected by filtration, washed with water and extracted with dichloromethane. After concentrating the solvent, the obtained residue was purified by column chromatography to obtain 3.38 g (yield: 66%) of 2-iodo[1][benzothieno[3,2-b][1]benzothiophene.

NMR (300 MHz, in CDCl$_3$): 8.26 (d, J=1.2 Hz, 1H), 7.92 (dd, J=0.9 Hz, J=5.7 Hz, 1H), 7.88 (dd, J=1.2 Hz, J=6.3 Hz, 1H), 7.74 (dd, J=1.2 Hz, J=6.3 Hz, 1H), 7.62 (d, J=6.0 Hz, 1H), 7.51-7.41 (m, 2H).

Using the thus-synthesized 2-iodo[1][benzothieno[3,2-b][1]benzothiophene as a raw material, the target compound was synthesized by a Suzuki coupling reaction using a corresponding boron compound. A general method is described by using Comp. No. 9 as an example.

In an argon atmosphere, 2-iodo[1][benzothieno[3,2-b][1]benzothiophene (120 mg, 0.32 mmol), 2-(5-octylthienyl-2-yl)-4,4,5,5-tetramethyl-1,3,2-dioxaborane (130 mg, 0.39 mol) and cesium carbonate (130 g, 0.40 mmol) were dissolved in 1,2-dimethoxyethane/water (10 m/1 ml) and after adding tetrakis(triphenylphohsphine)palladium (23 mg, 0.02 mmol), the solution was heated with stirring at 95° C. for 19 hours. The reaction solution was concentrated and then extracted with chloroform, and the organic layer was washed with water and dried over magnesium sulfate. After concentrating under reduced pressure, the residue was purified by column chromatography to obtain 70 mg (yield: 50%) of the compound of Comp. No. 9.

$^1$H-NMR (300 MHz, CDCl$_3$, δ): 8.08 (d, J=1.2 Hz, 1H), 7.95 (dd, J=1.2 Hz, J=8.1 Hz, 1H), 7.88 (m, 1H), 7.84 (d, J=8.1 Hz, 1H), 7.67 (dd, J=1.2 Hz, J=8.4 Hz, 1H), 7.46 (ddd, J=1.2 Hz, J=7.2 Hz, J=8.4 Hz, 1H), 7.40 (ddd, J=1.2 Hz, J=7.2 Hz, J=8.4 Hz, 1H), 7.22 (d, J=3.6 Hz, 1H), 6.79 (d, J=3.6 Hz, 1H), 2.84 (t, J=7.5 Hz, 2H), 1.75-1.70 (m, 2H), 1.41-1.29 (m, 10H), 0.89 (t, J=6.6 Hz, 3H).

Figure 21:
FIG. 21 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 9.
Figure 21:

This substance was subjected to the screening method described in this specification, so as to observe the texture thereof. The thus obtained observation results are shown in FIG. 21.

Example 2

From 2-iodo[1][benzothieno[3,2-b][1]benzothiophene (150 mg, 0.41 mmol) and 2-(5-butylthienyl-2-yl)-4,4,5,5-tetramethyl-1,3,2-dioxaborane (120 mg, 0.45 mol), 60 mg (yield: 39%) of the compound of Comp. No. 5 was obtained by the same method as in Example 1.

$^1$H-NMR (300 MHz, CDCl$_3$, δ): 8.07 (d, J=1.2 Hz, 1H), 7.93 (dd, J=1.2 Hz, J=8.1 Hz, 1H),
7.88 (m, 1H), 7.85 (d, J=8.1 Hz, 1H), 7.67 (dd, J=1.2 Hz, J=8.4 Hz, 1H),
7.46 (ddd, J=1.2 Hz, J=7.2 Hz, J=8.4 Hz, 1H), 7.40 (ddd, J=1.2 Hz, J=7.2 Hz, J=8.4 Hz, 1H),
7.22 (d, J=3.6 Hz, 1H), 6.78 (d, J=3.6 Hz, 1H), 2.86 (t, J=7.5 Hz, 2H), 1.77-1.67 (m, 2H),
1.50-1.41 (m, 2H), 0.99 (t, J=7.1 Hz, 3H).

Figure 17:
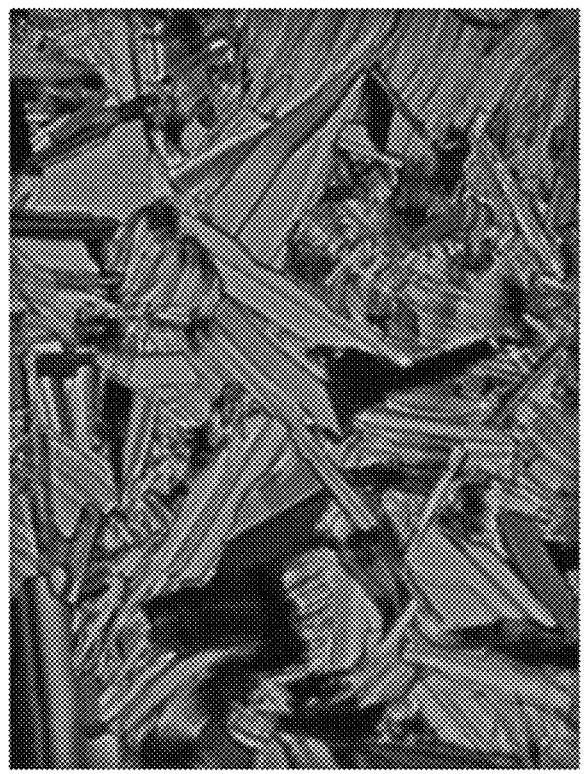
FIG. 17 is (a) an example of the polarizing micrograph showing the polarizing microscopic texture at room temperature, and (b) an example of the polarized optical microscopic image showing the polarizing microscopic texture of a phase in a high temperature region adjacent to a crystal phase, with respect to the compound of Comp. No. 5.
Figure 17:

This substance was subjected to by the screening method described in this specification, so as to observe the texture thereof. The thus obtained observation results are shown in FIG. 17.

Example 3

From 2-iodo[1][benzothieno[3,2-b][1]benzothiophene (130 mg, 0.35 mmol) and 2-(5-pentylthienyl-2-yl)-4,4,5,5-tetramethyl-1,3,2-dioxaborane (110 mg, 0.39 mol), 90 mg (yield: 65%) of the compound of Comp. No. 6 was obtained by the same method as in Example 1.

$^1$H-NMR (300 MHz, CDCl$_3$, δ): 8.08 (d, J=1.2 Hz, 1H), 7.93 (dd, J=1.2 Hz, J=8.1 Hz, 1H),
7.89 (m, 1H), 7.85 (d, J=8.1 Hz, 1H), 7.67 (dd, J=1.2 Hz, J=8.4 Hz, 1H),
7.46 (ddd, J=1.2 Hz, J=7.2 Hz, J=8.4 Hz, 1H), 7.40 (ddd, J=1.2 Hz, J=7.2 Hz, J=8.4 Hz, 1H),
7.22 (d, J=3.6 Hz, 1H), 6.78 (d, J=3.6 Hz, 1H), 2.85 (t, J=7.5 Hz, 2H), 1.76-1.71 (m, 2H),
1.42-1.37 (m, 4H), 0.91 (t, J=7.0 Hz, 3H).

Figure 18:
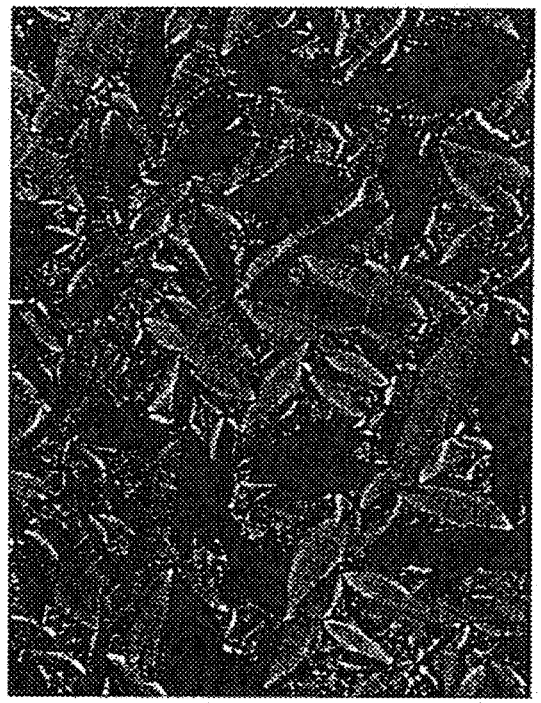
FIG. 18 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, With respect to the compound of Comp. No. 6.
Figure 18:
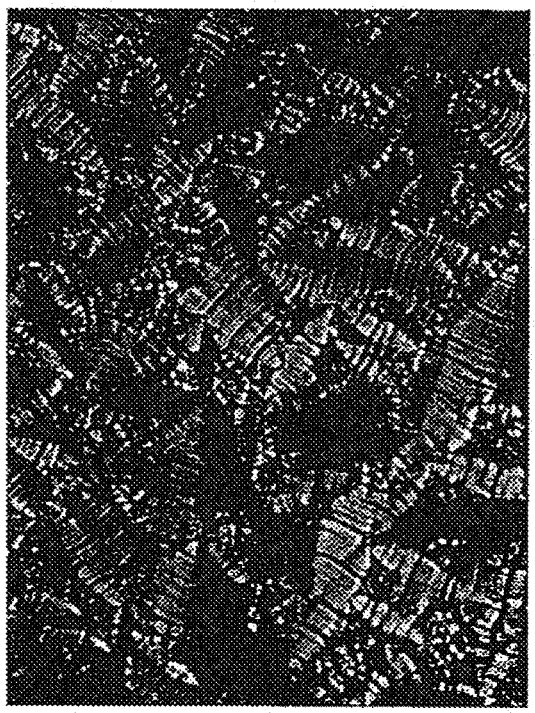

This substance was subjected to the screening method described in this specification, so as to observe the texture thereof. The thus obtained observation results are shown in FIG. 18.

Example 4

From 2-iodo[1][benzothieno[3,2-b][1]benzothiophene (80 mg, 0.22 mmol) and 2-(5-hexylthienyl-2-yl)-4,4,5,5-tetramethyl-1,3,2-dioxaborane (71 mg, 0.24 mol), 45 mg (yield: 51%) of the compound of Comp. No. 7 was obtained by the same method as in Example 1.

$^1$H-NMR (300 MHz, CDCl$_3$, δ): 8.08 (d, J=1.2 Hz, 1H), 7.92 (dd, J=1.2 Hz, J=8.1 Hz, 1H),
7.88 (d, J=8.1 Hz, 1H), 7.84 (d, J=8.1 Hz, 1H), 7.66 (dd, J=1.2 Hz, J=8.4 Hz, 1H),
7.46 (ddd, J=1.2 Hz, J=7.8 Hz, J=8.4 Hz, 1H), 7.41 (ddd, J=1.2 Hz, J=7.8 Hz, J=8.4 Hz, 1H),
7.24 (d, J=3.6 Hz, 1H), 6.79 (d, J=3.6 Hz, 1H), 2.84 (t, J=7.5 Hz, 2H), 1.75-1.70 (m, 2H),
1.44-1.30 (m, 6H), 0.91 (t, J=6.0 Hz, 3H).

Figure 19:
FIG. 19 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 7.
Figure 19:
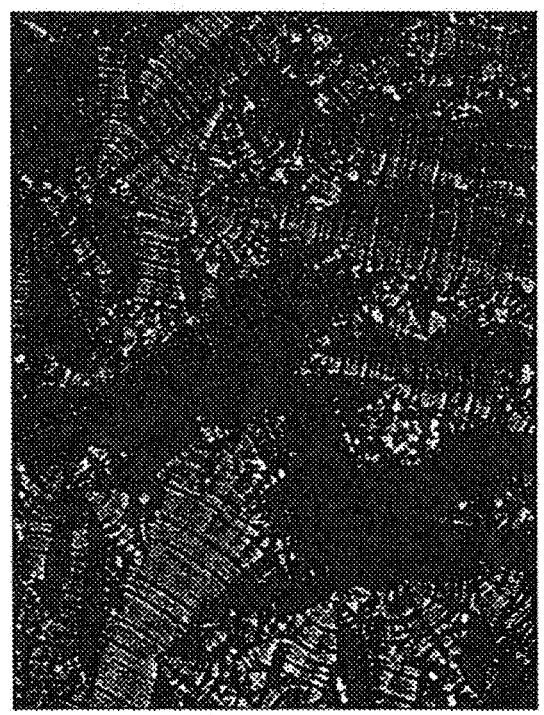

This substance was subjected to the screening method described in this specification, so as to observe the texture thereof. The thus obtained observation results are shown in FIG. 19.

Example 5

From 2-iodo[1][benzothieno[3,2-b][1]benzothiophene (130 mg, 0.35 mmol) and 2-(5-heptylthienyl-2-yl)-4,4,5,5-tetramethyl-1,3,2-dioxaborane (120 mg, 0.39 mol), 56 mg (yield: 38%) of the compound of Comp. No. 8 was obtained by the same method as in Example 1.

$^1$H-NMR (300 MHz, CDCl$_3$, δ): 8.08 (d, J=1.2 Hz, 1H), 7.93 (dd, J=1.2 Hz, J=8.1 Hz, 1H),
7.89 (m, 1H), 7.85 (d, J=8.1 Hz, 1H), 7.65 (dd, J=1.2 Hz, J=8.4 Hz, 1H), 7.46 (ddd, J=1.2 Hz, J=7.2 Hz, J=8.4 Hz, 1H), 7.41 (ddd, J=1.2 Hz, J=7.2 Hz, J=8.4 Hz, 1H), 7.22 (d, J=3.6 Hz, 1H),
6.78 (d, J=3.6 Hz, 1H), 2.85 (t, J=7.5 Hz, 2H), 1.75-1.68 (m, 2H), 1.46-1.31 (m, 8H),
0.89 (t, J=7.0 Hz, 3H).

Figure 20:
FIG. 20 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 8.
Figure 20:
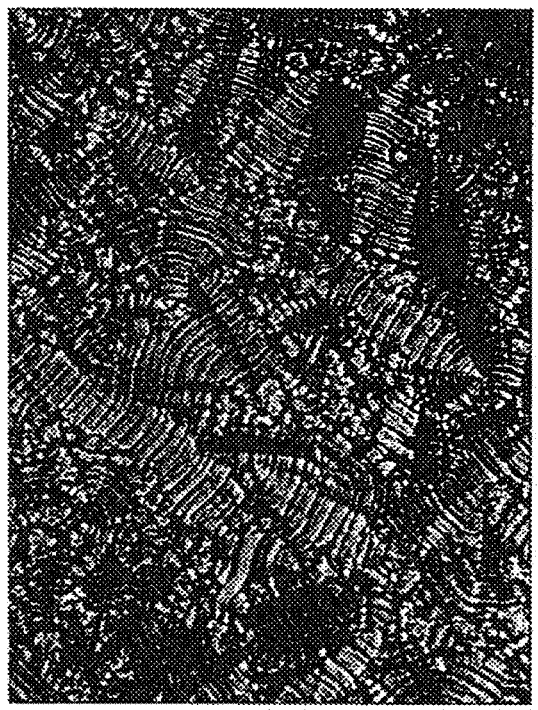

This substance was subjected to the screening method described in this specification, so as to observe the texture thereof. The thus obtained observation results are shown in FIG. 20.

Example 6

Comp. No. 10 was synthesized by the following method.

The raw material 2-ethyl[1]benzothieno[3,2-b]benzothiophene was synthesized by the method described in B. Kosata, V. Kozmik and J. Svoboda, Collect. Czech. Chem. Commun., Vol. 67, 645 (2002).

2-Ethyl[1]benzothieno[3,2-b]benzothiophene (550 mg, 2.0 mmol) was dissolved in dichloromethane (40 ml) and after cooling to −45° C., a dichloromethane (5 ml) solution of fuming nitric acid (250 mg, 4.0 mmol) was added dropwise thereto. The reaction solution was stirred at −45 to −30° C. for 40 minutes and then returned to room temperature. This solution was extracted with dichloromethane, washed with water and dried over magnesium sulfate. The solvent was removed by distillation to obtain a yellow solid substance (630 mg).

The obtained yellow solid substance (630 mg) was suspended in toluene (60 ml) and subsequently, iron powder (1.94 g, 34.8 mmol) was added thereto. The resulting suspension was heated with stirring at 125° C. and to this reaction solution, a solution obtained by dissolving ammonium chloride (100 mg, 1.8 mmol) in water (1.6 ml) was added dropwise. After the dropwise addition, the solution was heated with stirring for 1 hour, and the toluene layer was separated and dried over magnesium sulfate. The solvent was removed by distillation under reduced pressure, and the residue was purified by column chromatography to obtain 470 mg (yield: 84%) of 2-amino-7-ethyl[1]benzothieno[3,2-b]benzothiophene.

$^1$H-NMR (300 MHz, CDCl$_3$, δ): 7.70 (d, J=0.6 Hz. 1H), 7.69 (d, J=0.6 Hz. 1H), 7.63 (d, J=8.4 Hz. 1H), 7.27 (m, 1H), 7.17 (d, J=2.0 Hz, 1H), 6.82 (dd, J=2.0 Hz, J=8.4 Hz, 1H), 3.85 (bs, 2H),
2.79 (q, J=7.5 Hz, 2H), 1.32 (t, J=7.5 Hz, 3H).

Concentrated hydrochloric acid (11 ml) and water (22 ml) were added to 2-amino-7-ethyl[1]benzothieno[3,2-b]benzothiophene (470 mg, 1.67 mmol), and the system was cooled to 5° C. To this solution, a solution obtained by dissolving sodium nitrite (130 mg, 0.19 mmol) in water (7 ml) was added dropwise. The resulting solution was stirred at 5° C. for 1 hour and thereafter, a water (7 ml) solution of potassium iodide (300 mg, 1.83 mmol) was added dropwise. The reaction solution was returned to room temperature and stirred for 4 hours, and the reaction mixture was extracted with chloroform, washed with water and dried over magnesium sulfate. The solvent was removed by distillation under reduced pressure, and the residue was purified by column chromatography to obtain 400 mg (yield: 61%) of 2-iodo-7-ethyl[1]benzothieno[3,2-b]benzothiophene.

$^1$H-NMR (300 MHz, CDCl$_3$ δ): 8.23 (d, J=1.4 Hz, 1H), 7.78 (d, J=8.2 Hz, 1H), 7.72 (dd, J=1.4, J=8.2 Hz, 1H), 7.73 (d, J=1.4 Hz, 1H), 7.62 (d, J=8.2 Hz, 1H), 7.26 (dd, J=1.8 Hz, J=8.2 Hz, 1H), 2.82 (q, J=7.0 Hz, 2H), 0.93 (t, J=7.0 Hz, 3H).

In an argon atmosphere, 2-iodo-7-ethyl[1]benzothieno[3,2-b]benzothiophene (200 mg, 0.50 mmol), 2-(5-octylthienyl-2-yl)-4,4,5,5-tetramethyl-1,3,2-dioxaborane (160 mg, 0.51 mol) and cesium carbonate (170 mg, 0.51 mmol) were dissolved in 1,2-dimethoxyethane/water (20 m/2 ml), and tetrakis(triphenylphosphine)palladium (29 mg, 0.025 mmol) was added thereto. The system was stirred at 95° C. for 20 hours, and the resulting reaction solution was concentrated and then extracted with chloroform. The organic layer was washed with water and dried over magnesium sulfate and after removing the solvent by distillation under reduced pressure, the residue was purified by column chromatography to obtain 70 mg (yield: 30%) of the compound of Comp. No. 10.

$^1$H-NMR (300 MHz, CDCl$_3$, δ): 8.05 (d, J=1.2 Hz, 1H), 7.79 (d, J=8.1 Hz, 1H), 7.76 (d, J=8.1 Hz, 1H), 7.72 (d, J=0.6 Hz, 1H), 7.63 (dd, J=1.8 Hz, J=8.1 Hz, 1H), 7.23 (dd, J=1.8 Hz, J=8.1 Hz, 1H), 7.20 (d, J=3.6 Hz, 1H), 6.77 (d, J=3.6 Hz, 1H), 2.85 (q, J=4.8 Hz, 2H), 2.79 (q, J=7.5 Hz, 2H), 1.77-1.66 (m, 2H), 1.50-1.20 (m, 10H), 0.91 (t, J=4.8 Hz, 3H), 0.89 (t, J=7.5 Hz, 3H).

Figure 22:
FIG. 22 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 10.
Figure 22:

This substance was subjected to the screening method described in this specification, so as to observe the texture thereof. The thus obtained observation results are shown in FIG. 22.

Example 7

Copper bromide (5.74 g, 40 mmol) was added to a pyridine solution of 2-iodo[1][benzothieno[3,2-b][1]benzothiophene (1.69 g, 4.6 mmol), and the system was heated under reflux for 21 hours. Water (250 ml) was added to the reaction solution and subsequently, 20% sulfuric acid was added to adjust the pH to 7.0. Thereafter, the reaction solution was extracted with dichloromethane, washed with water and dried over magnesium sulfate. After concentrating under reduced pressure, the residue was purified by column chromatography to obtain 1.45 g (yield: 98%) of 2-bromo[1][benzothieno[3,2-b][1]benzothiophene.

NMR (300 MHz, in CDCl$_3$): 8.03 (d, J=1.5 Hz, 1H), 7.937.85 (m, 2H), 7.20 (d, J=8.4 Hz, 1H), 7.54 (dd, J=1.8 Hz, J=8.4 Hz, 1H), 7.49-7.38 (m, 2H).

In an argon atmosphere, 2-bromo[1][benzothieno[3,2-b][1]benzothiophene (200 mg, 0.62 mmol), 2-(4-octylthienyl-2-yl)-4,4,5,5-tetramethyl-1,3,2-dioxaborane (260 mg, 0.82 mol) and cesium carbonate (300 mg, 0.92 mmol) were dissolved in dimethylformamide (1 ml), and tetrakis (triphenylphosphine) palladium (26 mg, 0.02 mmol) was added thereto. The system was heated with stirring at 95° C. for 19 hours, and the reaction solution was concentrated and then extracted with chloroform. The organic layer was washed with water, and dried over magnesium sulfate. After concentrating under reduced pressure, the residue was purified by column chromatography to obtain 185 mg (yield: 69%) of the compound of Comp. No. 11.

$^1$H-NMR (300 MHz, CDCl$_3$, δ): 8.12 (d, J=1.5 Hz, 1H), 7.92 (d, J=7.5 Hz, 1H), 7.90 (d, J=7.5 Hz, 1H), 7.85 (d, J=8.4 Hz, 1H), 7.70 (dd, J=1.5 Hz, J=8.1 Hz, 1H), 7.46 (ddd, J=1.2 Hz, J=7.2 Hz, J=8.4 Hz, 1H), 7.39 (ddd, J=1.2 Hz, J=7.2 Hz, J=8.4 Hz, 1H), 7.22 (s, 1H), 6.92 (s, 1H), 2.64 (t, J=7.5 Hz, 2H), 1.75-1.62 (m, 2H), 1.42-1.20 (m, 10H), 0.89 (t, J=6.6 Hz, 3H).

Figure 23:
FIG. 23 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 11.
Figure 23:

This substance was subjected to the screening method described in this specification, so as to observe the texture thereof. The thus obtained observation results are shown in FIG. 23.

Example 8

Comp. No. 12 was synthesized as follows by a coupling reaction of Comp. No. 24-5 shown below (Example 20) and thienylstannane based on the synthesis scheme of Comp. No. 24.

An argon gas was bubbled through a toluene solution (2.5 mL) containing Comp. No. 24-5 (113 mg, 0.223 mmol) and tributyl-2-thienylstannane (Tokyo Chemical Industry Co., Ltd., 103 mg, 0.27 mmol) for 10 minutes, and tetrakis (triphenylphosphine)palladium (13 mg, 0.011 mmol) was added thereto and reacted at 95° C. for 18 hours. Further, tributyl-2-thienylstannane (42 mg) and tetrakis(triphenylphosphine)palladium (8 mg) were added and after reaction for 8 hours, the reaction solution was diluted with chloroform, washed in sequence with water, with an aqueous saturated potassium fluoride solution and with water. The lower layer was filtered with an anhydrous sodium sulfate layer and then concentrated to dryness, and the obtained solid was crystallized from chloroform-petroleum benzine to obtain 60 mg (yield: 58%) of the compound of Comp. No. 12.

H-nmr (500 MHz, CDCl3): δ 8.12 (d, 1H, J>1 Hz, H-6), 7.84 (d, 1H, J 8.3 Hz, H-9), 7.78 (d, 1H, J 8.3 Hz, H-4), 7.72 (br. s, 1H, H-1), 7.70 (dd, 1H, J 1.8, 8.3 Hz, H-8), 7.40 (dd, 1H, J up to 1, 3.7 Hz, H-5' (' denote thiophene)), 7.32 (dd, 1H, J up to 1, 5 Hz, H-3'), 7.29 (dd, 1H, J up to 1, up to 8 Hz, H-3), 7.12 (dd, 1H, J 3.7, 5 Hz, H-4'), 2.76 (t, 2H, J up to 7 Hz, ArCH2), 1.70 (quint. 2H, J up to 7 Hz, ArCH2CH2). up to 1.2, up to 1.4 (m, 14H, CH2×7), 0.88 (t, 3H, J up to 7 Hz, CH3).

Figure 24:
FIG. 24 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 12.
Figure 24:

This substance was subjected to the screening method described in this specification, so as to observe the texture thereof. The thus obtained observation results are shown in FIG. 24.

Example 9

Comp. No. 13 was synthesized by the following method.

In an argon atmosphere, 2-iodo[1][benzothieno[3,2-b][1]benzothiophene (190 mg, 0.52 mmol), bis(pinacolate)diborane (150 mg, 0.59 mmol), potassium acetate (76 mg, 0.77 mmol) and [1,1'-bis(diphenylphosphino)ferrocene]palladium chloride.dichloromethane adduct (PdCl$_2$(dppf), 7 mg (0.008 mmol) were made into a dimethylsulfoxide (3 ml) solution, and the solution was heated with stirring at 90° C. for 19 hours. Water was added to the reaction solution and after filtering out insoluble matters, the filtrate was extracted with chloroform, washed with water and dried over magnesium sulfate. After concentrating under reduced pressure, the residue was purified by column chromatography to obtain 140 mg (yield: 74%) of 2-([1]benzothieno[3,2-b][1]benzothiophene-2-yl)-4,4,5,5-tetramethyl-1,3,2-dioxaborane.

$^1$H-NMR (300 MHz, CDCl$_3$, δ): 8.40 (s, 1H), 7.93-7.88 (m, 4H), 7.44 (ddd, J=0.9 Hz, J=5.4 Hz, J=8.0 Hz, 1H), 7.40 (ddd, J=0.9 Hz, J=5.4 Hz, J=8.0 Hz, 1H), 1.39 (s, 12H).

In an argon atmosphere, 2-([1]benzothieno[3,2-b][1]benzothiophene-2-yl)-4,4,5,5-tetramethyl-1,3,2-dioxaborane (150 mg, 0.59 mmol), 2-bromo-5'-octylthieno[3,2-b]thiophene (130 mg, 0.39 mol) and cesium carbonate (130 g, 0.40 mmol) were dissolved in 1,2-dimethoxyethane/water (10 m/1 ml), and tetrakis(triphenylphosphine)palladium (23 mg, 0.02 mmol) was added thereto. The system was heated with stirring at 95° C. for 19 hours, and the reaction solution was concentrated and then extracted with chloroform. The organic layer was washed with water and dried over magnesium sulfate. After concentrating under reduced pressure, the residue was purified by column chromatography to obtain 70 mg (yield: 50%) of the compound of Comp. No. 13.

$^1$H-NMR (300 MHz, CDCl$_3$, δ): 8.13 (d, J=1.5 Hz, 1H), 7.93 (dd, J=1.5 Hz, J=7.5 Hz, 1H), 7.89 (m, 2H), 7.87 (d, J=7.5 Hz, 1H), 7.71 (dd, J=1.2 Hz, J=8.4 Hz, 1H), 7.52 (s, 1H), 7.47 (ddd, J=1.5 Hz, J=7.5 Hz, J=0.6 Hz, 1H), 7.41 (ddd, J=1.5 Hz, J=7.5 Hz, J=0.6 Hz, 1H), 6.97 (s, 1H), 2.90 (t, J=7.5 Hz, 2H), 1.72-1.67 (m, 2H), 1.42-1.20 (m, 10H), 0.93 (t, J=6.0 Hz, 3H).

Figure 25:
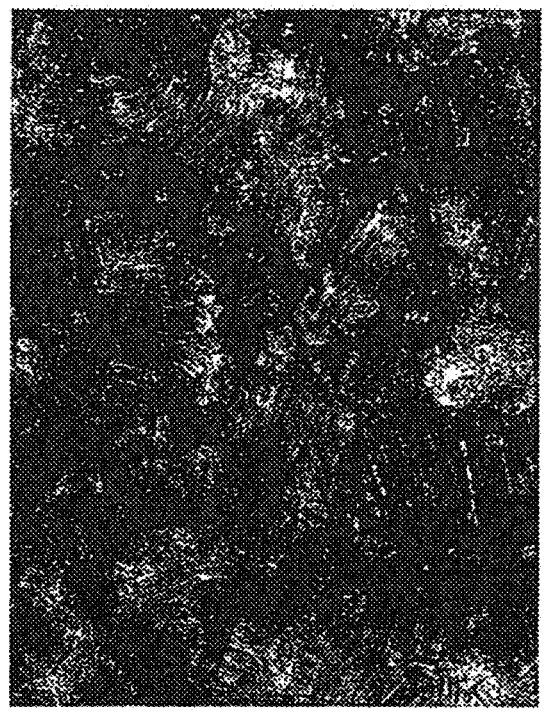
FIG. 25 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 13.
Figure 25:

This substance was subjected to the screening method described in this specification, so as to observe the texture thereof. The thus obtained observation results are shown in FIG. 25.

Example 10

Comp. No. 14 was synthesized by the following method.

In an argon atmosphere, 2-iodo[1][benzothieno[3,2-b][1]benzothiophene (160 mg, 0.44 mmol), 5-octylbenzothiophene (110 mg, 0.44 mol), cesium carbonate (140 mg, 0.44 mmol), triphenylphosphine (12 mg, 0.04 mmol), copper iodide (84 mg, 044 mmol) and palladium acetate (5 mg, 0.02 mmol) were dissolved in dimethylformamide (5 ml), and the solution was heated at 150° C. for 48 hours. After filtrating out insoluble matters in the reaction solution, water was added to the filtrate, and resulting solution was extracted with chloroform, washed with water and dried over magnesium sulfate. After concentrating under reduced pressure, the residue was purified by column chromatography to obtain 15 mg (yield: 7%) of the compound of Comp. No. 14.

$^1$H-NMR (300 MHz, CDCl$_3$, δ): 8.11 (d, J=1.5 Hz, 1H), 7.96 (d, J=8.1 Hz, 1H), 7.95-7.89 (m, 2H), 7.72-7.69 (m, 1H), 7.69 (s, 1H), 7.48 (d, J=6.0 Hz, 1H), 7.51-7.39 (m, 4H), 2.73 (t, J=7.8 Hz, 2H), 1.77-1.60 (m, 2H), 1.42-1.20 (m, 10H), 0.88 (t, J=6.6 Hz, 3H).

Example 11

As for Comp. No. 15, 45 mg (yield: 42%) of the compound of Comp. No. 15 was obtained from 2-iodo[1][benzothieno[3,2-b][1]benzothiophene (110 mg, 0.30 mmol) and 2-(4-propylphenyl)-4,4,5,5-tetramethyl-1,3,2-dioxaborane (88 mg, 0.36 mol) by the same method as in Example 1.

$^1$H-NMR (300 MHz, CDCl$_3$, δ): 8.11 (d, J=0.9 Hz, 1H), 7.94 (dd, J=0.9 Hz, J=6.3 Hz, 2H), 7.89 (d, J=5.7 Hz, 1H), 7.69 (dd, J=0.9 Hz, J=6.3 Hz, 1H), 7.61 (d, J=6.0 Hz, 2H), 7.49-7.39 (m, 2H), 7.30 (d, J=6.0 Hz, 2H), 2.66 (t, J=5.4 Hz, 2H), 1.75-1.66 (m, 2H), 0.99 (t, J=5.4 Hz, 3H).

Figure 26:
FIG. 26 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 15
Figure 26:

This substance was subjected to the screening method described in this specification, so as to observe the texture thereof. The thus obtained observation results are shown in FIG. 26.

Example 12

As for Comp. No. 16, 40 mg (yield: 36%) of the compound of Comp. No. 16 was obtained from 2-iodo[1][benzothieno[3,2-b][1]benzothiophene (110 mg, 0.30 mmol) and 2-(4-butylphenyl)-4,4,5,5-tetramethyl-1,3,2-dioxaborane (64 mg, 0.36 mol) by the same method as in Example 1.

$^1$H-NMR (300 MHz, CDCl$_3$, δ): 8.11 (d, J=0.9 Hz, 1H), 7.94 (dd, J=0.9 Hz, J=6.0 Hz, 2H), 7.89 (d, J=6.0 Hz, 1H), 7.69 (dd, J=0.9 Hz, J=6.3 Hz, 1H), 7.60 (d, J=6.3 Hz, 2H), 7.48-7.38 (m, 2H), 7.30 (d, J=6.3 Hz, 2H), 2.68 (t, J=6.0 Hz, 2H), 1.68-1.64 (m, 2H), 1.44-1.38 (m, 2H), 0.96 (t, J=5.4 Hz, 3H).

Example 13

As for Comp. No. 17, 90 mg (yield: 78%) of the compound of Comp. No. 17 was obtained from 2-iodo[1][benzothieno[3,2-b][1]benzothiophene (110 mg, 0.30 mmol) and 2-(4-pentylphenyl)-4,4,5,5-tetramethyl-1,3,2-dioxaborane (100 mg, 0.36 mol) by the same method as in Example 1.

$^1$H-NMR (300 MHz, CDCl$_3$, δ): 8.11 (d, J=0.9 Hz, 1H), 7.93 (dd, J=0.9 Hz, J=6.0 Hz, 2H), 7.89 (d, J=6.0 Hz, 1H), 7.69 (dd, J=0.9 Hz, J=6.3 Hz, 1H), 7.60 (d, J=6.3 Hz, 2H), 7.47-7.41 (m, 2H), 7.30 (d, J=6.3 Hz, 2H), 2.67 (t, J=6.0 Hz, 2H), 1.70-1.60 (m, 2H), 1.37-1.32 (m, 4H), 0.92 (t, J=5.0 Hz, 3H).

Example 14

As for Comp. No. 18, 50 mg (yield: 42%) of the compound of Comp. No. 18 was obtained from 2-iodo[1][benzothieno[3,2-b][1]benzothiophene (110 mg, 0.30 mmol) and 2-(4-hexylphenyl)-4,4,5,5-tetramethyl-1,3,2-dioxaborane (100 mg, 0.36 mol) by the same method as in Example 1.

$^1$H-NMR (300 MHz, CDCl$_3$, δ): 8.11 (d, J=1.2 Hz, 1H), 7.93 (dd, J=1.2 Hz, J=6.0 Hz, 2H), 7.89 (d, J=6.0 Hz, 1H), 7.69 (dd, J=1.2 Hz, J=6.3 Hz, 1H), 7.61 (d, J=6.3 Hz, 2H), 7.49-7.39 (m, 2H), 7.30 (d, J=6.3 Hz, 2H), 2.67 (t, J=6.0 Hz, 2H), 1.69-1.60 (m, 2H), 1.35-1.29 (m, 6H), 0.90 (t, J=5.0 Hz, 3H).

Example 15

As for Comp. No. 19, 40 mg (yield: 32%) of the compound of Comp. No. 19 was obtained from 2-iodo[1][benzothieno[3,2-b][1]benzothiophene (110 mg, 0.30 mmol) and 2-(4-heptylphenyl)-4,4,5,5-tetramethyl-1,3,2-dioxaborane (110 mg, 0.36 mol) by the same method as in Example 1.

$^1$H-NMR (300 MHz, CDCl$_3$, δ): 8.11 (d, J=0.9 Hz, 1H), 7.92 (dd, J=0.9 Hz, J=6.0 Hz, 2H), 7.89 (d, J=5.4 Hz, 1H), 7.69 (dd, J=0.9 Hz, J=6.0 Hz, 1H), 7.60 (d, J=6.3 Hz, 2H), 7.49-7.39 (m, 2H), 7.30 (d, J=6.3 Hz, 2H), 2.67 (t, J=5.7 Hz, 2H), 1.70-1.68 (m, 2H),
1.35-1.25 (m, 8H), 0.89 (t, J=5.0 Hz, 3H).

Figure 27:
FIG. 27 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 19.
Figure 27:

This substance was subjected to the screening method described in this specification, so as to observe the texture thereof. The thus obtained observation results are shown in FIG. 27.

Example 16

As for Comp. No. 20, 100 mg (yield: 78%) of the compound of Comp. No. 20 was obtained from 2-iodo[1][benzothieno[3,2-b][1]benzothiophene (110 mg, 0.30 mmol) and 2-(4-octyl phenyl)-4,4,5,5-tetramethyl-1,3,2-dioxaborane (84 mg, 0.36 mmol) by the same method as in Example 1.

$^1$H-NMR (300 MHz, CDCl$_3$, δ): 8.11 (d, J=1.2 Hz, 1H), 7.93 (dd, J=1.2 Hz, J=6.0 Hz, 2H),
7.89 (d, J=6.0 Hz, 1H), 7.69 (dd, J=1.2 Hz, J=6.3 Hz, 1H), 7.60 (d, J=6.3 Hz, 2H),
7.47-7.39 (m, 2H), 7.30 (d, J=6.3 Hz, 2H), 2.67 (t, J=6.3 Hz, 2H), 1.69-1.65 (m, 2H),
1.35-1.29 (m, 10H), 0.90 (t, J=5.1 Hz, 3H).

Figure 28:
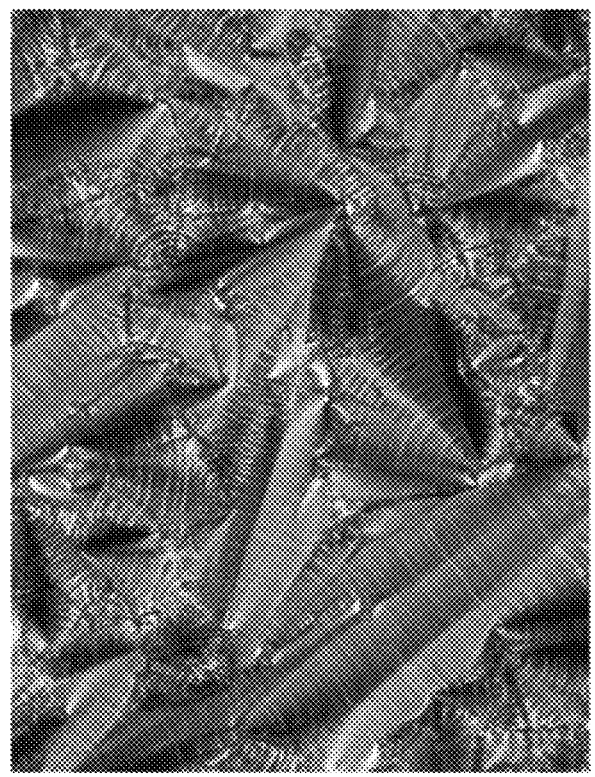
FIG. 28 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 20.
Figure 28:

This substance was subjected to the screening method described in this specification, so as to observe the texture thereof. The thus obtained observation results are shown in FIG. 28.

Example 17

As for Comp. No. 21, 120 mg (yield: 66%) of the compound of Comp. No. 21 was obtained from 2-iodo[1][benzothieno[3,2-b][1]benzothiophene (160 mg, 0.43 mmol) and 2-(4-nonylphenyl)-4,4,5,5-tetramethyl-1,3,2-dioxaborane (170 mg, 0.52 mol) by the same method as in Example 1.

$^1$H-NMR (300 MHz, CDCl$_3$, δ): 8.11 (d, J=0.6 Hz, 1H), 7.92 (dd, J=0.6 Hz, J=6.3 Hz, 2H),
7.90 (d, J=5.4 Hz, 1H), 7.69 (dd, J=0.9 Hz, J=6.0 Hz, 1H), 7.60 (d, J=6.0 Hz, 2H),
7.49-7.39 (m, 2H), 7.29 (d, J=6.0 Hz, 2H), 2.67 (t, J=6.0 Hz, 2H), 1.71-1.63 (m, 2H),
1.35-1.28 (m, 12H), 0.87 (t, J=5.4 Hz, 3H).

Figure 29:
FIG. 29 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 21.
Figure 29:

This substance was subjected to the screening method described in this specification, so as to observe the texture thereof. The thus obtained observation results are shown in FIG. 29.

Example 18

As for Comp. No. 22, 130 mg (yield: 66%) of the compound of Comp. No. 22 was obtained from 2-iodo[1][benzothieno[3,2-b][1]benzothiophene (160 mg, 0.43 mmol) and 2-(4-decanylphenyl)-4,4,5,5-tetramethyl-1,3,2-dioxaborane (180 mg, 0.52 mol) by the same method as in Example 1.

$^1$H-NMR (300 MHz, CDCl$_3$, δ): 8.11 (d, J=0.9 Hz, 1H), 7.92 (d, J=6.3 Hz, 2H),
7.89 (d, J=6.0 Hz, 1H), 7.69 (dd, J=1.2 Hz, J=6.3 Hz, 1H), 7.61 (d, J=6.0 Hz, 2H),
7.47-7.41 (m, 2H), 7.29 (d, J=6.0 Hz, 2H), 2.67 (t, J=6.0 Hz, 2H), 1.69-1.65 (m, 2H),
1.35-1.27 (m, 14H), 0.86 (t, J=4.8 Hz, 3H).

Figure 30:
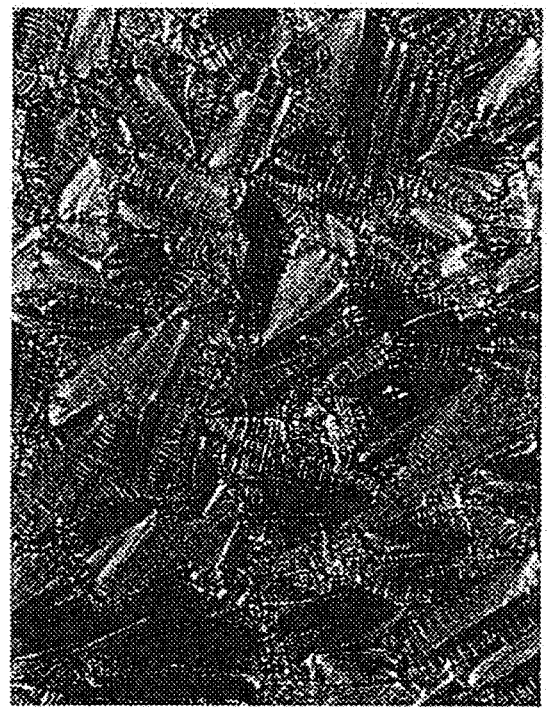
FIG. 30 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 22.
Figure 30:
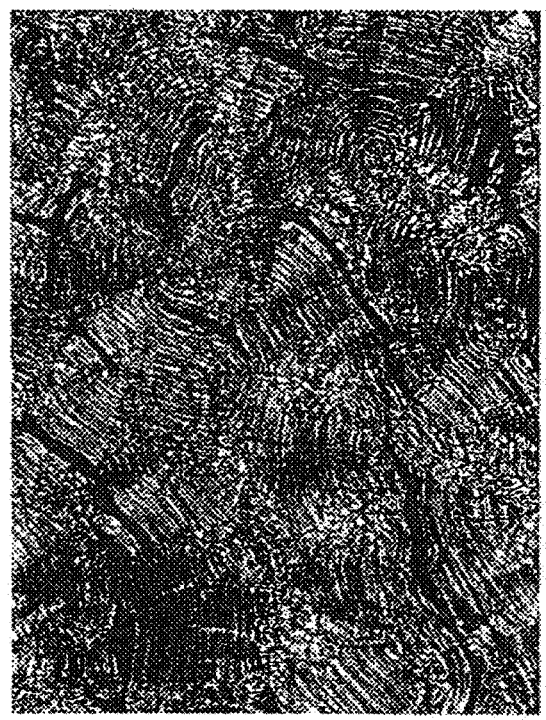

This substance was subjected to the screening method described in this specification, so as to observe the texture thereof. The thus obtained observation results are shown in FIG. 30.

Example 19

As for Comp. No. 23, 120 mg (yield: 58%) of the compound of Comp. No. 23 was obtained from 2-iodo[1][benzothieno[3,2-b][1]benzothiophene (160 mg, 0.43 mmol) and 2-(4-dodecanylphenyl)-4,4,5,5-tetramethyl-1,3,2-dioxaborane (250 mg, 0.52 mol) by the same method as in Example 1.

$^1$H-NMR (300 MHz, CDCl$_3$, δ): 8.11 (d, J=0.9 Hz, 1H), 7.93 (dd, J=0.9 Hz, J=6.0 Hz, 2H),
7.89 (d, J=6.0 Hz, 1H), 7.69 (dd, J=1.2 Hz, J=6.3 Hz, 1H), 7.60 (d, J=6.0 Hz, 2H),
7.49-7.39 (m, 2H), 7.29 (d, J=6.3 Hz, 2H), 2.66 (t, J=6.0 Hz, 2H), 1.70-1.63 (m, 2H),
1.35-1.27 (m, 18H), 0.88 (t, J=4.8 Hz, 3H).

Figure 31:
FIG. 31 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 23.
Figure 31:
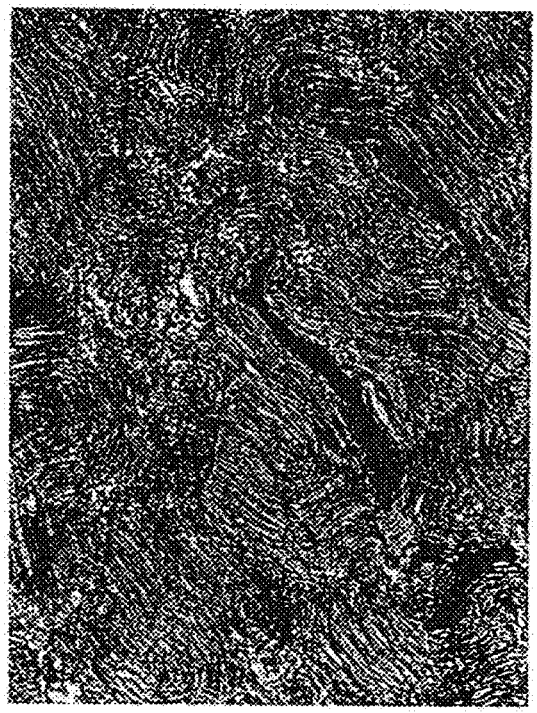

This substance was subjected to the screening method described in this specification, so as to observe the texture thereof. The thus obtained observation results are shown in FIG. 31.

Example 20

Comp. No. 24 was synthesized from [1]benzothieno[3,2-b][1]benzothiophene (simply referred to as BTBT) by the method described below according to the scheme shown in (Chem. 15). Incidentally, in the following scheme, Compound Nos. (4-1) to (4-5) mean (24-1) to (24-5), respectively, and Compound No. (4) means (24).

[Chemical Formula 15]

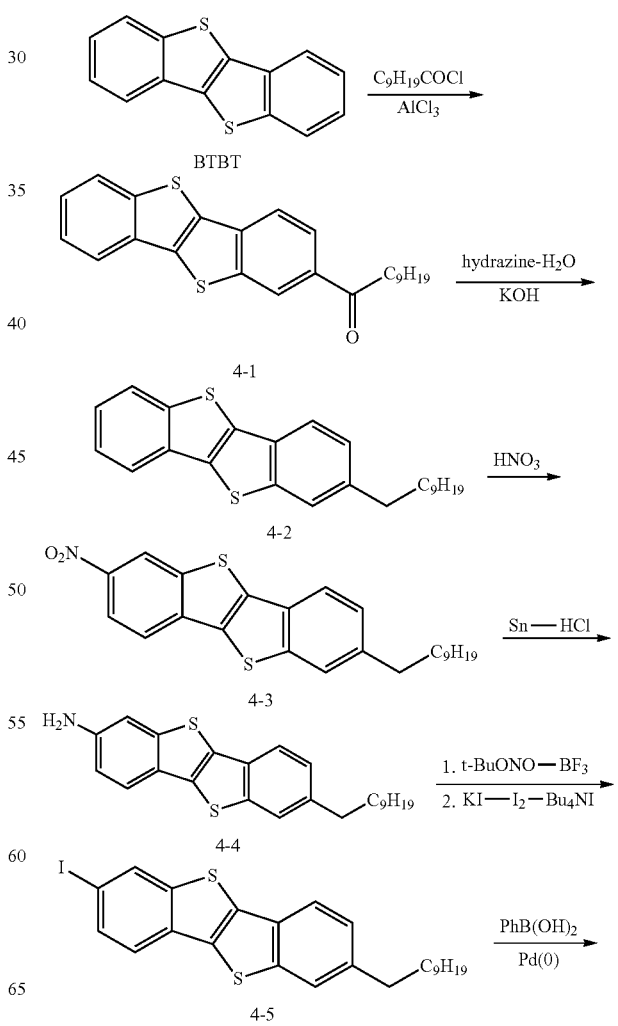

-continued

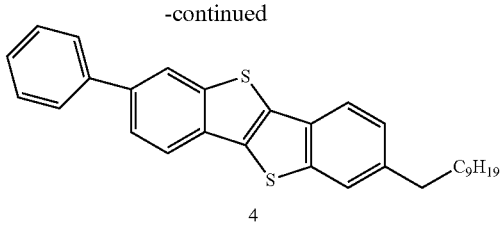

4

Comp. No. 24-2 (2-decylBTBT) was synthesized from BTBT in two steps (Friedel-Crafts acylation, Wolff-Kishner reduction) according to literatures (Liquid Crystals, 2004, 31, 1367-1380 and Collect. Czech. Chem. Commun., 2002, 67, 645-664).

Synthesis of Comp. No. 24-3
(2-decyl-7-nitroBTBT)

A dichloromethane (160 mL) solution of Comp. No. 24-2 (2.48 g, 6.52 mmol) was cooled to −50° C. (precipitate solids), and a 1.2M dichloromethane solution (12 mL) of fuming nitric acid was added dropwise over 30 minutes. After further stirring at −50° C. for 2 hours, an aqueous saturated sodium hydrogencarbonate solution (up to 13 mL) was added to stop the reaction. The lower layer was separated, washed with a 10% saline solution, dried over anhydrous magnesium sulfate and concentrated to dryness to obtain a crude solid (2.75 g). This solid was recrystallized from 2-butanone (up to 40 mL) to obtain 1.86 g (yield, 67%) of a yellow crystal of Comp. No. 24–3.

H-nmr (270 MHz, CDCl3): δ8.83 (d, 1H, J 2.2 Hz, H-6), 8.31 (dd, 1H, J 8.8, 2.2 Hz, H-8), 7.92 (d, 1H, J 8.8 Hz, H-9), 7.84 (d, 1H, J 8.2 Hz, H-4), 7.75 (d, 1H, J 1.4 Hz, H-1), 7.33 (dd, 1H, J 8.2, 1.4 Hz, H-3), 2.78 (t, 2H, J up to 7.5 Hz, ArCH2), 1.71 (quint. 2H, J up to 7.5 Hz, ArCH2CH2), up to 1.2, up to 1.4 (m, 14H, CH2×7), 0.88 (t, 3H, J up to 7 Hz, CH3).

Synthesis of Comp. No. 24-4
(7-decylBTBT-2-amine)

Comp. No. 24-3 (1.28 g, 30 mmol) and tin (0.92 g) were suspended in acetic acid (15 mL), and concentrated hydrochloric acid (2.7 mL) was slowly added dropwise at about 70° C. under heating and stirring. The reaction was allowed to further proceed at 100° C. for one hour and after cooling to 10° C. or less, a solid was collected by filtration. This solid was immersed in chloroform (up to 100 mL), washed in sequence with concentrated aqueous ammonia and with a saturated saline solution, dried over anhydrous magnesium sulfate and then concentrated to dryness to obtain a crude solid (1.1 g). This solid was purified by separation on a silica gel column (chloroform-cyclohexane of 1:1, 1% triethylamine was added) and crystallized from petroleum benzine to obtain 0.86 g (yield, 72%) of Comp. No. 24-4 as a faintly grey compound.

H-nmr (270 MHz, CDCl3): δ 7.68 (d, 1H, J 8.2 Hz, H−9), 7.67 (broadened s, 1H, H-6),
7.62 (d, 1H, J 8.4 Hz, H-4), 7.23 (dd, 1H, J 1.5, 8.2 Hz, H-8), 7.16 (d, 1H, J up to 2 Hz, H-1), 6.81 (dd, 1H, J up to 2, 8.4 Hz, H-3), 3.84 (slightly broadened s, up to 2H, NH2), 2.73 (t, 2H, J up to 7.5 Hz, ArCH2), 1.68 (quint. 2H, J up to 7.5 Hz, ArCH2CH2), up to 1.2, up to 1.4 (m, 14H, CH2×7), 0.87 (t, 3H, J up to 7 Hz, CH3).

Synthesis of Comp. No. 24-5
(2-decyl-7-iodoBTBT)

To a dichloromethane (15 mL) solution of Comp. No. 24-4 (396 mg, 1 mmol), BF3-Et2O (216 mg) and tert-butyl nitrite (126 mg) were added dropwise under cooling at −15° C. The reaction temperature was raised to 5° C. in about 1 hour, and a dichloromethane-THF mixed solution (1:2, 3 mL) of iodine (400 mg), potassium iodide (330 mg) and tetrabutylammonium iodide (25 mg) was added. The reaction was allowed to further proceed for 8 hours under heating and refluxing, and the reaction solution was diluted with chloroform, washed in sequence with 10% sodium thiosulfate, with 5M sodium hydroxide and with a 10% saline solution, dried over anhydrous sodium sulfate and concentrated to dryness. The obtained dark brown crude solid (500 mg) was purified by silica gel column (chloroform-hexane, 1:1), recrystallized from chloroform-methanol and further recrystallized from ligroin to obtain 228 mg (yield, 45%) of the compound of Comp. No. 24-5.

H-nmr (500 MHz, CDCl3): δ 8.23 (d, 1H, J 1.4 Hz, H−6), 7.77 (d, 1H, J 8.2 Hz, H-4), 7.72 (dd, 1H, J 1.4, 8.2 Hz, H-8), 7.71 (d, 1H, J 1.4 Hz, H-1), 7.59 (d, 1H, J 8.2 Hz, H-9), 7.29 (dd, 1H, J 1.4, 8.2 Hz, H-3), 2.76 (t, 2H, J 7.8 Hz, ArCH2), 1.69 (quint., 2H, J up to 7.5 Hz, ArCH2CH2), up to 1.2, up to 1.4 (m, 14H, CH2×7), 0.88 (t, 3H, J up to 7 Hz, CH3).

Synthesis of Comp. No. 24
(2-decyl-7-phenylBTBT)

To a dioxane (8 mL) solution of Comp. No. 24-5 (228 mg, 0.45 mmol), 2M tripotassium phosphate (0.45 mL) and phenylboronic acid (Tokyo Chemical Industry Co., Ltd., 110 mg, 0.9 mmol) were added. After bubbling an argon gas for 20 minutes, tetrakis(triphenylphosphine)palladium (Tokyo Chemical Industry Co., Ltd., 30 mg, 0.025 mmol) and tricyclohexylphosphine (Wako Pure Chemical Industries, Ltd., 13 mg, 0.045 mmol) were added, and the system was heated with stirring at 95° C. for 22 hours. The reaction solution was diluted with chloroform and washed with a 10% saline solution, and the lower layer was concentrated to dryness to obtain a crude solid (293 mg). This solid was recrystallized from toluene to obtain 130 mg (yield, 63%) of the compound of Comp. No. 24.

H-nmr (500 MHz, CDCl3): δ 8.12 (d, 1H, J 1.8 Hz, H−6), 7.92 (d, 1H, J 8.2 Hz, H-9), 7.79 (d, 1H, J 7.8 Hz, H-4), 7.73 (br. s, 1H, H-1), 7.69 (d×2, 3H, H-8, 2', 6' (' denote Ph)), 7.49 (t, 2H, J up to 8 Hz, H-3', 5'), 7.38 (tt, 1H, J>1, up to 8 Hz, H-4'), 7.29 (dd, 1H, J>1, 7.8 Hz, H-3), 2.77 (t, 2H, J up to 7 Hz, ArCH2), 1.70 (quint. 2H, J up to 7 Hz, ArCH2CH2), up to 1.2, up to 1.4 (m, 14H, CH2×7), 0.88 (t, 3H, J up to 7 Hz, CH3).

Figure 32:
FIG. 32 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 24.
Figure 32:
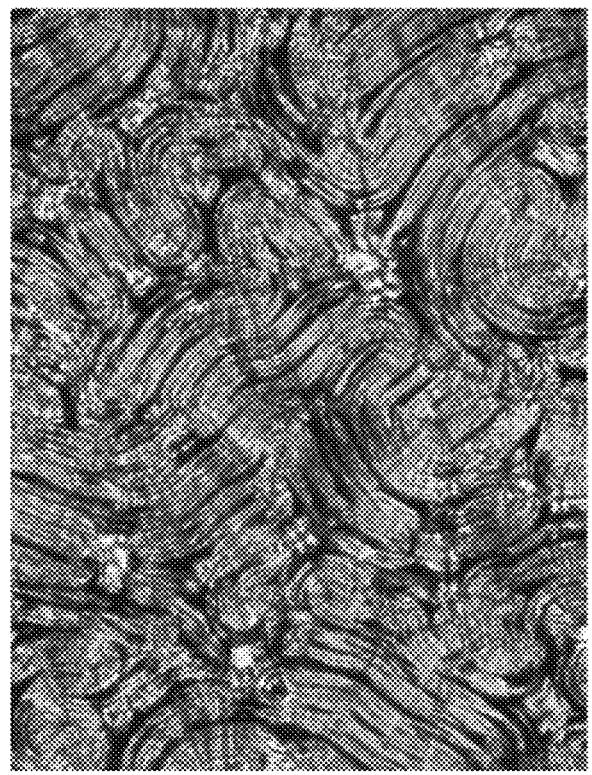

This substance was subjected to the screening method described in this specification, so as to observe the texture thereof. The thus obtained observation results are shown in FIG. 32.

Example 21

As for Comp. No. 25, 13 mg (yield: 8%) of the compound of Comp. No. 25 was obtained from 2-iodo[1]benzothieno[3,2-b][1]benzothiophene (130 mg, 0.35 mmol) and 2-(2-octyl-6-naphthyl)-4,4,5,5-tetramethyl-1,3,2-dioxaborane (140 mg, 0.39 mol) by the same method as in Example 1.

$^1$H-NMR (300 MHz, CDCl$_3$, δ): 8.26 (s, 1H), 8.09 (m, 1H), 8.00-7.79 (m, 6H), 7.68 (dd, J=1.2 Hz, J=8.4 Hz, 1H), 7.49-7.35 (m, 4H), 2.80 (t, J=7.5 Hz, 2H), 1.76-1.71 (m, 2H),
1.39-1.28 (m, 10H), 0.88 (t, J=6.9 Hz, 3H).

Example 22

As for Comp. No. 26, 25 mg (yield: 12%) of the compound of Comp. No. 26 was obtained from 2-iodo[1][benzothieno[3,2-b][1]benzothiophene (150 mg, 0.41 mmol) and 2-(4-octylbiphenyl)-4,4,5,5-tetramethyl-1,3,2-dioxaborane (190 mg, 0.49 mol) by the same method as in Example 1.
$^1$H-NMR (300 MHz, CDCl$_3$, δ): 8.19 (s, 1H), 7.95 (dd, J=1.2 Hz, J=8.1 Hz, 1H),
7.99-7.90 (m, 3H), 7.80-7.69 (m, 6H), 7.60 (d, J=7.8 Hz, 2H), 7.50-7.33 (m, 2H), 2.67 (t, J=7.5 Hz, 2H), 1.90-1.85 (m, 2H), 1.41-1.30 (m, 10H), 0.88 (t, J=6.6 Hz, 3H).

Example 23

Figure 33:
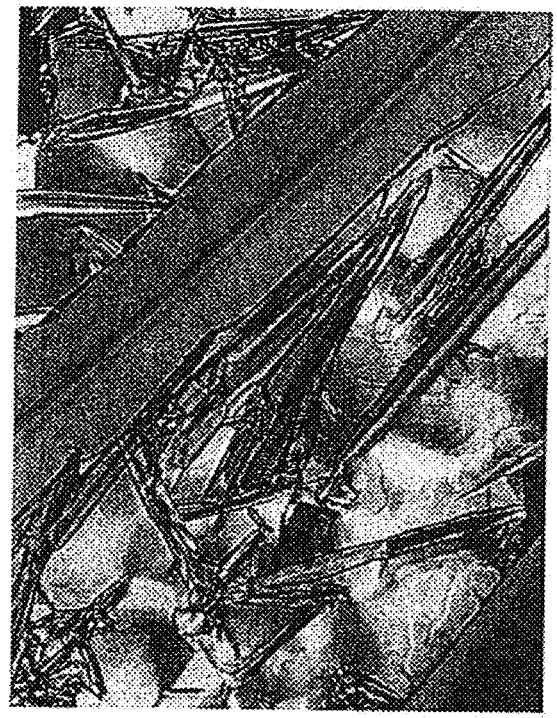
FIG. 33 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 27.
Figure 33:

Comp. No. 27 was synthesized by the following method.
Naphto[2,3-b]thiophene (0.50 g, 2.7 mmol) was dissolved in THF (20 ml), and the solution was cooled to 0° C. Subsequently, π-butyllithium (a 1.6M hexane solution, 1.7 ml (2.8 mmol)) was added dropwise, and the reaction solution was stirred at 0° C. for 1 hour. Further, a THF (2 ml) solution of tributyltin chloride (0.91 g, 2.8 mmol) was added dropwise. The reaction solution was returned to room temperature and stirred for 3 hours. Diethyl ether (65 ml) was added to the reaction solution and after stirring for a while, insoluble matters were filtered out. The filtrate was concentrated under reduced pressure to obtain a brown oily matter. The oily matter was dissolved in toluene (30 ml), and 2-bromo-5-octylthiophene (0.55 g, 2.0 mmol) and tetrakis(triphenylphosphine)palladium (97 mg, 0.08 mmol) were added. In an argon atmosphere, the system was heated with stirring at 95° C. for 17 hours, and the reaction solution was filtered to obtain a yellow precipitate. The precipitate was washed with toluene, then dried and recrystallized from hexane to obtain 0.39 g (yield: 52%) of the compound of Comp. No. 27.
$^1$H-NMR (300 MHz, CDCl$_3$): 8.23 (s, 1H) 8.17 (s, 1H), 7.94-7.85 (m, 2H),
7.47-7.39 (m, 2H), 7.38 (s, 1H), 7.16 (d, J=3.6 Hz, 1H), 6.75 (d, J=3.6 Hz, 1H),
2.83 (t, J=7.8 Hz, 2H), 1.76-1.62 (m, 2H), 1.45-1.24 (m, 10H), 0.91 (t, J=6.6 Hz, 3H).
This substance was subjected to the screening method described in this specification, so as to observe the texture thereof. The thus obtained observation results are shown in FIG. 33.

Example 24

Comp. No. 28 was synthesized by the following method.
To an anhydrous THF 40 ml solution of 2-bromoanthracene (0.5138 g, 0.002 mol) and 4-dodecylbenzeneboronic acid (0.5976 g, 0.002 mol), cesium fluoride (0.607 g, 0.004 mol) and tetrakis(triphenylphosphine)palladium (34.7 mg, 1.5 mol %) were added. After refluxing for 48 hours, the reaction solution was cooled to room temperature, then filtered and thoroughly washed with methanol to obtain 0.480 g of a crude crystal. Further, purification by silica gel column chromatography (eluent: cyclohexane) and recrystallization from n-hexane were performed to obtain 0.390 g (yield: 46%) of a pale yellow crystal of Comp. No. 28.

Figure 34:
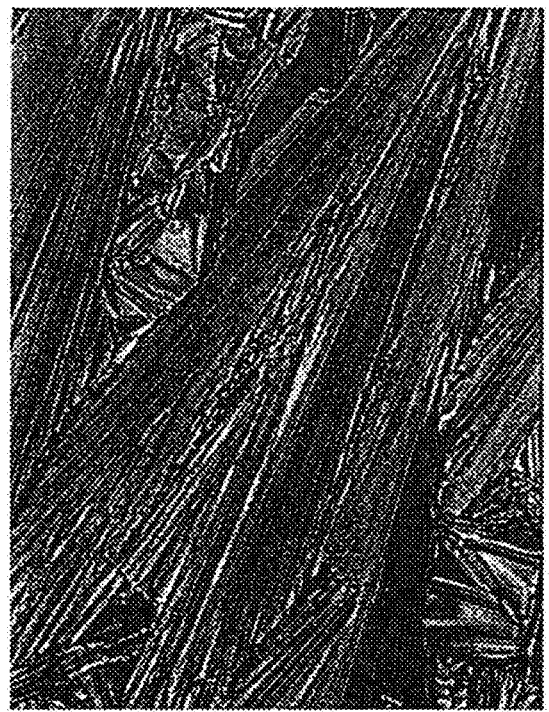
FIG. 34 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 28.
Figure 34:
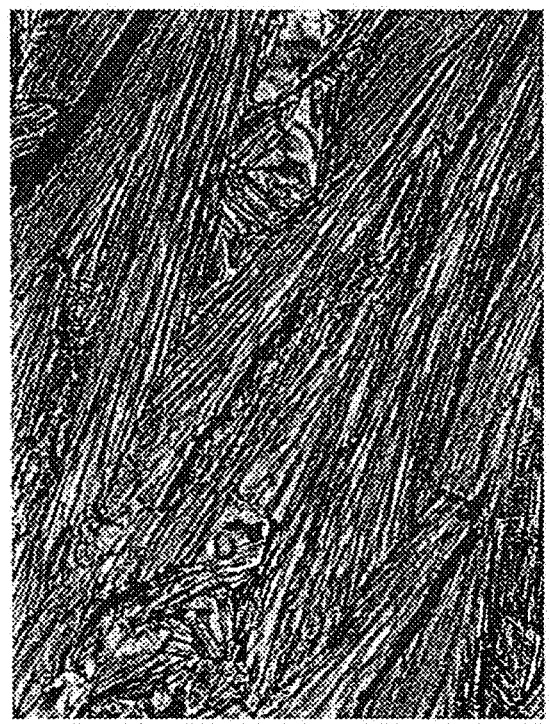

H-nmr (500 MHz, CDCl3): δ8.46 (s, 1H), 8.43 (s, 1H), 8.16 (s, 1H), 8.07 (d, 1H), 8.0 (m, 2H),
7.76 (dd, 1H), 7.70 (d, 2H), 7.46 (m, 2H), 7.32 (d, 2H), 2.68 (t, 2H), 1.68 (t, 2H), 1.54 (s, 2H), 1.38-1.24 (m, 18H), 0.88 (t, 3H).
This substance was subjected to the screening method described in this specification, so as to observe the texture thereof. The thus obtained observation results are shown in FIG. 34.

Example 25

Comp. No. 29 was synthesized by the following method.

Synthesis of Comp. No. 29
(2-(5-hexyl-2-thienyl)anthracene)

Figure 35:
FIG. 35 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 29.
Figure 35:
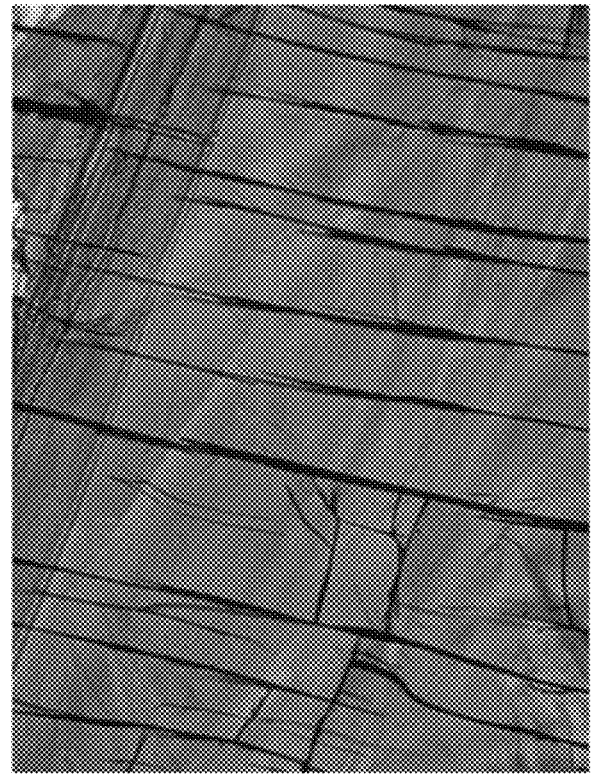

To a toluene solution of 2-bromoanthracene (0.5138 g, 0.002 mol) and tributyl-(5-hexyl-2-thienyl)-stannane (0.670 g, 0.002 mol), tetrakis(triphenylphosphine)palladium (67.0 mg) was added. After refluxing for 24 hours, the reaction solution was cooled to room temperature, poured in water (50 ml), extracted with dichloromethane several times, washed with 6M HCl and water, and dried over magnesium sulfate, and the solvent was removed by pressure reduction. After silica gel chromatography (eluent: cyclohexane), recrystallization from n-hexane was performed to obtain 0.310 g (yield, 50%) of a pale yellow crystal of Comp. No. 29.
This substance was subjected to the screening method described in this specification, so as to observe the texture thereof. The thus obtained observation results are shown in FIG. 35.

Example 26

Comp. No. 30 was synthesized by synthesizing anthra[2,3-b]thiophene-5,10 dione, reducing this compound to obtain anthra[2,3-b]thiophene, converting it to 2-tributylstannyl-anthra[2,3-b]thiophene, and performing coupling with 4-dodecyl-bromobenzene.
Thiophene-2,3-dicarboaldehyde (2.8 g, 0.020 mol), 1,4-dihydroxynaphthalene (3.2 g, 0.020 mol) and dry pyridine (20 ml) were refluxed in argon for 6 hours and after cooling to room temperature, about 50 ml of water was added. The precipitated solid was filtered and thoroughly washed with water, ethanol and acetone to obtain 3.28 g (yield: 62%) of a dark brown solid.
Hnmr: (500 MHz, CDCl$_3$): δ8.82 (s, 1H), 8.73 (s, 1H), 8.34-8.31 (m, 2H), 7.79-7.77 (dd, 2H), 7.76-7.74 (d, 1H), 7.56-7.55 (d, 1H).
Anthra[2,3-b]thiophene-5,10 dione (2.64 g, 0.010 mol) was added to dry THF (100 ml) cooled to 0° C., in which lithium aluminum hydride (LiAlH$_4$, 1.52 g, 0.040 mol) was added, and the system was stirred at 0° C. for about one hour. Further, 0.76 g of LiAlH$_4$ was added, and the system was stirred at room temperature for 2 hours. While cooling at 0° C., 100 ml of 6 M-hydrochloric acid was added little by little. The reaction solution was returned to room temperature and held for about 30 minutes, and the precipitated solid was filtered and washed with water, ethanol, ethyl acetate and hexane (crude yield: 1.67 g, 71%). Thereafter, silica gel chromatography (eluent: toluene) was performed to obtain 1.20 g (yield: 49%) of a yellow crystal.
Hnmr: (500 MHz, CDCl$_3$): δ8.59 (s, 1H), 8.53 (s, 1H), 8.51 (s1H), 8.49 (s, 1H), 8.0-7.99 (dd, 2H), 7.48-7.46 (d, 1H), 7.43-7.40 (dd, 2H), 7.40-7.39 (d, 1H).

Anthra[2,3-b]thiophene (0.702 g, 0.003 mol) dissolved in dry THF (10 ml), and the solution was cooled to −78° C. Subsequently, 1.88 ml of π-BuLi (1.6 M/hexane solution) was added, and the system was stirred about two hours. Further, tributylstannyl chloride (9.977 g, 0.003 mole) was added, and the temperature was raised to room temperature. The system was stirred for 2 hours and after adding dichloromethane, the resulting solution was washed with an aqueous saturated ammonium chloride solution, then with water and further with a saturated saline solution, and dried over sodium sulfate. The solvent was removed under reduced pressure, and the residue was subjected to the next reaction.

Tetrakis(triphenylphosphine)palladium (2 mol %) was added to a dry THF solution of 2-tributylstannyl-anthra[2,3-b]thiophene (0.003 mol) and 4-dodecyl-bromobenzene (1.07 g, 0.003 mol) and refluxed for 24 hours. The reaction solution was cooled to room temperature, poured in 50 ml of water and extracted with dichloromethane. The organic phase was washed with 6M hydrochloric acid and water and dried over magnesium sulfate, and the solvent was removed by pressure reduction. The residue was purified by silica gel chromatography (eluent: cyclohexane→cyclohexane/toluene=2/1).

As a result, 0.15 g (yield, 10.5%) of a yellow crystal was obtained.

Figure 36:
FIG. 36 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 30.
Figure 36:
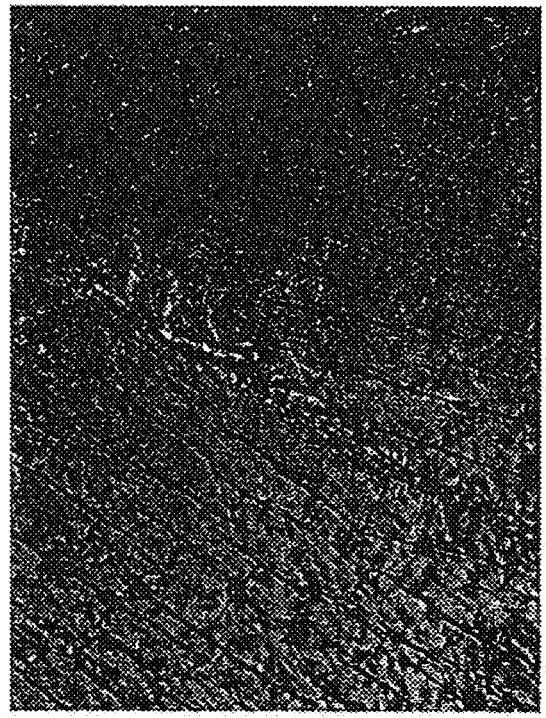
Figure 37:
FIG. 37 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 31.
Figure 37:
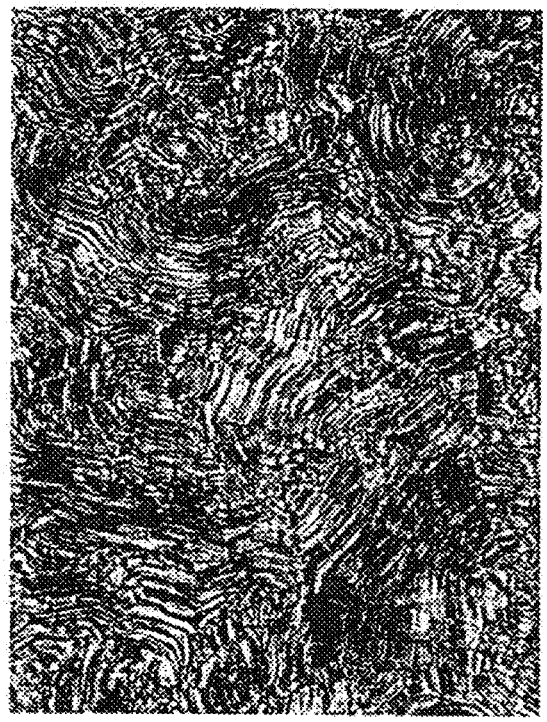
Figure 38:
FIG. 38 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 49.
Figure 38:
Figure 39:
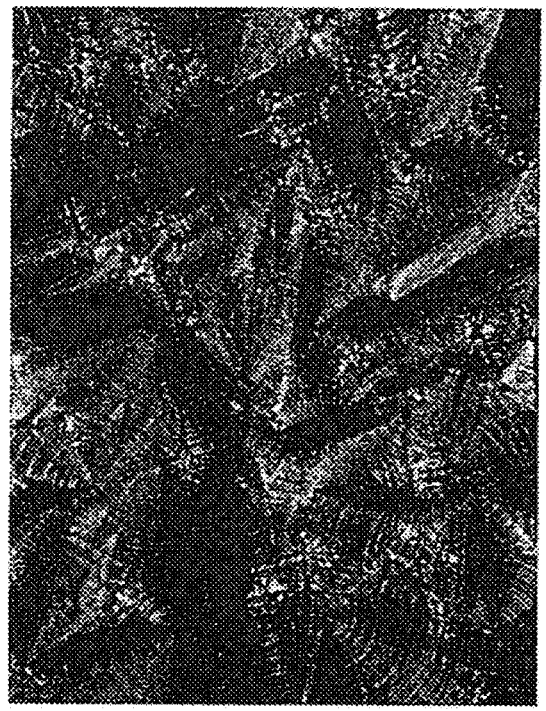
FIG. 39 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 50.
Figure 39:
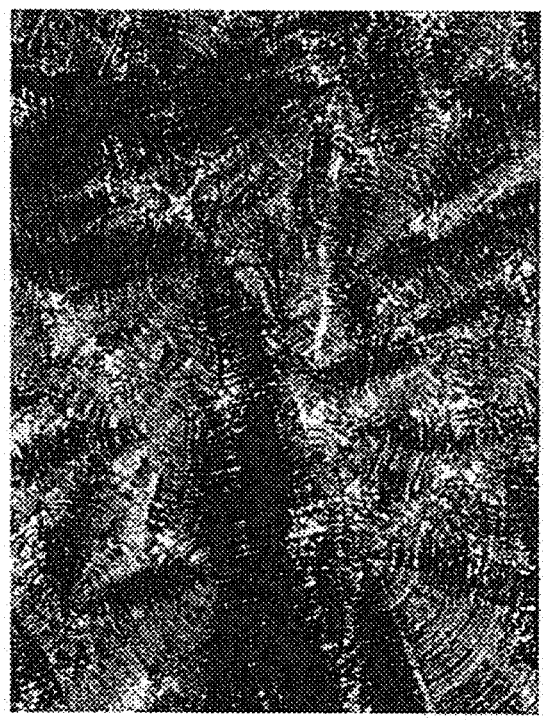
Figure 40:
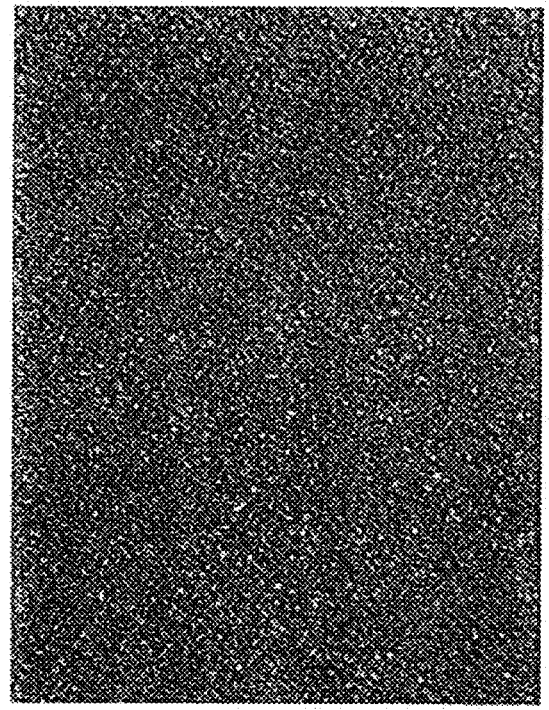
FIG. 40 is (a) an example of the polarized optical microscopic image when slowly cooled and (b) an example of the polarized optical microscopic image when rapidly cooled, from the isotropic phase, with respect to the compound of Comp. No. 51.
Figure 40:
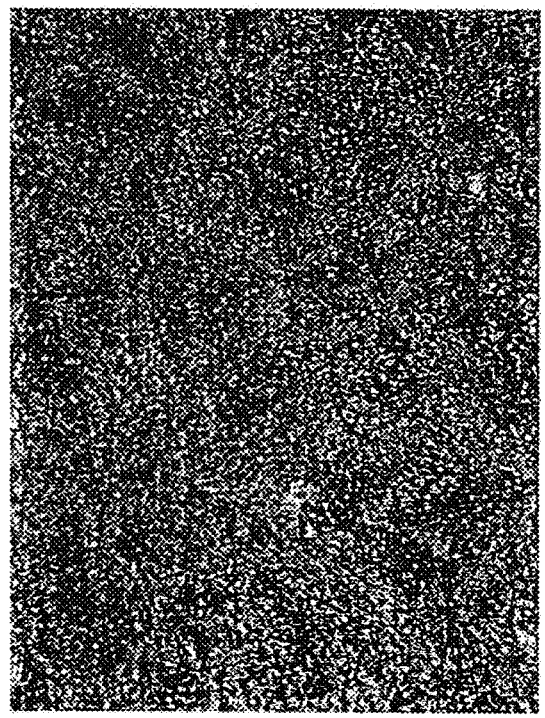
Figure 41:
FIG. 41 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 52.
Figure 41:

This substance was subjected to the screening method described in this specification, so as to observe the texture thereof. The thus obtained observation results are shown in FIG. 36.

(Example 27) to (Example 30)

In these Examples, the compounds of Comp. No. 49 to Comp. No. 52 shown below were synthesized under the same conditions as in Examples above by a Suzuki coupling reaction of 2-decyl-7-iodoBTBT and a corresponding boronic acid (p-methylphenylboronic acid, m-methylphenylboronic acid, o-methylphenylboronic acid and 5-methyl-2-thiopheneboronic acid, respectively; all produced by Wako Pure Chemical Industries, Ltd.).

This substance was subjected to the screening method described in this specification, so as to observe the texture thereof. The thus obtained observation results are shown in FIGS. 38 to 41.

[Chemical Formula 16]
COM49

2-decyl-7-(p-tolyl)benzo[b]benzo[4,5]thieno[2,3-d]thiophene

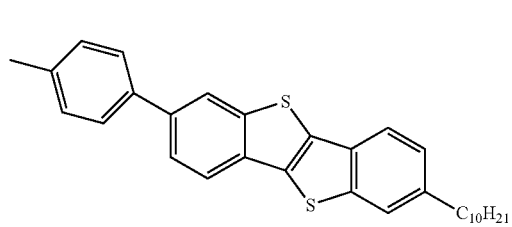

H-nmr (500 MHz, CDCl3): δ 8.10 (d, 1H, J>1 Hz), 7.90 (d, 1H, J 8.2 Hz), 7.79 (d, 1H, J 8.2 Hz), 7.73 (br. s, 1H), 7.67 (dd, 1H, J 1.4, 8.2 Hz), 7.59 (d, 2H, J 7.8 Hz), 7.29 (m, 3H, 2H d and 1H dd overlapped), 2.77 (t, 2H, J 7.8 Hz), 2.42 (s, 3H, Me of p-tol), 1.70 (quint. 2H, J~8 Hz), ~1.2~1.4 (m, 14H), 0.88 (t, 3H, J~7 Hz).
COM50

2-decyl-7-(m-tolyl)benzo[b]benzo[4,5]thieno[2,3-d]thiophene

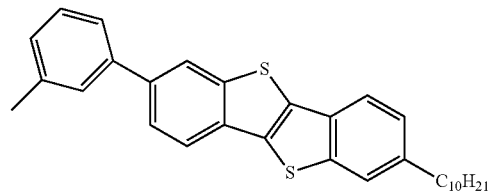

H-nmr (500 MHz, CDCl3): δ 8.11 (d, 1H, J>1 Hz), 7.90 (d, 1H, J 8.2 Hz), 7.79 (d, 1H, J 8.2 Hz), 7.73 (br. s, 1H), 7.68 (dd, 1H, J 1.4, 8.2 Hz), 7.51 (br. s, 1H), 7.49 (br. d, 1H, J~8 Hz), 7.37 (t, 1H, J~8 Hz), 7.29 (dd, 1H, J 1.4, 8.2 Hz), 7.20 (br. d, 1H, J~8 Hz), 2.77 (t, 2H, J 8 Hz), 2.46 (s, 3H, Me of m-tol), 1.70 (quint. 2H, J~8 Hz), ~1.2~1.4 (m, 14H), 0.88 (t, 3H, J~7 Hz).
COM51

2-decyl-7-(o-tolyl)benzo[b]benzo[4,5]thieno[2,3-d]thiophene

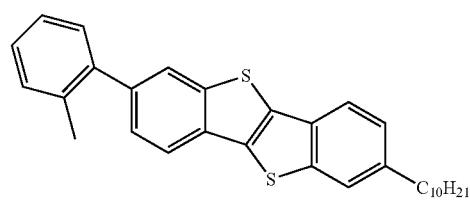

H-nmr (500 MHz, CDCl3): δ 7.89 (d, 1H, J 7.8 Hz), 7.85 (br. s, 1H), 7.80 (d, 1H, J 7.8 Hz), 7.73 (br. s, 1H), 7.42 (dd, 1H, J 1.4, 8.2 Hz), 7.26-7.33 (m, 5H), 2.77 (t, 2H, J 8 Hz), 2.34 (s, 3H, Me of o-tol), 1.70 (quint. 2H, J~8 Hz), ~1.2~1.4 (m, 14H), 0.88 (t, 3H, J~7 Hz).
COM52

2-decyl-7-(5-methylthiophen-2-yl)benzo[b]benzo[4,5]thieno[2,3-d]thiophene

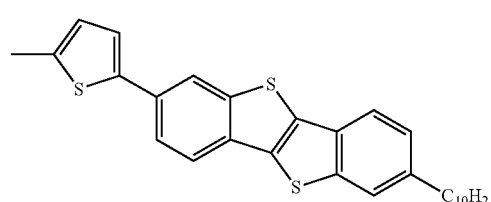

H-nmr (500 MHz, CDCl3): δ 8.05 (d, 1H, J~1 Hz), 7.81 (d, 1H, J 8.2 Hz), 7.77 (d, 1H, J 7.8 Hz), 7.71 (br. s, 1H), 7.64 (dd, 1H, J>1.82 Hz), 7.28 (dd, 1H, J>1.82 Hz), 7.19 (d, 1H, J 3.7 Hz), 6.77 (narrow m, 1H), 2.76 (t, 2H, J 8 Hz), 2.54 (d, 3H, J<1 Hz), 1.67 (quint. 2H, J~8 Hz), ~1.2~1.4 (m, 14H), 0.88 (1, 3H, J~7 Hz).

Example 31

Synthesis of Comp. No. 53: 2-decyl-7-perfluorophenyl BTBT (FP-BTBT-10)

(Introduction of a perfluorophenyl group is known to be difficult under normal conditions of the Suzuki reaction and therefore, the compound was synthesized by the method described in the literature (Organic Letters 7, 4915, 2005)).

Pentafluorophenylboronic acid (Aldrich, 80 mg), Pd2(dba)3 (tris(dibenzylideneacetone)dipalladium, 14 mg), tri-tert-butylphosphine (0.012 mL), Ag2O (83 mg) and CsF (91 mg) were added to a DMF (4 mL) and DME (2 mL) solution of 2-decyl-7-iodoBTBT (152 mg, 0.3 mmol) and after bubbling of an argon gas for 10 minutes, reacted at 100° C. for 20 hours. The solid was removed by filtration, washed with chloroform and concentrated, and the residue was solidified from methanol-water and collected by filtration (100 mg). This solid was adsorbed on silica gel from a chloroform solution, placed on silica gel column, eluted with cyclohexane and thereby purified. The eluting solution was concentrated to dryness (46 mg) and recrystallized from chloroform-isooctane to obtain 32 mg (yield, 20%) of Comp. No. 53.

Figure 42:
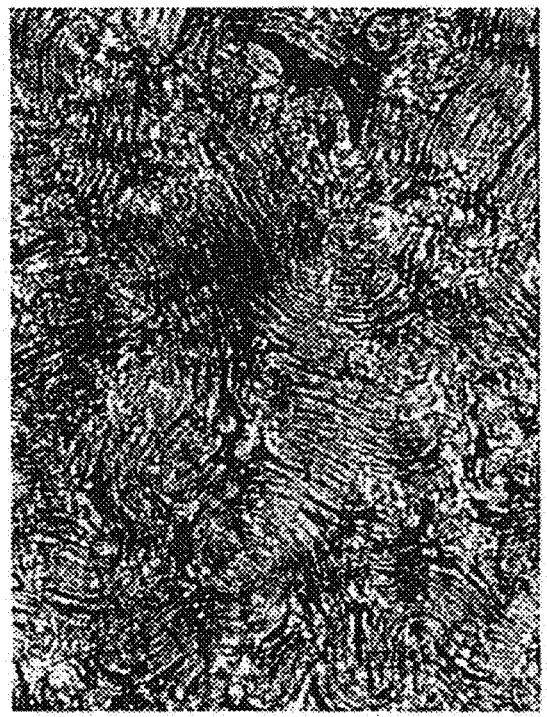
FIG. 42 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 53.
Figure 42:
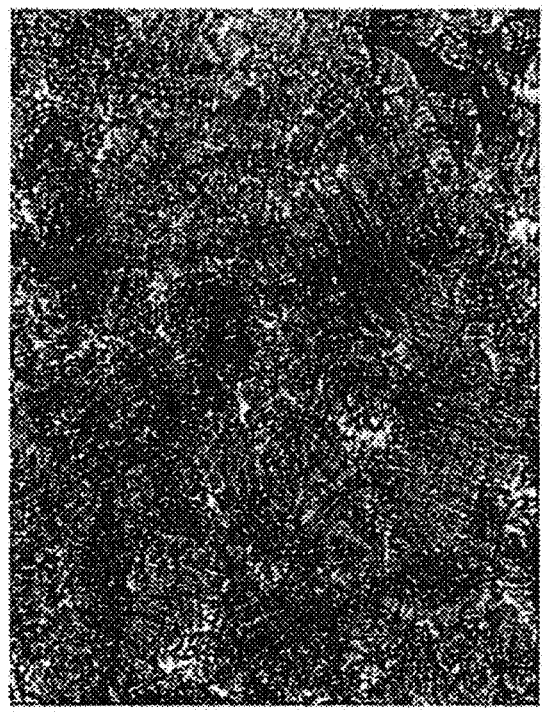

This substance was subjected to the screening method described in this specification, so as to observe the texture thereof. The thus obtained observation results are shown in FIG. 42.

[Chemical Formula 17]
COM53

2-decyl-7-(perfluorophenyl)benzo[b]benzo[4,5]thieno[2,3-d]thiophene

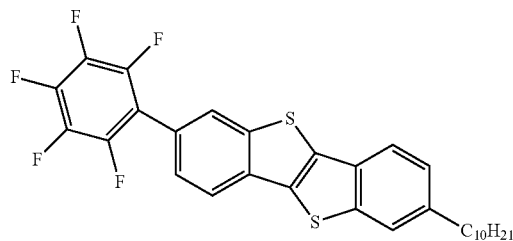

H-nmr (500 MHz, CDCl3): δ 7.973 (br. s, 1H, overlapped with 7.968 d), 7.968 (d, 1H, J~8 Hz), 7.82 (d, 1H, J 8.2 Hz), 7.74 (d, 1H, J~1 Hz), 7.49 (dq, 1H, J~1, ~8, small long range H—F coupling), 7.31 (dd, 1H, J 1.4, 8.2 Hz), 2.77 (t, 2H, J 8 Hz) 1.71 (quint. 2H, J~8 Hz), ~1.2~1.4 (m, 14H), 0.88 (s, 3H, J~7 Hz).

Example 32

Comp. No. 54: 2-cyclohexene-1-yl-7-decylBTBT (Che-BTBT-10)

Comp. No. 55: 2-cyclopenten-1-yl-7-decylBTBT (CPe-BTBT-10)

As shown below, Comp. No. 54 and Comp. No. 55 were synthesized under the same conditions by a Suzuki reaction of 2-decyl-7-iodoBTBT with cyclohexeneboronic acid pinacol ester (A, Aldrich) and cyclopenteneboronic acid pinacol ester (B, synthesized according to J. Org. Chem. 74, 7715, 2009), respectively.

[Chemical Formula 18]

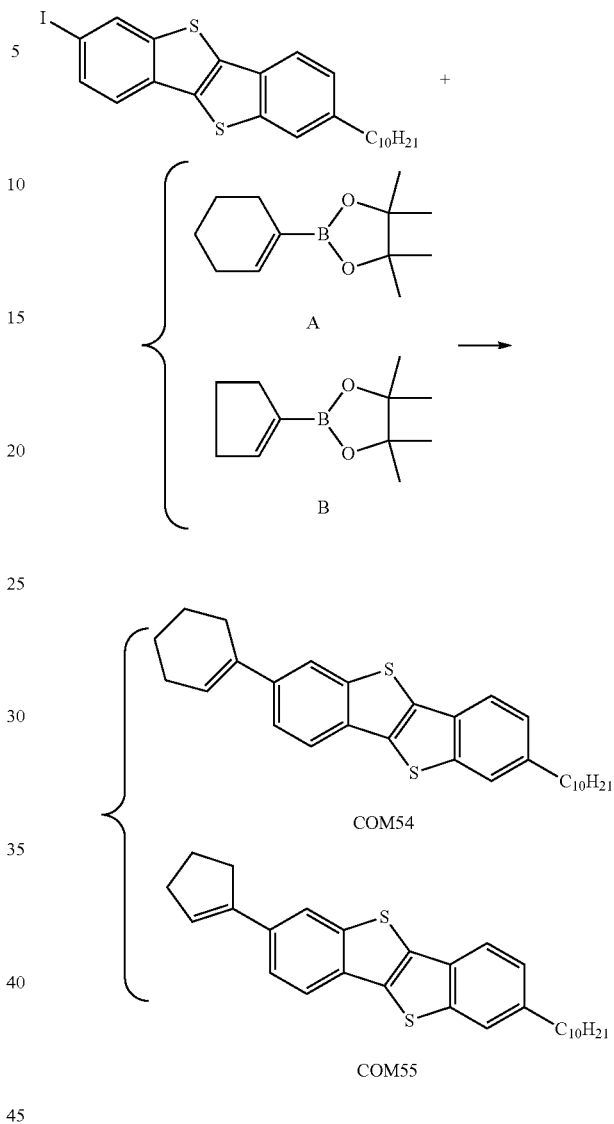

Synthesis Example of Comp. No. 55

To a dioxane (6 mL) solution of 2-decyl-7-iodoBTBT (135 mg, 0.267 mmol) and reagent B (103 mg, 0.53 mmol), 2M tripotassium phosphate (0.27 mL) was added and after bubbling of an argon gas for 20 minutes, tetrakis(triphenylphosphine)palladium (15 mg) and tricyclohexylphosphine (7 mg) were added and reacted at 100° C. for 24 hours. The reaction solution was cooled, and the produced solid was collected by filtration. This solid (100 mg) was adsorbed on silica gel from a chloroform solution, placed on silica gel column, eluted with cyclohexane-chloroform (20:1) and concentrated, and the produced solid was collected by filtration. This solid (56 mg) was recrystallized from ligroin to obtain 54 mg (yield: 45%) of Comp. No. 55.

Figure 43:
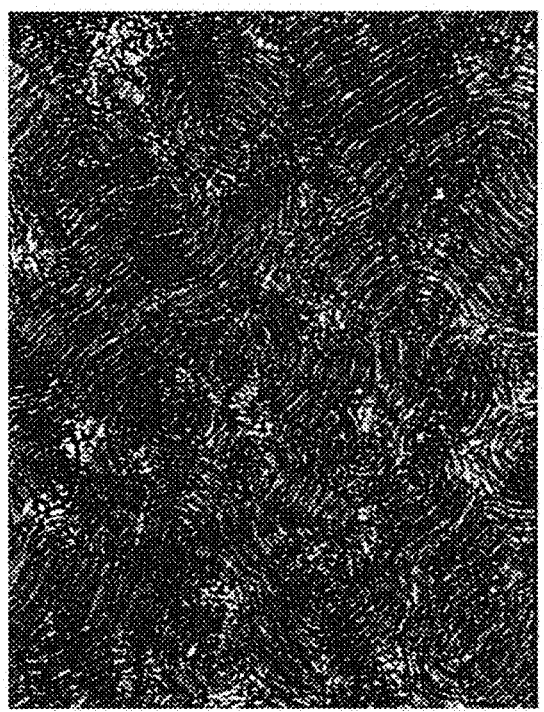
FIG. 43 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 54.
Figure 43:
Figure 44:
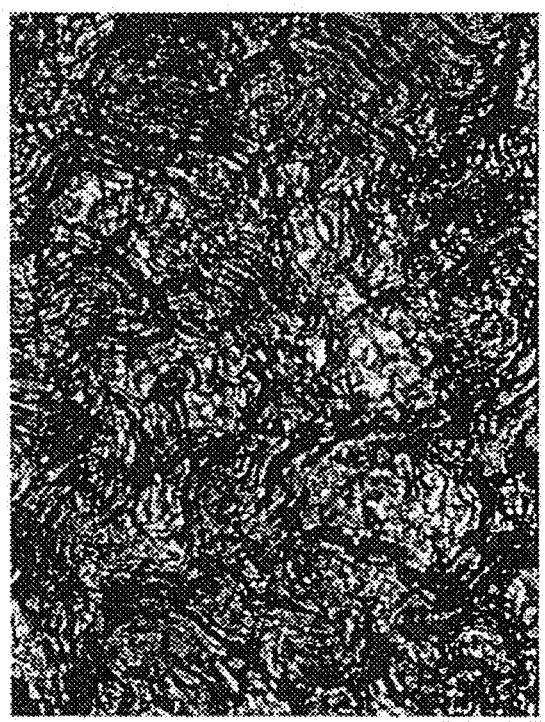
FIG. 44 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 55.
Figure 44:
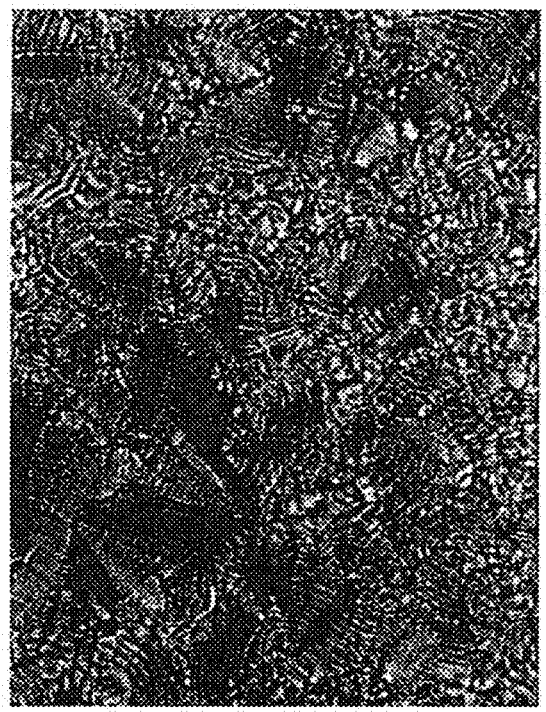

This substance was subjected to the screening method described in this specification, so as to observe the texture thereof. The thus obtained observation results are shown in FIGS. 43 to 44.

[Chemical Formula 19]
COM54

2-(cyclohex-1-en-1-yl)-7-decylbenzo[b]benzo[4,5]thieno[2,3-d]thiophene

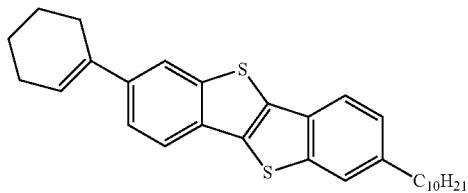

H-nmr (500 MHz, CDCl3): δ 7.88 (d, 1H, J 1.4 Hz), 7.77 (d, 1H, J 8.2 Hz), 7.76 (d, 1H, J 8.2 Hz), 7.49 (dd, 1H, J 1.8, 8.2 Hz), 7.26 (dd, 1H, J 1.4, 8.2 Hz), 6.25 (m, 1H), 2.75 (t, 2H, J 7.5 Hz), 2.50 (m, 2H), 2.26 (m, 2H), 1.83 (m, 2H), 1.66-1.72 (m, 4H), ~1.2~1.4 (m, 14H, CH$_2$×7), 0.88 (t, 3H, J 7 Hz).

COM55

2-(cyclopent-1-en-1-yl)-7-decylbenzo[b]benzo[4,5]thieno[2,3-d]thiophene

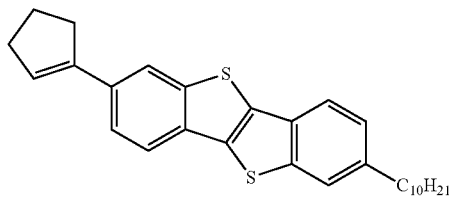

H-nmr (300 MHz, CDCl3): δ 7.89 (br. s, 1H), 7.76 (dd, 1H, J~1, ~8 Hz), 7.70 (br. s, 1H.), 7.59 (dd, 1H, J 1.4, 8.5 Hz), 7.27 (dd, 1H, J~1, ~8 Hz, overlapped with CHCl3), 6.30 (m, 1H), 2.73-2.83 (m, 4H), 2.59 (m, 2H), 2.07 (quint. 2H, J~7 Hz), 1.69 (quint. 2H, J~8 Hz), ~1.2~1.4 (m, 14H), 0.88 (t, 3H, J~7 Hz).

Example 33

Comp. No. 56: 1-(7-decylBTBT-2-)piperidine (Pip-BTBT-10)

(Synthesis According to Conditions of Buchwald-Hartwig Reaction)

To a toluene solution (2 mL) of 2-decyl-7-iodoBTBT (51 mg, 0.1 mmol) and piperidine (10 mg), NaOtBu (13 mg), Pd2(dba)3 (up to 4 mg) and racBINAP (up to 4 mg) were added and reacted at 95° C. for 40 hours. After an ordinary post-treatment with chloroform, the crude solid (46 mg) was purified by silica gel column (cyclohexane-chloroform, 2:1) and subsequently by alumina column (cyclohexane-chloroform, 4:1) and recrystallized from IPA-ligroin to obtain 9.2 mg (yield, 20%) of Comp. No. 56.

Figure 45:
FIG. 45 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 56.
Figure 45:

This substance was subjected to the screening method described in this specification, so as to observe the texture thereof. The thus obtained observation results are shown in FIG. 45.

[Chemical Formula 20]
COM56

1-(7-decylbenzo[b]benzo[4,5]thieno[2,3-d]thiophen-2-yl)piperidine

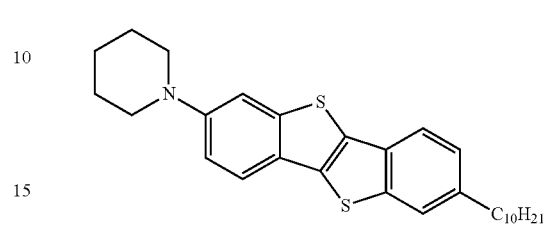

H-nmr (300 MHz, CDCl3): δ 7.69 (d, 1H, J~8 Hz), 7.68 (d, 1H, J~8 Hz, overlapped with 7.67 br. s), 7.62 (br. s, 1H), 7.37 (d, 1H, J 1.8 Hz), 7.23 (dd, 1H, J>1, ~8 Hz, overlapped with CHCl$_3$), 7.11 (dd, 1H, J 1.8, >8 Hz), 3.24 (t, 4H, J>5 Hz, alfa-H of piperidine), 2.73 (t, 2H, J 8 Hz), 1.77 (quint. 2H, J~8 Hz), ~1.5~1.8 (m, 6H, piperidine), ~1.2~1.4 (m, 14H), 0.88 (t, 3H, J~7 Hz).

Example 34

Comp. No. 57: 1-(7-decylBTBT-2-)1H pyrrole (Pyr-BTBT-10)

To a toluene solution (1 mL) of 7-decyl-BTBT-2-amine (40 mg, 0.1 mmol), acetic acid (0.5 mL) and 2,5-dimethoxytetrahydrofuran (40 mg, 0.3 mmol) were added, and the system was heated at 95° C. for 4 hours. After an ordinary post-treatment with chloroform, the obtained crude solid (42 mg) was purified by silica gel column (cyclohexane) and recrystallized from ligroin to obtain 15 mg (yield, 34%) of Comp. No. 57.

Figure 46:
FIG. 46 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 57.
Figure 46:

This substance was subjected to the screening method described in this specification, so as to observe the texture thereof. The thus obtained observation results are shown in FIG. 46.

[Chemical Formula 21]
COM57

1-(7-decylbenzo[b]benzo[4,5]thieno[2,3-d]thiophen-2-yl)-1H-pyrrole

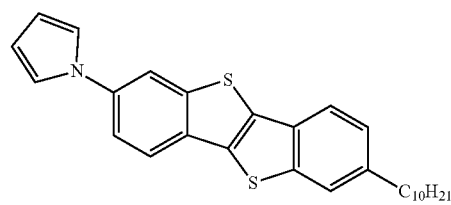

H-nmr (500 MHz, CDCl3): δ 7.90 (d, 1H, J>1 Hz), 7.88 (d, 1H, J 8.2 Hz), 7.72 (br. s, 1H), 7.51 (dd, 1H, J>1, 8.2 Hz), 7.29 (dd, 1H, J~1, ~8 Hz), 7.17 (m, 2H, alfa-H of pyrrole), 6.40 (m, 2H, beta-H of pyrrole), 2.77 (t, 2H, J 8 Hz), 1.70 (quint. 2H, J~8 Hz), ~1.2~1.4 (m, 14H), 0.88 (t, 3H, J~7 Hz) 0.88 (t, 3H, J~7 Hz).

Example 35

Comp. No. 58: 7,7'-(tetramethylbiphenyl)-bis(2-decylBTBT) (Me4BP (10-BTBT)2)

The compound was synthesized according to the following scheme. Diboronic acid pinacol ester (C, novel compound) was synthesized from D (J. Amer. Chem. Soc. 131, 13074, 2009) according to the Miyaura-Ishiyama method.

[Chemical Formula 22]

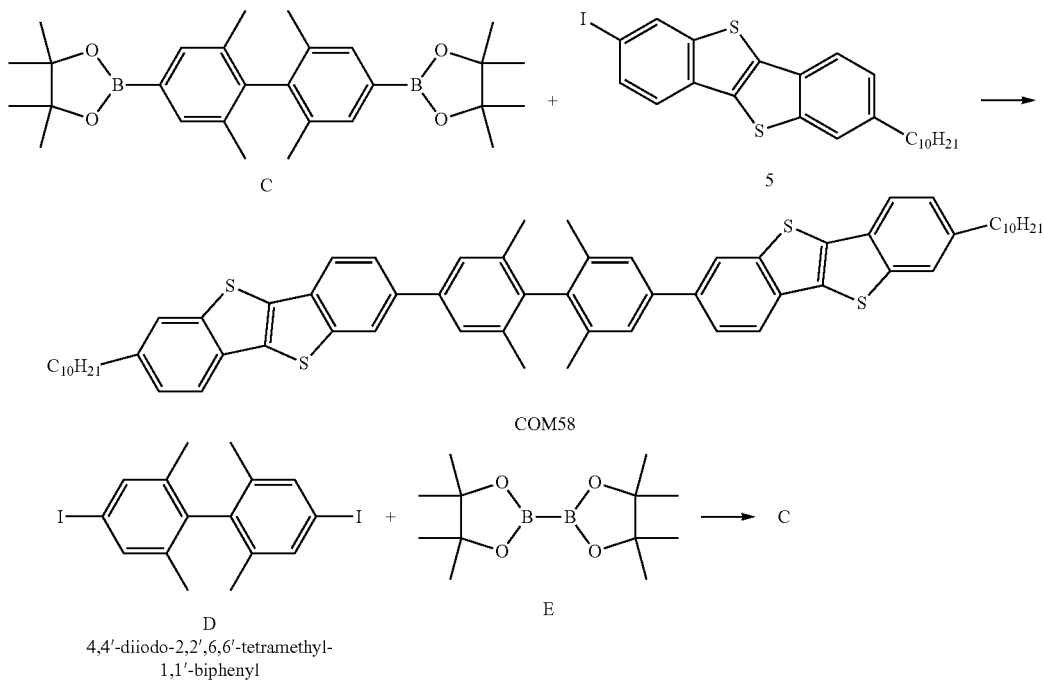

D
4,4'-diiodo-2,2',6,6'-tetramethyl-1,1'-biphenyl i: Synthesis of C

To a DMSO (8 mL) solution of Compound D (231 mg, 0.5 mmol) and Compound E (bis(pinacolato)diboron, 290 mg, 0.63 mmol), PdCl2 (dppf)-CH2Cl2 (43 mg) and potassium acetate (300 mg) were added and after bubbling of an argon gas for 10 minutes, reacted at 90° C. for 21 hours. The reaction solution was extracted with diisopropyl ether, washed with a (10 mL×3) 10% saline solution, dried over magnesium sulfate, concentrated to dryness and then purified by silica gel column (cyclohexane-ethyl acetate, 19:1) to obtain 206 mg (yield, 89%) of Compound C.

Figure 47:
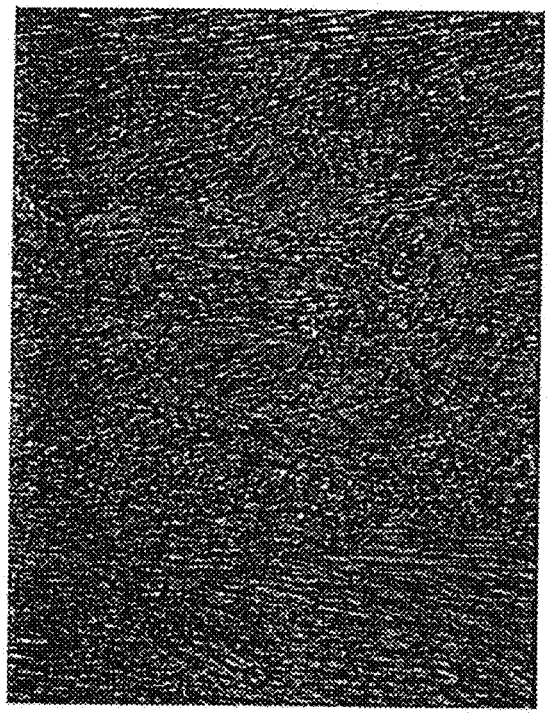
FIG. 47 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 58.
Figure 47:
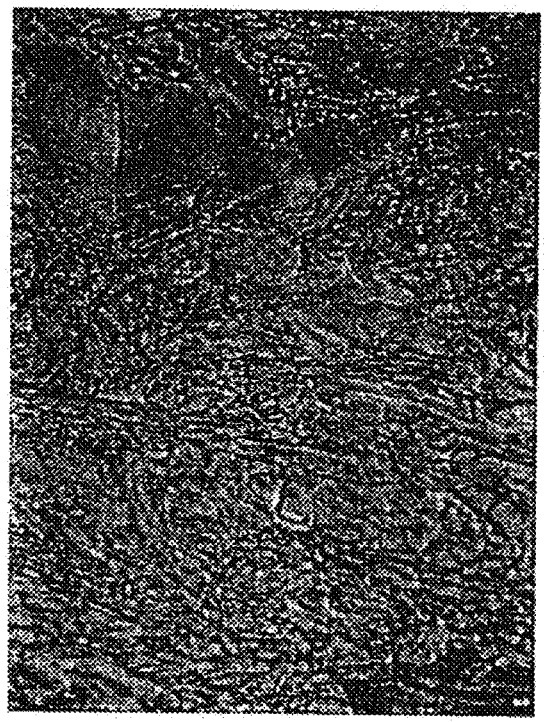

This substance was subjected to the screening method described in this specification, so as to observe the texture thereof. The thus obtained observation results are shown in FIG. 47.

ii: Synthesis of Comp. No. 58

To a dioxane (7 mL) solution of Compound C (69 mg, 0.15 mmol) and 2-decyl-7-iodoBTBT (190 mg, 0.375 mmol), 2M tripotassium phosphate (0.3 mL) was added and after bubbling of an argon gas for 10 minutes, tetrakis (triphenylphosphine)palladium (14 mg) and tricyclohexylphosphine (7 mg) were added and reacted at 95° C. for 45 hours. After an ordinary post-treatment with chloroform, the obtained crude solid (200 mg) was adsorbed on silica gel from the chloroform solution, placed on silica gel column (cyclohexane-cyclohexane-chloroform, 5:1), thereby purified, and subsequently recrystallized from chloroform-ligroin to obtain 36 mg (yield, 25%) of Comp. No. 58.

[Chemical Formula 23]

COM58

7,7'-(2,2',6,6'-tetramethyl-[1,1'-biphenyl]-4,4'-diyl) bis(2-decylbenzo[b]benzo[4,5]thieno[2,3-d]thiophene)

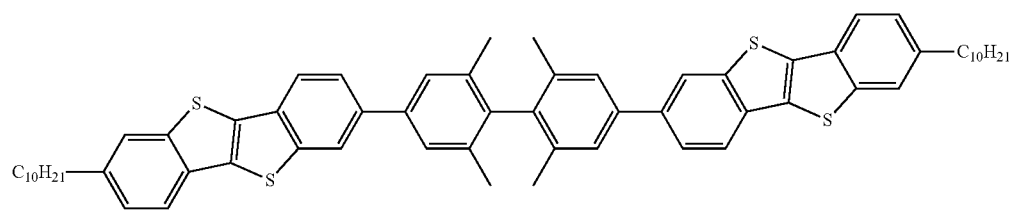

H-nmr (500 MHz, CDCl3): δ 8.21 (d, 2H, J 1.8 Hz), 7.94 (d, 2H, J 8.2 Hz), 7.80 (d, 2H, J 8.2 Hz), 7.78 (dd, 2H, J 1.8, 8.2 Hz), 7.74 (br. s, 2H), 7.50 (s, 4H), 7.30 (dd, 2H, J~1, 8.2 Hz) 2.77 (t, 4H, J 8 Hz), 2.06 (s, 12H, 4×Me), 1.71 (quint. 4H, J~8 Hz), ~1.2~1.4 (m, 28H), 0.88 (t, 6H, J~7 Hz).

Example 36

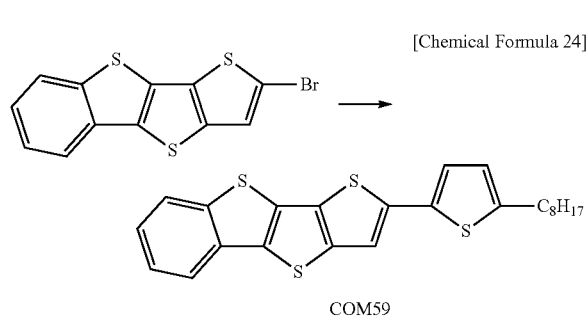

COM59

In an argon atmosphere, 2-bromobenzo[d,d']thieno[3,2-b;4,5-b']dithiophene (120 mg, 0.36 mmol), 2-(5-octylthiophene-2-yl)-4,4,5,5-tetramethyl-1,3,2-dioxaborane (130 mg, 0.41 mmol) and cesium carbonate (180 mg, 0.54 mmol) were dissolved in DMF (5 ml), and tetrakis(triphenylphosphine)palladium(0) (8 mg, 007 mmol) was added thereto. The system was heated with stirring at 95° C. for 20 hours, and the reaction solution was extracted with ethyl acetate, washed with water and then dried over magnesium sulfate. The ethyl acetate layer was concentrated, and the residue was purified by column chromatography to obtain 20 mg (yield: 13%) of Comp. No. 59.

$^1$H-NMR (500 MHz, CDCl$_3$, δ): 7.86 (d, J=7.5 Hz, 1H), 7.80 (d, J=8.5 Hz, 1H), 7.43 (t, J=8.0 Hz, 1H), 7.35 (t, J=8.0 Hz, 1H), 7.34 (s, 1H), 7.05 (d, J=4.0 Hz, 1H), 6.72 (d, J=4.0 Hz, 1H), 2.85 (d, J=8.0 Hz, 2H), 1.72 (m, 2H), 1.28 (m, 10H), 0.89 (t, J=7.0 Hz, 3H).

Figure 48:
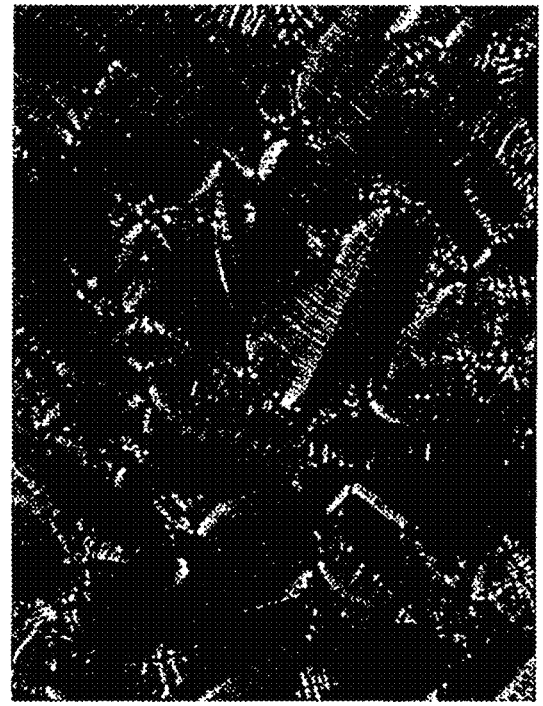
FIG. 48 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. Comp. No. 59.
Figure 48:
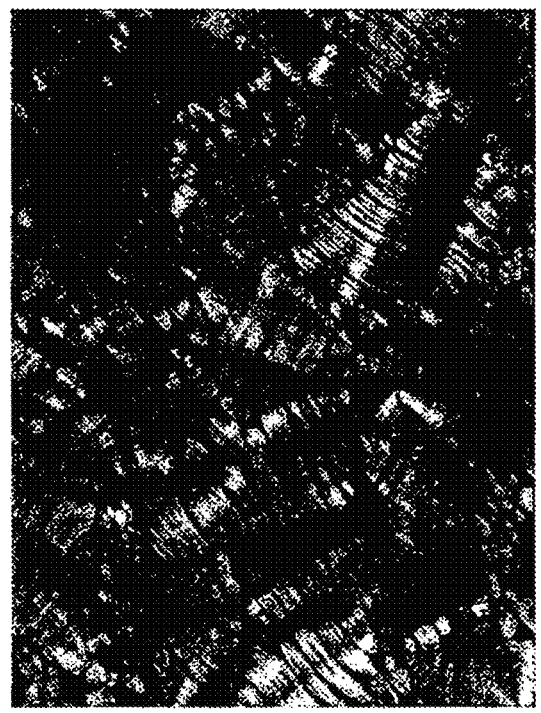

This substance was subjected to the screening method described in this specification, so as to observe the texture thereof. The thus obtained observation results are shown in FIG. 48.

Example 37

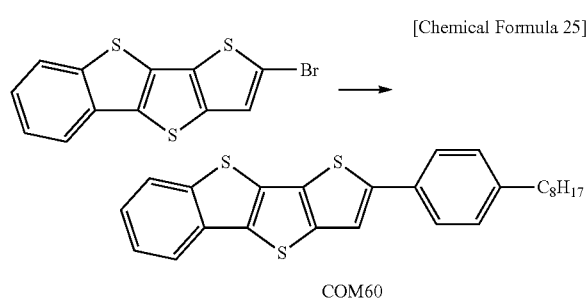

COM60

From 2-bromobenzo[d,d']thieno[3,2-b;4,5-b']dithiophene (73 mg, 0.22 mmol) and 4-octylphenylboranic acid (61 mg, 0.26 mol), 57 mg (yield: 60%) of Comp. No. 60 was obtained by the same method as in Example 36.

$^1$H-NMR (500 MHz, CDCl$_3$, δ): 7.87 (d, J=7.5 Hz, 1H), 7.82 (d, J=7.5 Hz, 1H), 7.57 (d, J=8.5 Hz, 2H), 7.53 (s, 1H), 7.44 (t, J=7.5 Hz, 1H), 7.35 (t, J=7.3 Hz, 1H), 7.24 (d, J=8.5 Hz, 2H), 2.63 (t, J=7.5 Hz, 2H), 1.64 (m, 2H), 1.30 (m, 10H), 0.89 (t, J=7.5 Hz, 3H).

Figure 49:
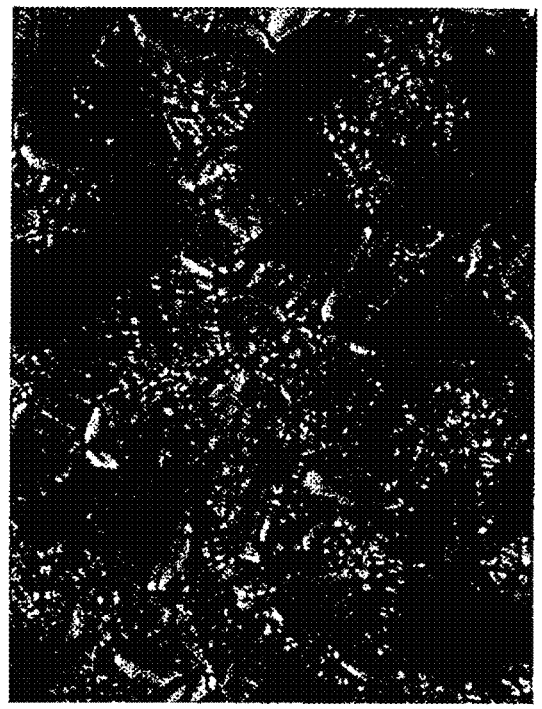
FIG. 49 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 60.
Figure 49:
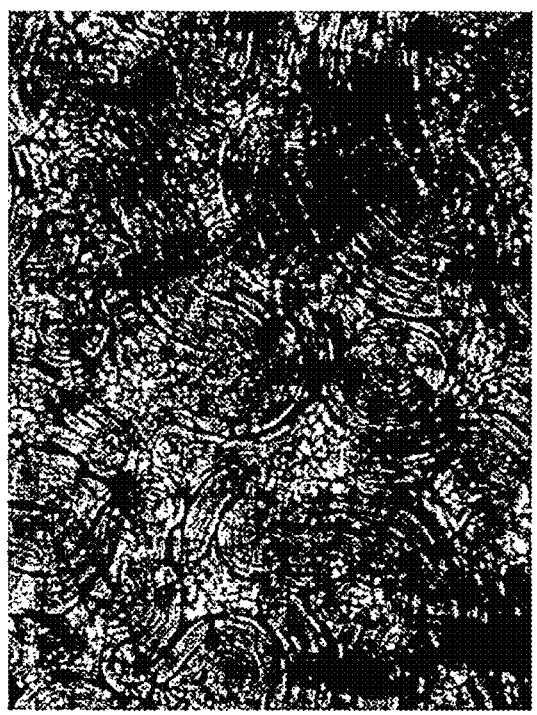

This substance was subjected to the screening method described in this specification, so as to observe the texture thereof. The thus obtained observation results are shown in FIG. 49.

Example 38

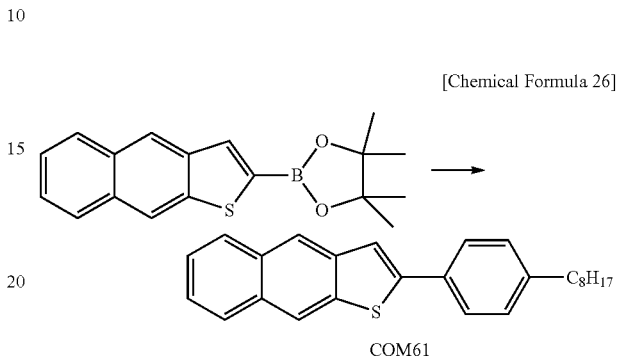

COM61

In an argon atmosphere, 2-(naphtho[2,3-b]thienyl-2-yl)-4,4,5,5-tetramethyl-1,3,2-dioxaborane (130 mg, 0.41 mmol) and cesium carbonate (200 mg, 063 mmol) were dissolved in DMF (5 ml), and tetrakis(triphenylphosphine)palladium (0) (6 mg, 005 mmol) was added thereto. The system was heated with stirring at 95° C. for 19 hours, and the reaction solution was extracted with dichloromethane, washed with water and then dried over magnesium sulfate. The dichloromethane layer was concentrated, and the residue was purified by column chromatography to obtain 50 mg (yield: 32%) of the compound of Comp. No. 61.

$^1$H-NMR (500 MHz, CDCl$_3$, δ): 8.30 (s, 1H), 8.24 (s, 1H), 7.95 (t, J=4.5 Hz, 1H), 7.89 (t, J=4.5 Hz, 1H), 7.68 (d, J=8.5 Hz, 2H), 7.61 (s, 1H), 7.45 (m, 1H), 7.28 (d, J=8.5 Hz, 2H), 2.65 (d, J=7.0 Hz, 2H), 1.64 (m, 2H), 1.26 (m, 10H), 0.89 (t, J=7.0 Hz, 3H).

Figure 50:
FIG. 50 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 61.
Figure 50:
Figure 51:
FIG. 51 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 62.
Figure 51:
Figure 52:
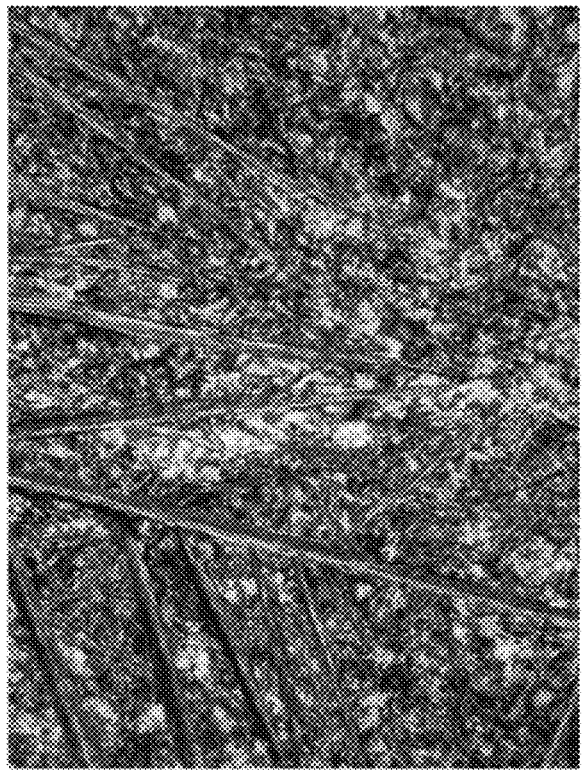
FIG. 52 is (a) an example of the polarized optical microscopic image showing the polarizing microscopic texture at room temperature and (b) an example of the polarized optical microscopic image showing the polarizing microscopic texture of a phase in a high temperature region adjacent to a crystal phase, with respect to the compound of Comp. No. 63.
Figure 52:
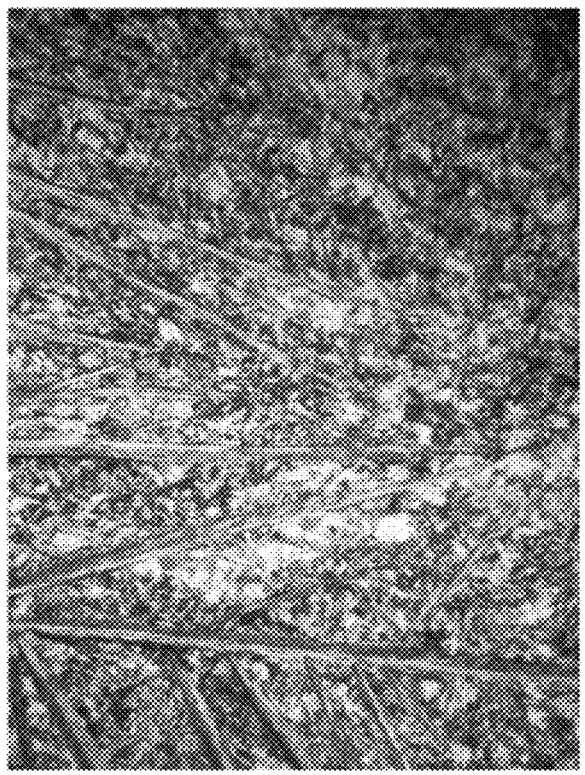

This substance was subjected to the screening method described in this specification, so as to observe the texture thereof. The thus obtained observation results are shown in FIG. 50.

Example 39

FIGS. 17 to 52 show results of texture observation under a polarizing microscope aiming at screening for the preferred liquid crystal substance specified in the description of the present invention. In the texture observed at 20° C., a black linear or fine region due to a crack or a void was observed, but in the phase appearing in the temperature region before crystallization, a black line or region was not observed, and it could be confirmed that the texture is apparently not a nematic phase characteristic of a Schlieren texture or SmA or SmC phase characteristic of Fan-like texture but is a higher-order phase. In the light of this screening, these substances could be identified as the pertinent substance of the present invention.

Example 40

Out of Comp. No. 5 to Comp. No. 61 measured by the scanning differential thermal analyzer, the phase transition behaviors of the compounds shown in the Tables are shown in Tables 9 to 15.

I stands for an isotropic phase, N stands for a nematic phase, SmA stands for a smectic A phase, SmE stands for a smectic E phase, SmX stands for a highly-ordered smectic phase or a metastable crystal phase, and K stands for a crystal phase.

Example 41

In order to verify that a liquid crystal substance designed and synthesized according to this method exhibits very excellent properties as an organic semiconductor, examples where the mobility was expected by performing the measurement of transient photocurrent by a time-of-flight method are shown in Tables 17 and 18.

The measurement was performed by the following method. A cell having a cell thickness of 13 to 17 μm (commercial product; manufactured by EHC), in which two ITO transparent electrode-attached glass substrates are laminated together by a thermosetting resin including a spacer, was heated to the isotropic phase temperature of each compound, and a small amount of a sample was put into contact with the opening part of the cell so as to inject the sample into the cell by utilizing a capillary phenomenon. The cell was fixed on a sample stage having a heater positioned therein, and a DC voltage was applied to the electrode. A nitrogen laser pulsed light having a pulse width of 600 ps was radiated, and the current flowing upon irradiation was measured by a digital oscilloscope. At this time, attention was paid not to cause a waveform distortion due to a space charge by adjusting the light irradiation intensity such that the integral value (charge amount) of the photocurrent flowing upon light irradiation falls within 10% of the geometric capacitance of the cell.

Figure 5:
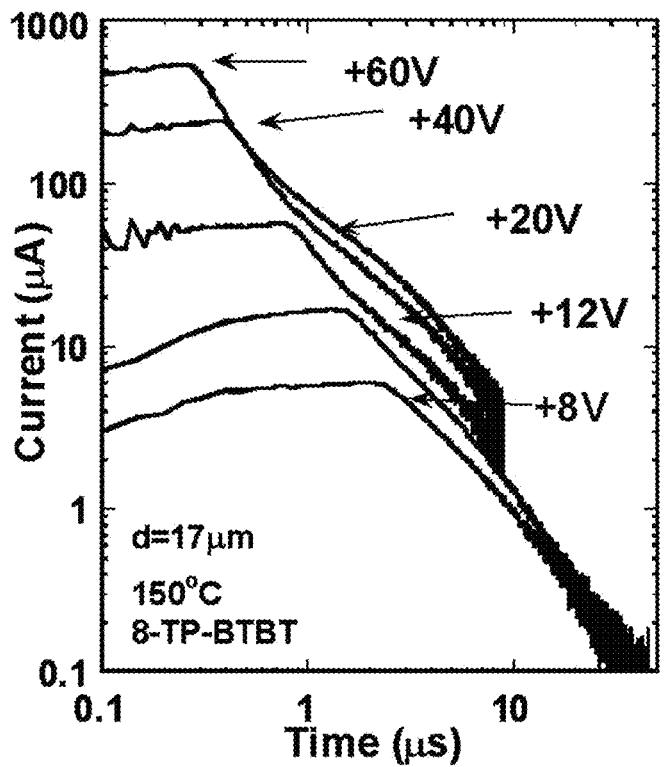
FIG. 5 is a graph showing one example of the TOF waveform for the compound of Comp. No. 9.
Figure 6:
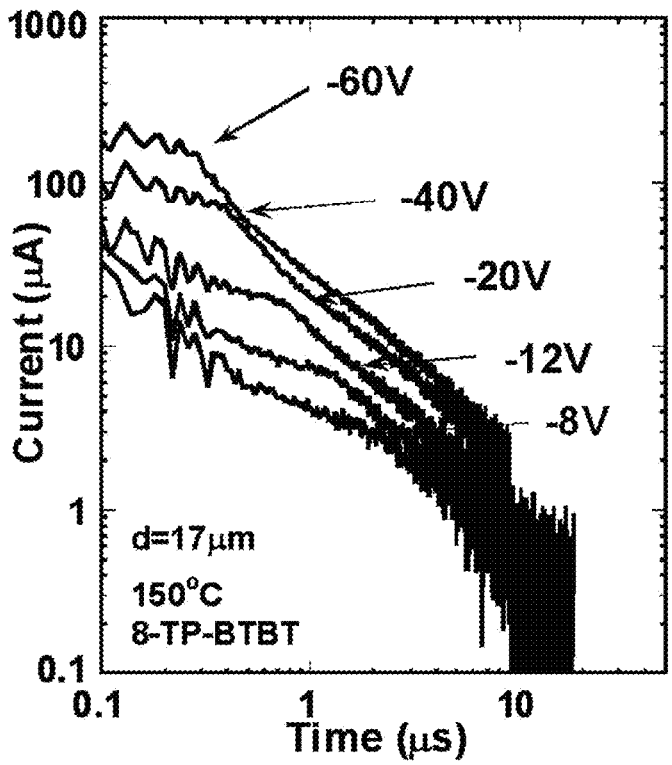
FIG. 6 is a graph showing one example of the TOF waveform for the compound of Comp. No. 9.

In the transient photocurrent waveform measured at 150° C. corresponding to SmE phase of Comp. No. 9, as shown in FIGS. 5 and 6, a shoulder showing a distinct charge transit appeared. When the charge transit time was estimated from the shoulder and the mobility was calculated, in the case of applying a positive volume to the light irradiation-side electrode, that is, under the condition of the hole transport governing the current, the mobility was 0.2 $cm^2/Vs$, and in the case of applying a negative volume, that is, under the condition of the electron transit governing the current, the mobility was similarly very high and was 0.2 $cm^2/V$. These mobilities were confirmed to be independent of the electric field. As apparent from these results, this substance has high photoconductivity and high mobility and therefore, exhibits excellent properties as an organic semiconductor. Further, in the measurement of transient photocurrent by this time-of-flight method, a photocurrent corresponding to the irradiation with pulsed light was observed, and as apparent from this, a high-speed optical signal associated with light irradiation was obtained, demonstrating that the substance can be utilized for a photosensor having a high response speed.

Example 42

Figure 7:
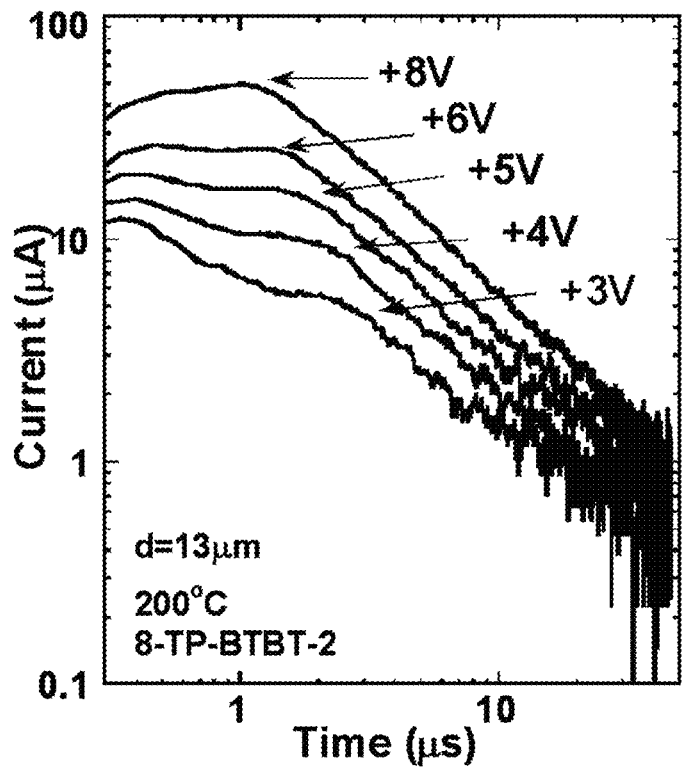
FIG. 7 is a graph showing one example of the TOF waveform for the compound of Comp. No. 10.

Similarly to Example 41, Comp. No. 10 was measured for the transient photocurrent at 200° C. exhibiting its SmE phase by using a cell with a thickness of 13 μm and using the time-of-flight method, as a result, a waveform shown in FIG. 7 was obtained. As apparent from this waveform, a shoulder corresponding to a hole transit time was observed and when the hole mobility was estimated from the transit time, a high value of 0.2 $cm^2/Vs$ was obtained. The calculated mobility at the applied voltage was confirmed to be independent of the electric field.

Example 43

Figure 8:
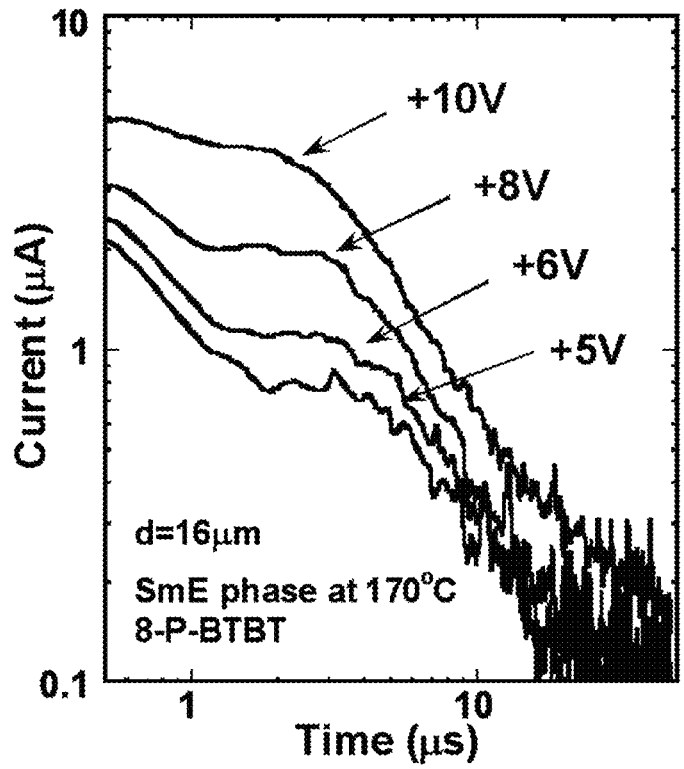
FIG. 8 is a graph showing one example of the TOF waveform for the compound of Comp. No. 20.

Similarly to Example 41, after injecting Comp. No. 20 into a cell with a thickness of 16 μm, Comp. No. 20 was measured for the transient photocurrent at 170° C. corresponding to SmE phase by the time-of-flight method, as a result, a shoulder exhibiting the transit time was observed in the waveform as shown in FIG. 8 and the transit time could be determined. When the mobility was estimated from the value, a value of 0.1 $cm^2/Vs$ was obtained as the hole mobility.

Example 44

Figure 9:
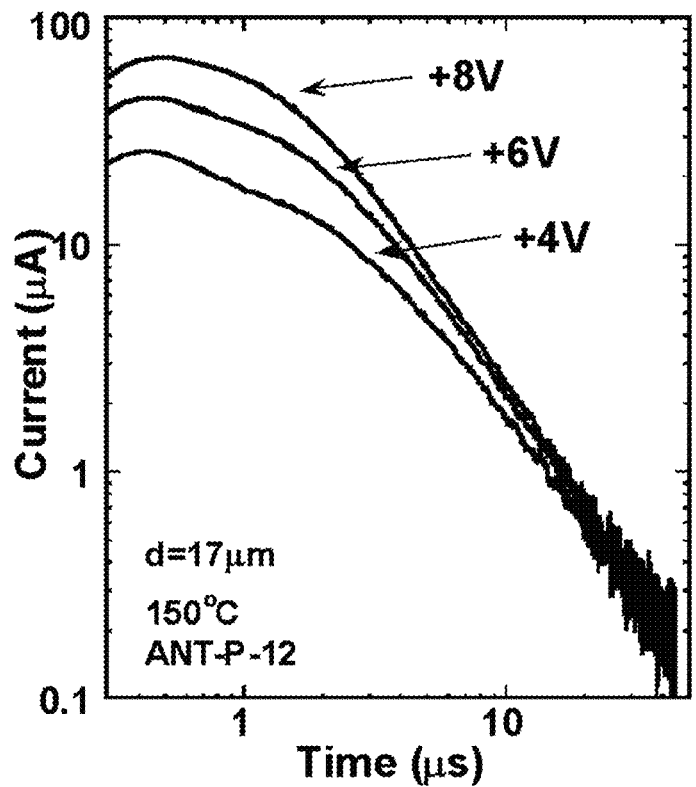
FIG. 9 is a graph showing one example of the TOF waveform for the compound of Comp. No. 28.

Similarly to Example 41, Comp. No. 28 was, as shown in FIG. 9, measured for the transient photocurrent at 150° C. of a highly-ordered smectic phase (Smx phase) and when the mobility was estimated, a very high value of 0.3 $cm^2/Vs$ was obtained as the hole mobility. This hole mobility may be a highest value among Heretofore known rod-like liquid crystal substances.

Example 45

Figure 10:
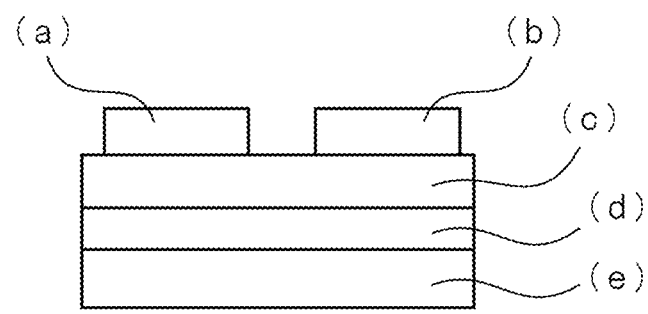
FIG. 10 is a schematic cross-sectional view showing one example of the TFT device formed in Examples according to the present invention. In the figure, reference numeral (a) denotes a source electrode, (b) a drain electrode, (c) an organic semiconductor layer, (d) a gate insulating film, and (e) a gate electrode.
Figure 11:
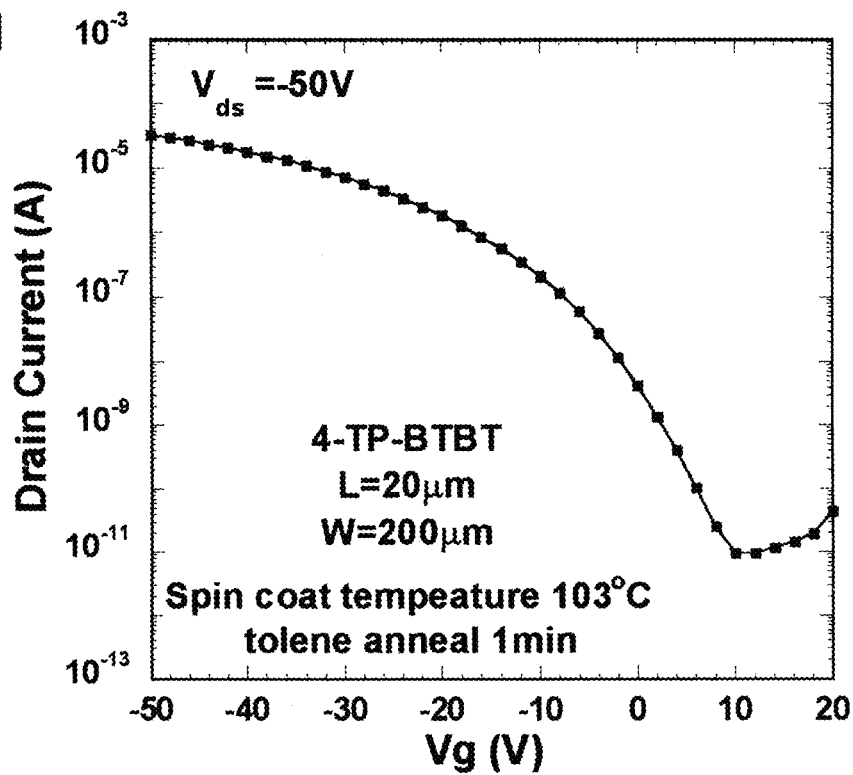
FIG. 11 is a graph showing one example of the typical transmission properties of a transistor, which has been manufactured by using the compound of Comp. No. 5.
Figure 12:
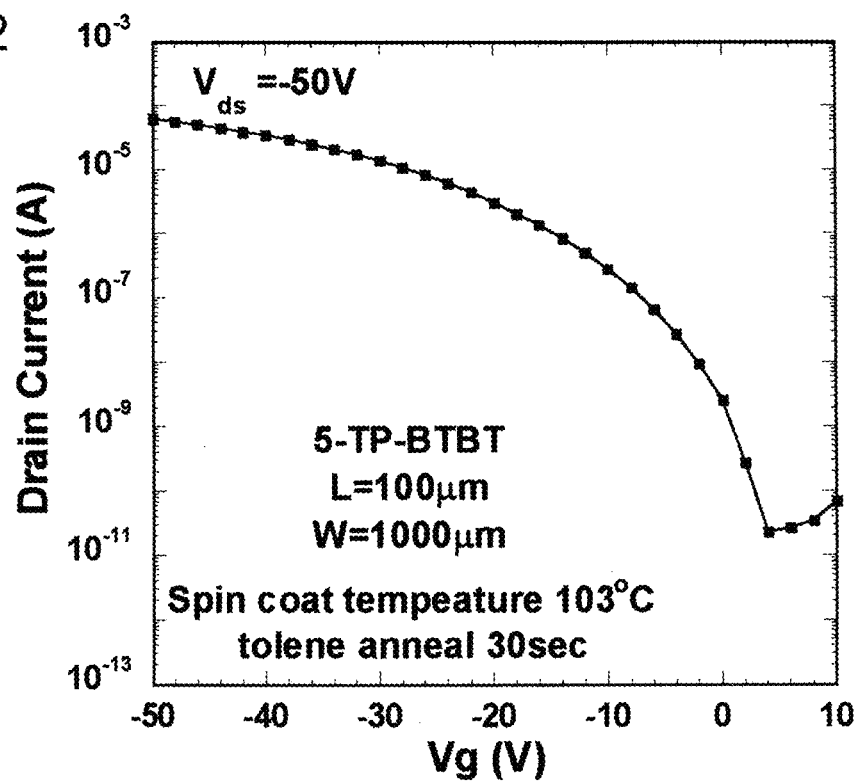
FIG. 12 is a graph showing one example of the typical transmission properties of a transistor, which has been manufactured by using the compound of Comp. No. 6.
Figure 13:
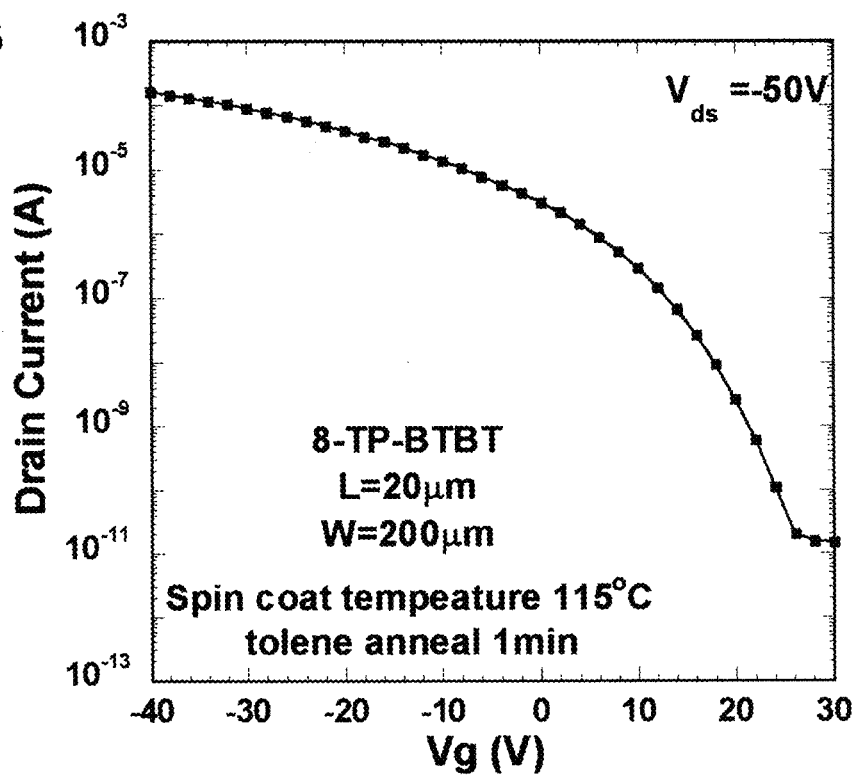
FIG. 13 is a graph showing one example of the typical transmission properties of a transistor, which has been manufactured by using the compound of Comp. No. 9.
Figure 14:
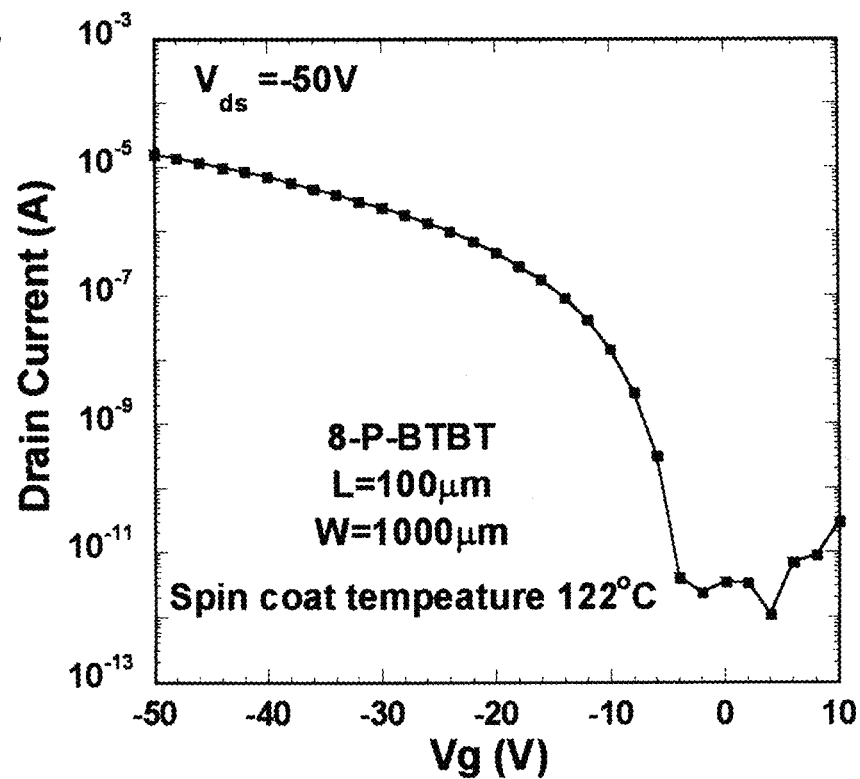
FIG. 14 is a graph showing one example of the typical transmission properties of a transistor, which has been manufactured by using the compound of Comp. No. 20.
Figure 15:
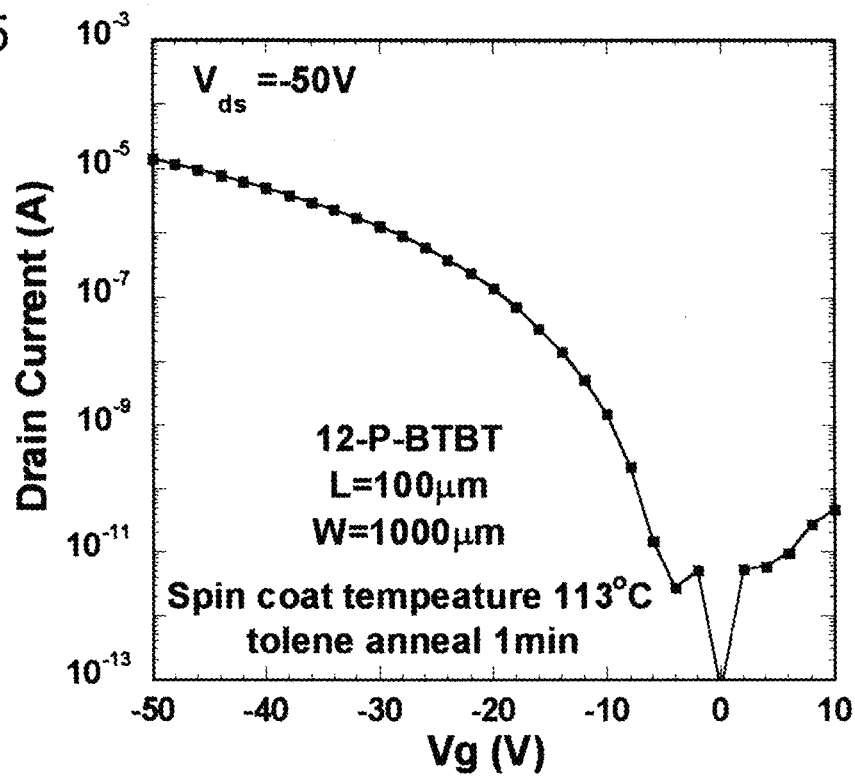
FIG. 15 is a graph showing one example of the typical transmission properties of a transistor, which has been manufactured by using the compound of Comp. No. 23.
Figure 16:
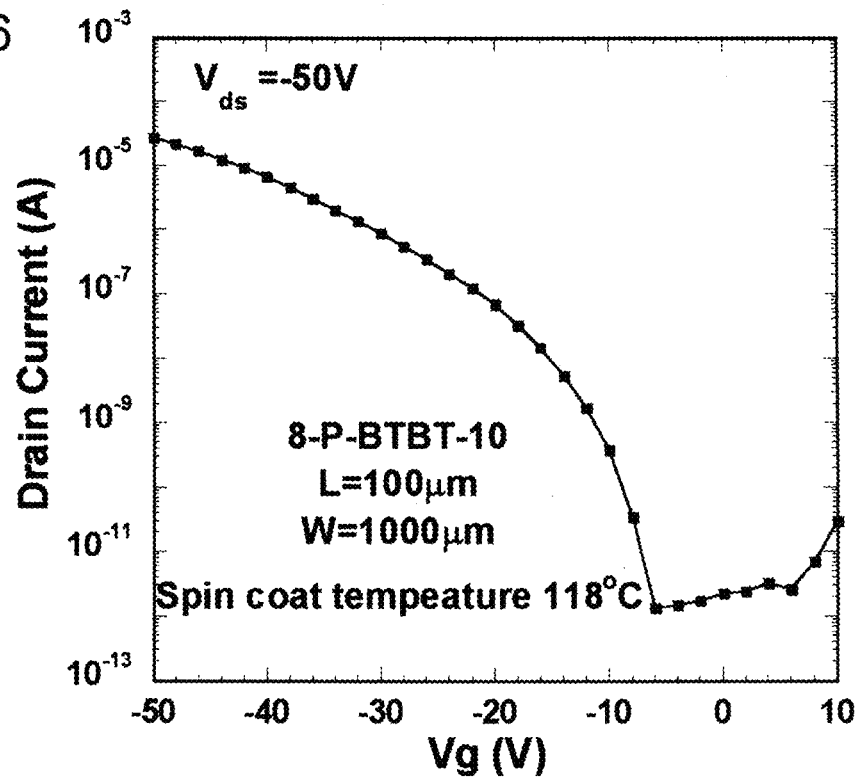
FIG. 16 is a graph showing one example of the typical transmission properties of a transistor, which has been manufactured by using the compound of Comp. No. 31.

The measurement of a transient photocurrent by the time-of-flight method may be an effective method capable of directly calculating the mobility and confirming the usefulness as an organic semiconductor material, but in order to more empirically demonstrate the usefulness as an organic semiconductor material, FET was manufactured using the synthesized liquid crystal substance and properties thereof were examined.
Specific Manufacturing Method of Organic Transistor:

The manufactured organic transistor had a structure shown in FIG. 10. Specifically, an organic semiconductor layer was formed on a substrate and thereafter, source and drain electrodes were vacuum deposited through a metal mask to manufacture the transistor. Details thereof are described below.
<Substrate>

A heavy doped silicon wafer ($P^+$—Si) and a thermally oxidized silicon ($SiO_2$, thickness: 300 nm) were used as the gate electrode and the gate insulating film, respectively. The silicon wafer of the thermally oxidized film was cut into an appropriate size (20×25 mm), and the cut silicon wafer (hereinafter, simply referred to as substrate) was ultrasonically cleaned in sequence with neutral detergent, ultrapure water, isopropyl alcohol (IPA), acetone and IPA.

Next, a liquid crystalline organic semiconductor compound was dissolved in an organic solvent (diethylbenzene here) to prepare a solution. The concentration of the solution was set to be from 0.5 to 1 wt %. This solution and a glass-made pipette for coating the solution on the substrate were previously heated to a predetermined temperature on a hot stage, and the substrate above was placed on a spin coater provided in an oven. After raising the temperature in the oven to a predetermined temperature, the solution was applied on the substrate, and the substrate was rotated (about 3,000 rpm, 30 seconds). After stopping the rotation, the substrate was swiftly taken out and cooled to room temperature. A liquid crystalline organic semiconductor film having a thickness of 30 to 50 nm was obtained.

Subsequently, a gold electrode (from 30 to 100 nm) was vapor-deposited by a vacuum deposition method ($2 \times 10^{-6}$ Torr) on the substrate having coated thereon an organic semiconductor layer, whereby source and drain electrodes were formed. The source and drain electrodes were formed at channel length:channel width=100 μm:1,000 μm, 50 μm:1,000 μm, or 20 μm:200 μm by vapor-depositing a pattern and utilizing a mask pattern.

Thereafter, the region other than the regions where source and drain electrodes and a channel are formed was wiped off using a sponge impregnated with toluene to simply insulate the device.

The evaluation of the manufactured organic transistor was performed in a normal air atmosphere by using a two-power source measurement unit for the gate electrode and the drain electrode, and transmission characteristics of the field-effect transistor were examined by measuring the current flowing in the device. The mobility was calculated using the formulae of transmission characteristics and saturation characteristics of the saturated region ($V_{DS}$=−50 V).

In Table 16, the mobilities estimated from typical transmission characteristics (shown in FIGS. 11 to 16) of transistors manufactured using the compounds recited in the Table.

Figure 53:
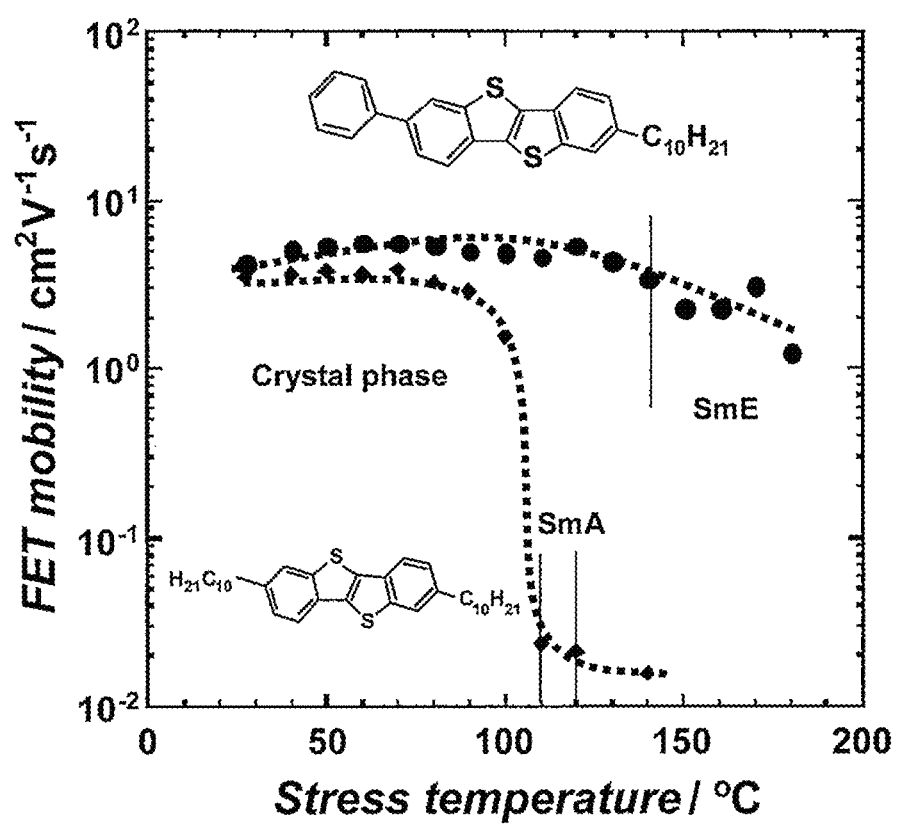
FIG. 53 is a graph which has been obtained by plotting the results in a case where an FET manufactured in Examples is subject to a heat stress at a predetermined temperature (shown on the abscissa) for 5 minutes and returned to room temperature, and after the measurement of the FET properties, the mobility (ordinate) is determined.

FIG. 53 shows the results when each of a transistor, which has been manufactured by using Comp. No. 24 (P-BTBT-10) exhibiting a highly ordered SmE phase in the temperature region adjacent to the crystal phase and a transistor, which has been manufactured by using didecylbenzothienobenzothiophene (10-BTBT-10) exhibiting SmA phase as a low-order liquid crystal phase in the temperature region adjacent to the crystal phase was subject to a heat stress at a predetermined temperature for 5 minutes and mobilities estimated from the transistor characteristics at room temperature were plotted based on the temperature when applying a heat stress. The transistor, which has been manufactured by using Compound 24 exhibiting a highly ordered SmE phase in the temperature region adjacent to the crystal phase maintained high mobility even when heated at a temperature exceeding 150° C. for 5 minutes, whereas with the compound exhibiting SmA phase that is a low-order crystal phase, the mobility was greatly reduced when heated at a temperature exceeding 100° C. for 5 minutes. It may be seen from these results that development of a highly ordered liquid crystal phase is very effective in improving the heat resistance of a device.

Further, in Tables 17 and 18, SmE phase: hole mobility when using the compounds recited in the Tables are shown.

The results obtained in Examples above are shown together in the Table below.

TABLE 16

| Compound | (a) | (b) |
|---|---|---|
| COM5 | [structure with $C_4H_9$] | 1.8 cm$^2$/Vs |
| COM6 | [structure with $C_5H_{11}$] | 2.2 cm$^2$/Vs |
| COM7 | [structure with $C_6H_{13}$] | 3.2 cm$^2$/Vs |
| COM8 | [structure with $C_7H_{15}$] | 2.1 cm$^2$/Vs |
| COM9 | [structure with $C_8H_{17}$] | 3.6 cm$^2$/Vs |
| COM11 | [structure with $C_8H_{17}$] | 1.3 cm$^2$/Vs |
| COM12 | [structure with $C_{10}H_{21}$] | 1.3 cm$^2$/Vs |

TABLE 16-continued
| Compound | (a) | (b) |
|---|---|---|
| COM20 | 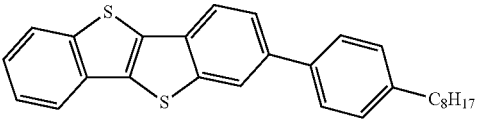 | 0.35 cm²/Vs |
| COM23 | 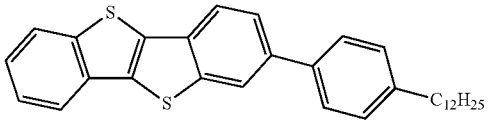 | 0.42 cm²/Vs |
| COM24 | 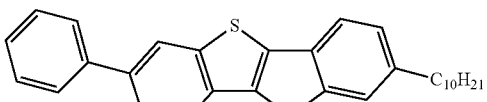 | 5.7 cm²/Vs |
| COM27 | 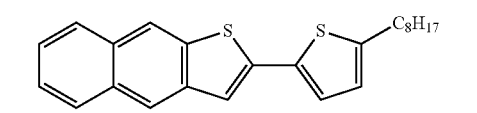 | $3.6 \times 10^{-2}$ cm²/Vs |
| COM28 | 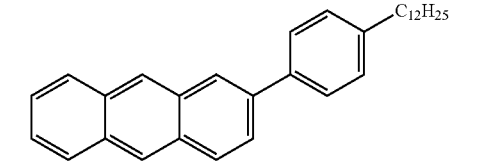 | 0.11 cm²/Vs |
| COM29 | 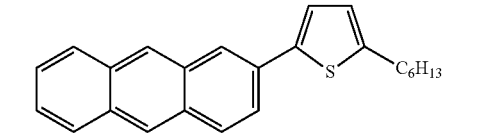 | 0.08 cm²/Vs |
| COM31 | 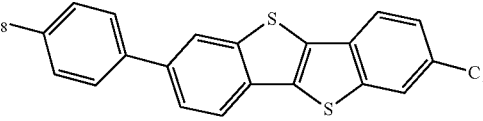 | 1.3 cm²/Vs |
| COM49 | 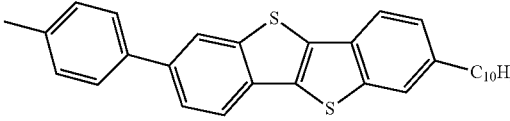<br>1-P-BTBT-10 | 0.18 cm²/Vs |
| COM51 | 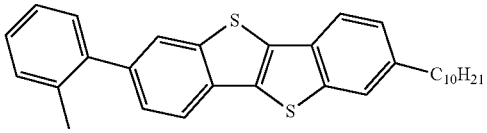<br>1-(2)P-BTBT-10 | $1.1 \times 10^{-2}$ cm²/Vs |
| COM52 | 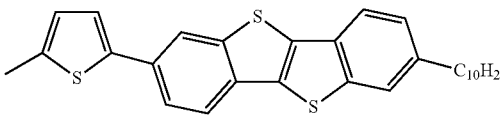<br>1-TP-BTBT-10 | $7.8 \times 10^{-2}$ cm²/Vs |

TABLE 16-continued

| Compound | (a) | (b) |
|---|---|---|
| COM54 | Che-BTBT-10 | $1.3 \times 10^{-4}$ cm$^2$/Vs |
| COM56 | Pip-BTBT-10 | $2.0 \times 10^{-5}$ cm$^2$/Vs |
| COM59 | BTDT-TP-8 | $4.6 \times 10^{-4}$ cm$^2$/Vs |
| COM61 | NPT-P-8 | $7.7 \times 10^{-3}$ cm$^2$/Vs |

TABLE 17

(a) Chemical structural formula, (b) phase and hole or electron mobility (cm$^2$/Vs)

| Compound | (a) | (b) |
|---|---|---|
| COM31 | | SmE phase: electron mobility 0.2 cm$^2$/Vs |
| COM10 | | SmE phase: hole mobility 0.2 cm$^2$/Vs |

TABLE 18

| Compound | (a) | (b) |
|---|---|---|
| COM20 | | SmE phase: hole mobility 0.1 cm$^2$/Vs |
| COM28 | | SmX: hole mobility 0.3 cm$^2$/Vs |

INDUSTRIAL APPLICABILITY

In the liquid crystal substance produced by the present invention, the developed highly ordered liquid crystal phase may have a large aromatic π-electron fused ring system advantageous to charge transport in the core part and accordingly, may promise high mobility, and the substance can be utilized as a high-quality organic semiconductor being uniform and having less defects.

As for specific applications, the substance can be used for a photosensor, an organic EL device, an organic FET, an organic solar cell, an organic memory device and the like. The transient photocurrent measured by the time-of-flight method in Examples is a result of measuring the photocurrent of the substance to be measured, and this is a case actually utilizing the substance for a photosensor. Further, as demonstrated in Examples, the substance can be further utilized as an organic transistor material.

The invention claimed is:

1. An organic semiconductor material, represented by the formula:

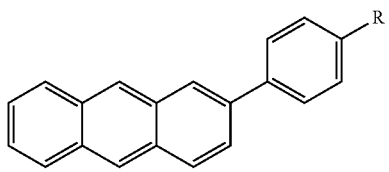

wherein R represents an alkyl group having a carbon number of 2 to 20, the material exhibiting a liquid crystal phase selected from SmB, SmBcryst, SmI, SmF, SmG, SmE, SmJ, SmK, and SmH, and the material having a mobility of 0.1 cm2/Vs or more, in terms of electron mobility, hole mobility and mobility obtained from field-effect transistor property.

2. The organic semiconductor material according to claim 1, wherein a liquid crystal phase selected from the group consisting of SmB, SmBcryst, SmI, SmF, SmG, SmE, SmJ, SmK and SmH appears adjacent to a crystal phase, when the temperature of the material is increased from the crystal phase thereof.

3. The organic semiconductor material according to claim 1, wherein in the cooling process of the organic semiconductor material, any one phase of N phase, SmA phase, and SmC phase appears in advance of appearing of the liquid crystal phase selected from the group consisting of SmB, SmBcryst, SmI, SmF, SmG, SmE, SmJ, SmK and SmH.

4. The organic semiconductor material according to claim 1, wherein the temperature region in which a liquid crystal phase appears, is different in the temperature decreasing process and the temperature rising process.

5. The organic semiconductor material according to claim 1, wherein the work function between the organic semiconductor material, and an electrode substance to be used in electrical contact with the organic semiconductor material is 1 eV or less.

6. The organic semiconductor material according to claim 5, wherein the electrode substance is selected from: silver, aluminum, gold, calcium, chromium, copper, magnesium, molybdenum, platinum, indium tin oxide, and zinc oxide.

7. An organic semiconductor device comprising the organic semiconductor material according to claim 1.

8. An organic transistor comprising, as an organic semiconductor layer, the organic semiconductor material according to claim 1.

9. The organic semiconductor material according to claim 1, which comprises one of:

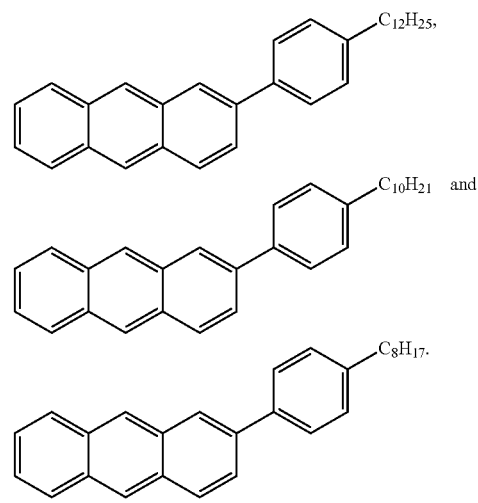

* * * * *